US012557273B2

(12) United States Patent
Lin et al.

(10) Patent No.: US 12,557,273 B2
(45) Date of Patent: Feb. 17, 2026

(54) MEMORY DEVICE AND METHOD FOR MANUFACTURING THE SAME USING HARD MASK

(71) Applicant: TAIWAN SEMICONDUCTOR MANUFACTURING COMPANY, LTD., Hsinchu (TW)

(72) Inventors: Meng-Han Lin, Hsinchu (TW); Feng-Cheng Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1003 days.

(21) Appl. No.: 17/577,788

(22) Filed: Jan. 18, 2022

(65) Prior Publication Data

US 2023/0232621 A1    Jul. 20, 2023

(51) Int. Cl.
| | | |
|---|---|---|
| H01L 21/02 | (2006.01) | |
| H10B 41/10 | (2023.01) | |
| H10B 41/27 | (2023.01) | |
| H10D 30/01 | (2025.01) | |
| H10D 30/67 | (2025.01) | |

(52) U.S. Cl.
CPC ............ *H10B 41/27* (2023.02); *H10B 41/10* (2023.02); *H10D 30/031* (2025.01); *H10D 30/6713* (2025.01); *H10D 30/6729* (2025.01)

(58) Field of Classification Search
CPC ........ H10B 41/27; H10B 41/10; H10B 43/20; H10D 30/031; H10D 30/6713; H10D 30/6729; H10D 1/045; A61K 40/4218; H02K 15/027
See application file for complete search history.

(56) References Cited

U.S. PATENT DOCUMENTS

| | | | | |
|---|---|---|---|---|
| 9,793,293 B1* | 10/2017 | Horibe | ................... | H10B 41/27 |
| 2016/0163728 A1* | 6/2016 | Tsutsumi | ............... | H10B 41/35 |
| | | | | 257/66 |
| 2017/0200736 A1* | 7/2017 | Park | ....................... | H10B 43/27 |
| 2019/0013237 A1* | 1/2019 | Nam | ...................... | H10B 43/50 |
| 2019/0326319 A1* | 10/2019 | Yun | ........................ | H01L 23/528 |
| 2020/0328227 A1* | 10/2020 | Kang | .................. | H10D 30/694 |
| 2022/0149069 A1* | 5/2022 | Geng | .................. | H10D 64/037 |

\* cited by examiner

*Primary Examiner* — Samuel Park
(74) *Attorney, Agent, or Firm* — Birch, Stewart, Kolasch & Birch, LLP

(57) ABSTRACT

A semiconductor device includes an underlying substrate, two stack units disposed over the underlying substrate, and a feature disposed between the stack units. The stack units are spaced apart from each other. Each of the stack units includes a plurality of conductive films and a plurality of dielectric films disposed to alternate with the conductive films, an inter-metal dielectric (IMD) portion, and a hard mask film. An uppermost one of the dielectric films of each of the stack units is disposed over the conductive films, and has a dimension smaller than those of the conductive films and those of remaining ones of the dielectric films of each of the stack units. The feature includes a plurality of repeating units and a plurality of separators which are disposed to alternate with the repeating units. A method for manufacturing the semiconductor device is also disclosed.

20 Claims, 53 Drawing Sheets

MEMORY DEVICE AND METHOD FOR MANUFACTURING THE SAME USING HARD MASK

BACKGROUND

Semiconductor memory devices are widely used in computers, portable devices, automotive parts, and internet of things (IoT), etc. With increasing requirement of semiconductor memory devices to have high memory capacity, in addition to scale down memory cells, a memory array tends to be developed to have a three-dimensional (3D) architecture instead of a two-dimensional (2D) architecture, so that the memory capacity of the semiconductor memory device can be effectively increased with a relatively small area penalty. Nevertheless, a memory array with a 3D architecture has a relatively complicated circuit, and is relatively difficult to be manufactured. Hence, there is continuous demand to develop 3D semiconductor memory devices with less defects (e.g., word line open, and pattern fail, etc.), and a method for making thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
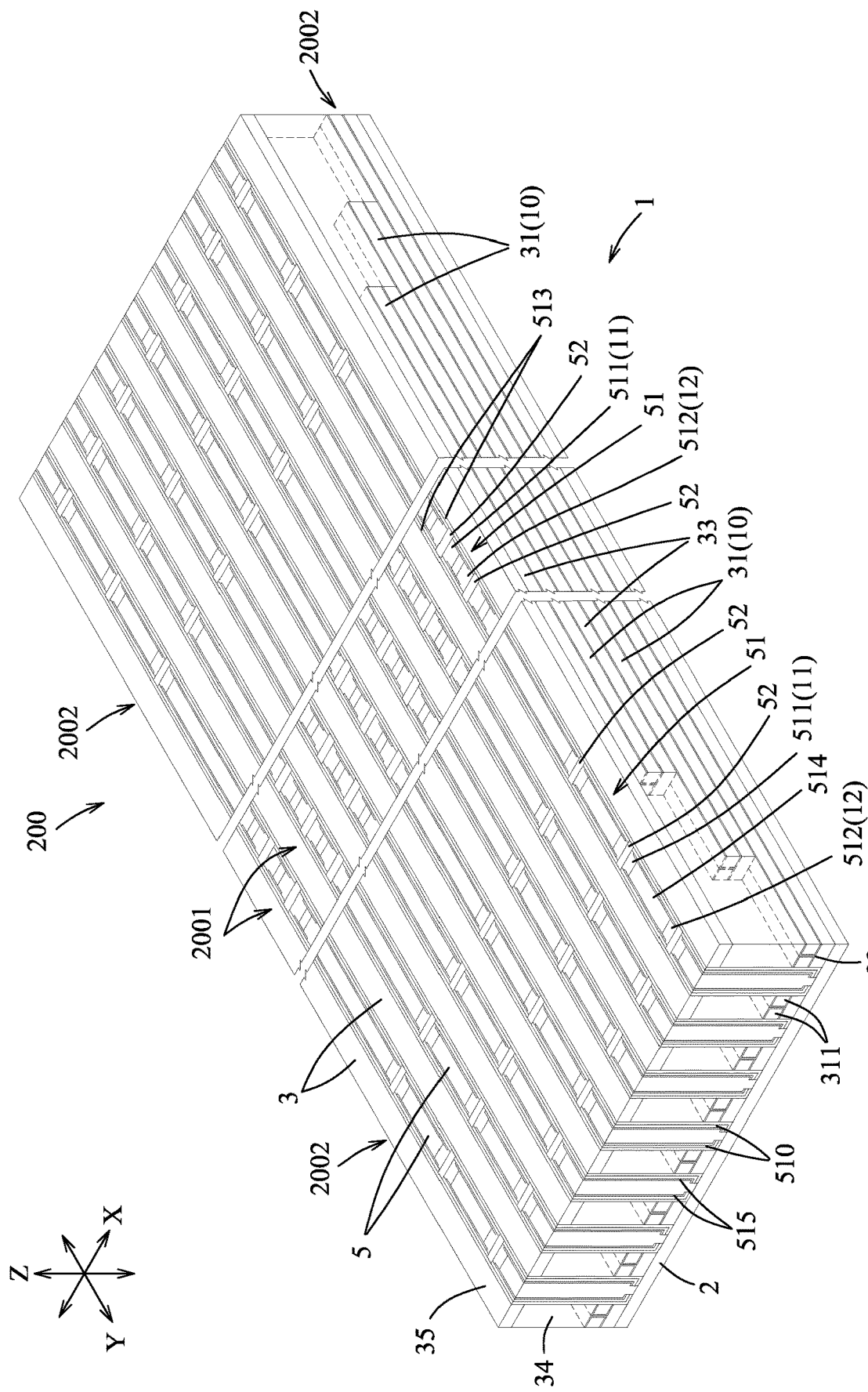
FIG. 1A is a schematic view of a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "uppermost," "lower," "over," "beneath," "underlying," "inner," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
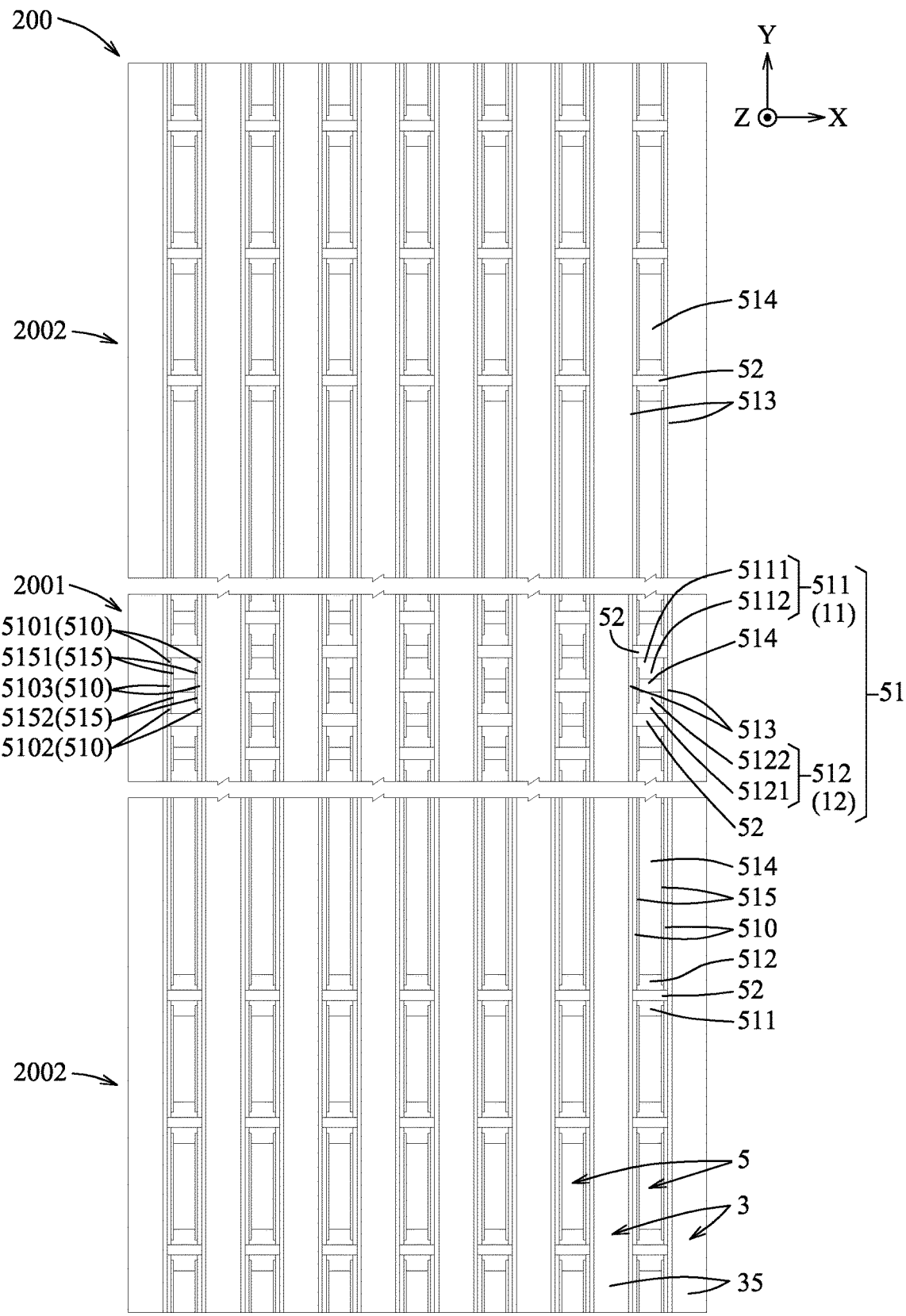
FIG. 1B is a top view of the semiconductor device in accordance with some embodiments as depicted in FIG. 1A.
Figure 1C:
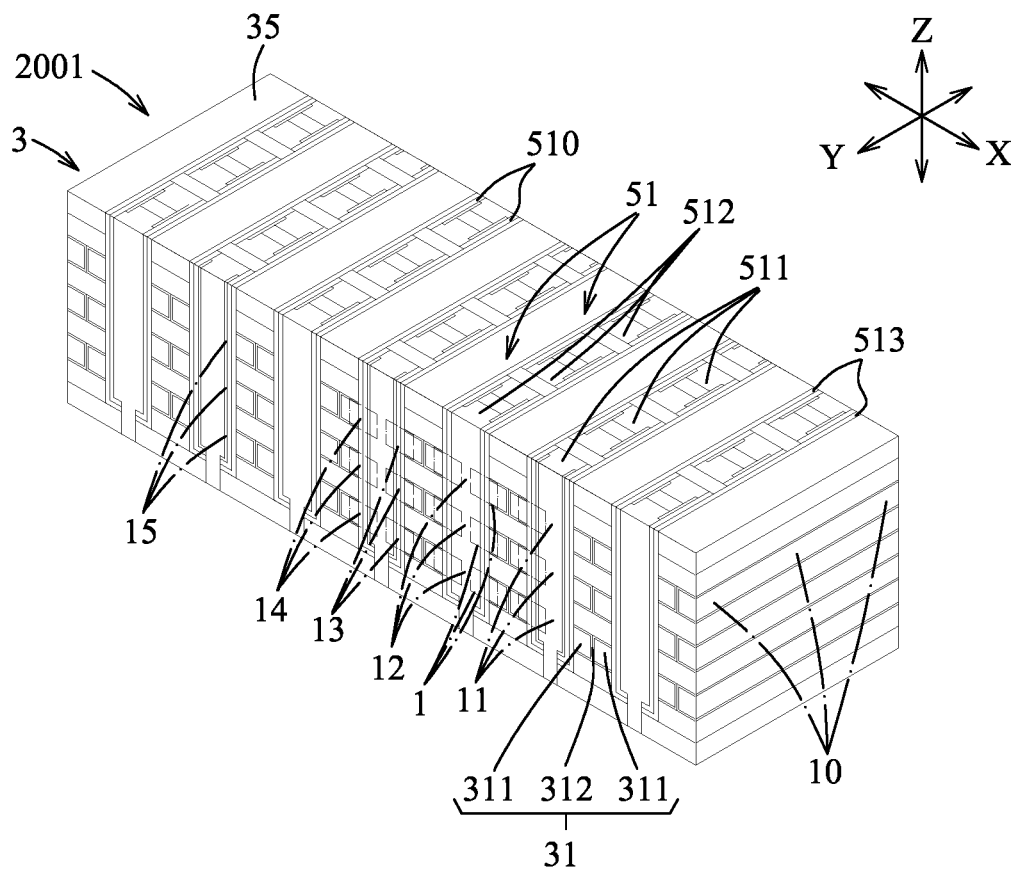
FIG. 1C is a schematic view illustrating a portion of the semiconductor device in accordance with some embodiments.

The present disclosure is directed to a semiconductor device and methods for manufacturing the same. FIG. 1A illustrates a semiconductor device 200 in accordance with some embodiments. FIG. 1B is a top view of the semiconductor device 200 in accordance with some embodiments as depicted in FIG. 1A. FIG. 1C is a schematic view illustrating a portion of the semiconductor device 200 in accordance with some embodiments. Some repeating structures in the semiconductor device 200 are omitted in FIGS. 1A and 1B for the sake of brevity. The semiconductor device 200 includes a plurality of thin film transistors (TFTs) 1 arranged in three directions (for example, X, Y, and Z directions) which are transverse to one another. In some embodiments, the three directions are perpendicular to one another. In some embodiments, the semiconductor device 200 is located in the back-end of line (BEOL), while in certain embodiments, the semiconductor device 200 may be located in the front-end of line (FEOL). In some embodiments, the semiconductor device 200 including the TFTs 1 arranged in the three directions is referred to as a three-dimensional (3D) memory device, for example, a 3D NOR flash device. Other suitable memory devices are within the contemplated scope of the disclosure.

The semiconductor device 200 further includes an underlying substrate 2, a plurality of stack units 3, and a plurality of features 5 disposed to alternate with the stack units 3 in the X direction.

The stack units 3 are disposed over the underlying substrate 2 and are separated from one another. In some embodiments, the stack units 3 are displaced from one another in the X direction, and are each elongated in the Y direction. Each of the stack units 3 includes a plurality of conductive films 31, a plurality of dielectric films 33, an inter-metal dielectric (IMD) portion 34, and a hard mask film 35.

The dielectric films 33 are disposed to alternate with the conductive films 31 such that the dielectric films 33 and the conductive films 31 are stacked in the Z direction. Each of the conductive films 31 and the dielectric films 33 is elongated in the Y direction. An uppermost one of the dielectric films 33 is disposed over the conductive films 31, and has a dimension smaller than those of the conductive films 31 and those of remaining ones of the dielectric films 33. Each of the conductive films 31 and the remaining ones of the dielectric films 33 has a first portion disposed beneath the uppermost one of the dielectric films 33 and a second portion extending beyond the uppermost one of the dielectric films 33. The uppermost one of the dielectric films 33 and the first portions of the conductive films 31 and the remaining ones of the dielectric films 33 together constitute a main portion 2001. The second portions of the conductive films 31 and the remaining ones of the dielectric films 33 together constitute a staircase portion 2002. In some embodiments, each of the conductive films 31 has two conductive regions 311 which are separated from each other in the X direction, and a glue portion 32 disposed to bond the two conductive regions 311 together. In some embodiments, a distal one of the dielectric films 33 has a dimension smaller than that of a proximate one of the dielectric films 33 relative to the underlying substrate 2, and a distal one of the conductive films 31 has a dimension smaller than that of a proximate one of the conductive films 31 relative to the underlying substrate 2. In some embodiments, an upper one of the conductive films 31 and a next lower one of the dielectric films 33 have the same length in the Y direction.

The IMD portion 34 is disposed on the staircase portion 2002. In some embodiments, the IMD portion 34 is flush with the uppermost one of the dielectric films 33.

The hard mask film 35 is disposed to cover the IMD portion 34 and the uppermost one of the dielectric films 33, and is made of a material different from those of the IMD portion 34 and the dielectric films 33.

Each of the features 5 includes a plurality of repeating units 51 and a plurality of separators 52 which are disposed to alternate with the repeating units 51 in the Y direction. In certain embodiments, each of the repeating units 51 includes two memory portions 513, two channel portions 510, a first conductive pillar 511, a second conductive pillar 512, and an isolation portion 514. Each of the memory portions 513 is in contact with the conductive films 31 of a respective one of the stack units 3. The two channel portions 510 are disposed respectively on the two memory portions 513. Each of the first conductive pillar 511 and the second conductive pillar 512 is in contact with the two channel portions 510. The isolation portion 514 is disposed between the channel portions 510 to separate the first conductive pillar 511 from the second conductive pillar 512. In some embodiments, each of the channel portions 510 has a first lateral region 5101, a second lateral region 5102, and a central region 5103 between the first and second lateral regions 5101, 5102. In certain embodiments, each of the repeating units 51 further includes two high-k dielectric portions 515, each of which is disposed on the central region 5103 of a respective one of the channel portions 510 to permit the isolation portion 514 to be disposed between the central regions 5103 of the channel portions 510. Each of the high-k dielectric portions 515 has a first side region 5151 and a second side region 5152 which are respectively disposed at two opposite sides of the isolation portion 514. In some embodiments, the first conductive pillar 511 includes a first main portion 5111 interconnecting the first lateral regions 5101 of the channel portions 510, and a first extended portion 5112 interconnecting the first side regions 5151 of the high-k dielectric portions 515. In some embodiments, the second conductive pillar 512 includes a second main portion 5121 interconnecting the second lateral regions 5102 of the channel portions 510, and a second extended portion 5122 interconnecting the second side regions 5152 of the high-k dielectric portions 515.

As the semiconductor device 200 includes a plurality of the TFTs 1, each of the conductive films 31 serves as a word line, and the first and second conductive pillars 511, 512 serve as a bit line and a source line, respectively. The word line 31 has a plurality of word line portions 10 which are displaced from one another in the Y direction. Each of the word line portions 10 serves as a gate electrode of a corresponding one of the TFTs 1. The source line 512 has a plurality of source line portions 12 which are displaced from one another in the Z direction, and each of the source line portions 12 serves as a first source/drain electrode of a corresponding one of the TFTs 1. The bit line 511 has a plurality of bit line portions 11 which are displaced from one another in the Z direction, and each of the bit line portions 11 serves as a second source/drain electrode of a corresponding one of the TFTs 1. Each of the channel portions 510 includes a plurality of channel regions 13 which are displaced from one another in the Z direction. Each of the channel regions 13 is located among a corresponding one of the word line portions 10 (i.e., the gate electrode), a corresponding one of the source line portions 12 (i.e., the first source/drain electrode) and a corresponding one of the bit line portions 11 (i.e., the second source/drain electrode), and serves as a channel of a corresponding one of the TFTs 1. Each of the memory portions 513 has a plurality of memory regions 14 which are displaced from one another in the Z direction, and each of the memory regions 14 serves as a gate dielectric to electrically isolate a corresponding one of the word line portions 10 from a corresponding one of the channel regions 13 in a corresponding one of the TFTs 1. Each of the high-k dielectric portions 515 includes a plurality of high-k dielectric regions 15 which are displaced from one another in the Z direction, and each of the high-k dielectric regions 15 serves to keep a channel length of a channel of a corresponding one of the TFTs 1.

Therefore, each of the TFTs 1 includes a gate electrode (i.e., word line portion 10), a first source/drain electrode (i.e., source line portion 12), a second source/drain electrode (i.e., bit line portion 11), a channel (i.e., the channel region 13), a gate dielectric (i.e., the memory region 14), and a high-k dielectric region 15. As shown in FIG. 1C, two adjacent TFTs 1 formed at two opposite sides of a word line portion 10 and at the same X-Y plane can share the same word line portion 10. In addition, two adjacent TFTs 1 formed at two opposite sides of the source line portion 12 (and the bit line portion 11) and at the same X-Y plane can share the same source line portion 12 (and the bit line portion 11).

During a writing operation, a memory region 14 of each of the TFTs 1 can be switched to one of a first polarization state and a second polarization state by applying suitable programming voltages to a corresponding word line, and a source line and a bit line of a corresponding repeating unit 51. Each of the TFTs 1 has different threshold voltages at the first and second polarization states, thereby storing different digital values (e.g., 0 or 1) in each of the TFTs 1. For example, each of the TFTs 1 has a relatively low threshold voltage (low $V_T$) at the first polarization state and a relatively high threshold voltage (high $V_T$) at the second polarization state. The polarization state of the memory region 14, which remains after removal of the programming voltages, can be detected by measuring a current passing through a channel region 13 of the TFT 1 after application of a suitable reading voltage. It should be noted that the reading voltage has a value between the low $V_T$ and the high $V_T$, and will not change the polarization state of the memory region 14 of the TFT 1. For example, a higher current will be detected when the memory region 14 is at the first polarization state, and a lower current will be detected when the memory region 14 is at the second polarization state. With the provision of the high-k dielectric region 15 in each TFT 1, switchable zones of the memory region 13, which can be stably switched between the first and second polarization states, can be enlarged (since the switchable zones in the memory region 13 are proportional to the dimension of the first and second source/drain electrodes in the Y direction), while a channel length between the first and second source/drain electrodes in the Y direction is not reduced.

In some alternative embodiments, the semiconductor device 200 may further include additional features, and/or some features present in the semiconductor device 200 may be modified, replaced, or eliminated without departure from the spirit and scope of the present disclosure.

Figure 1D:
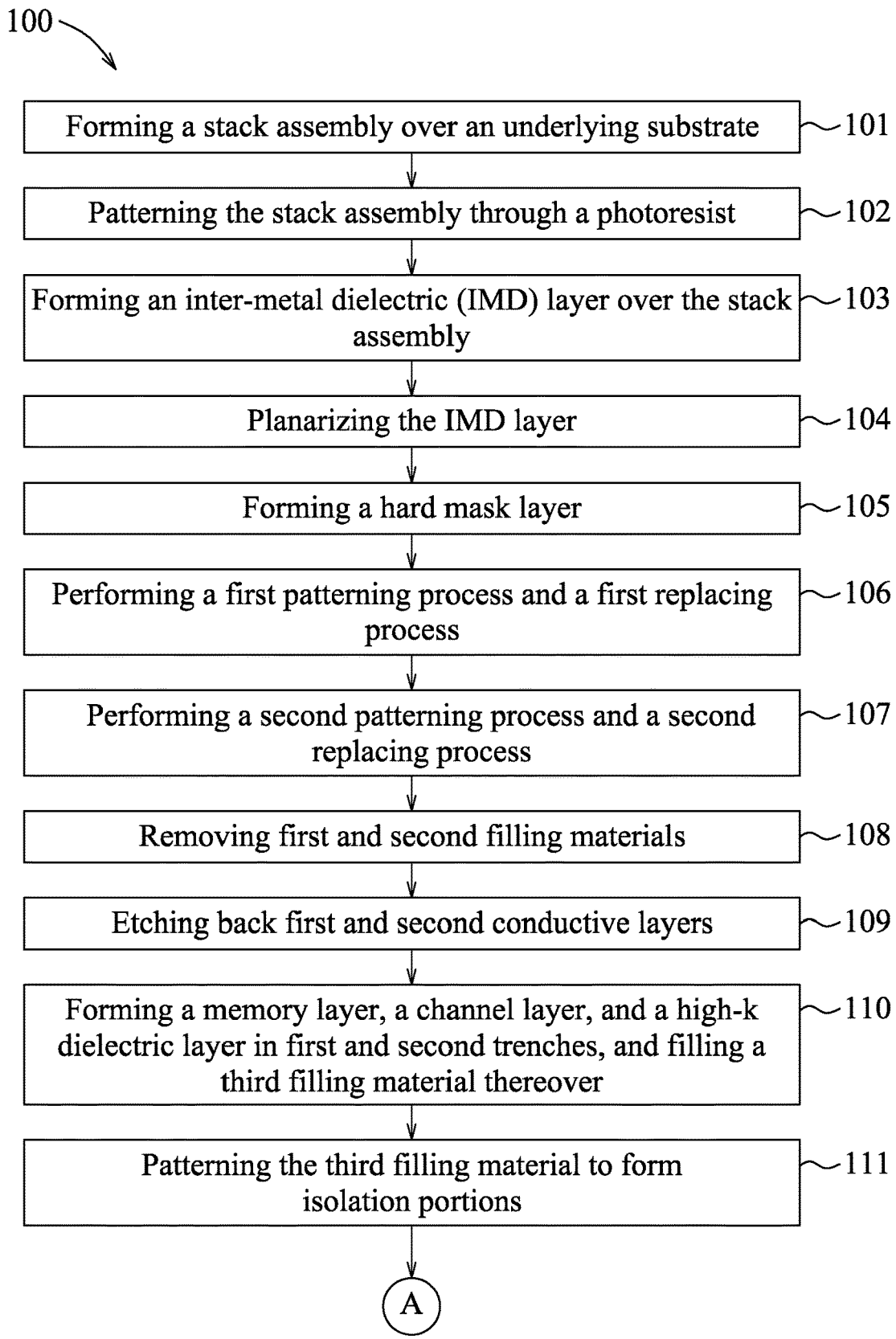
FIGS. 1D and 1E show a flow diagram illustrating a method for manufacturing a semiconductor device in accordance with some embodiments.
Figure 1E:
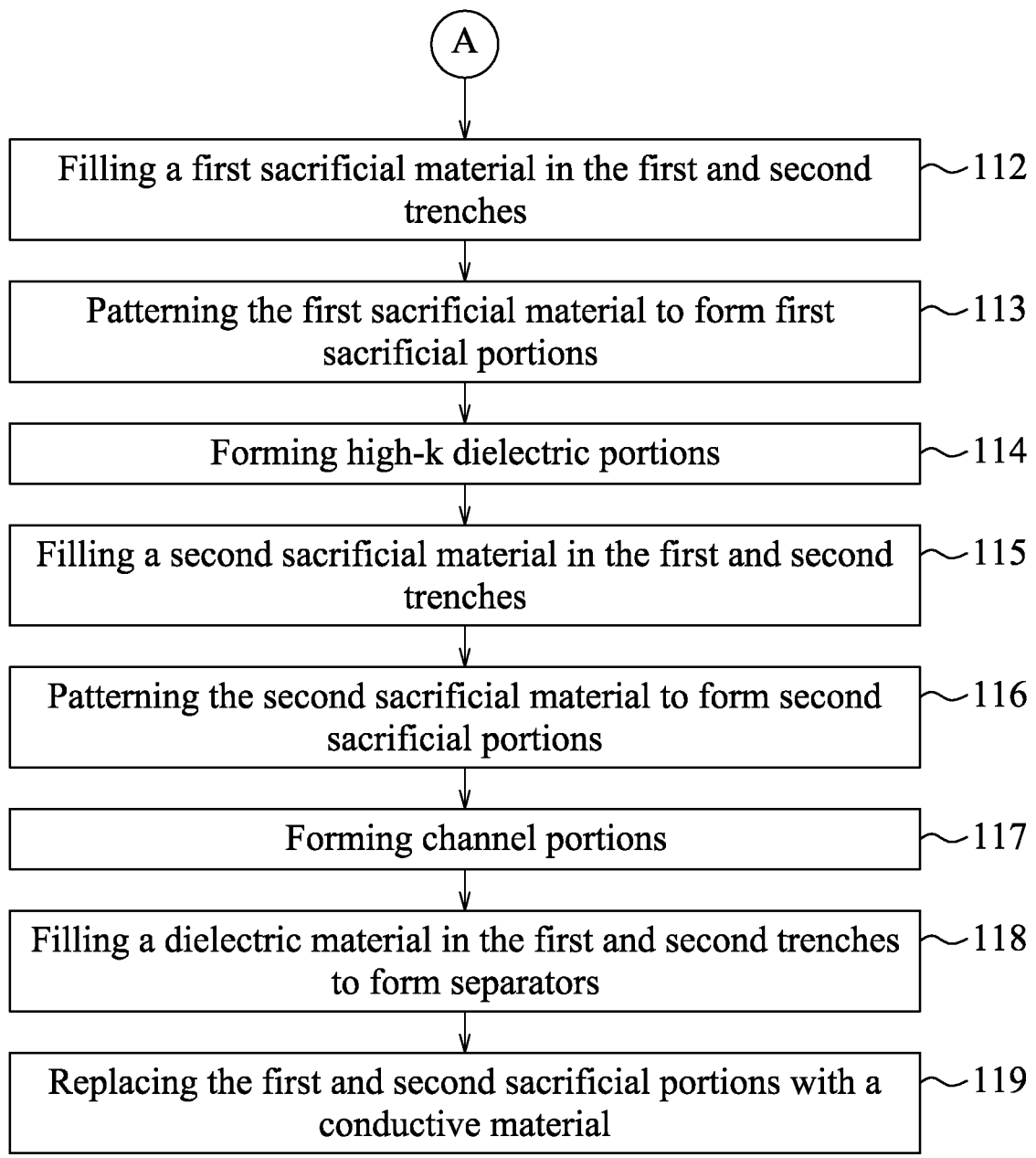

FIGS. 1D and 1E show a flow diagram illustrating a method 100 for manufacturing a semiconductor device (for example, a semiconductor device 200 shown in FIG. 1A) in accordance with some embodiments. FIGS. 2 to 21D illustrate schematic views of the intermediate stages of the method 100. Additional steps can be provided before, after or during the method 100, and some of the steps described herein may be replaced by other steps or be eliminated.

Figure 2:
FIGS. 2 to 21D are varying views illustrating intermediate stages of the manufacturing method in accordance with some embodiments as depicted in FIGS. 1D and 1E.

Referring to FIG. 1D and the example illustrated in FIG. 2, the method 100 begins at step 101, where a stack assembly 60 is formed over the underlying substrate 2. FIG. 2 is a perspective view of the stack assembly 60 according to some embodiments of the disclosure. The stack assembly 60 includes a plurality of dielectric layers 63 and a plurality of sacrificial layers 66 which are disposed to alternate with the dielectric layers 63. An uppermost one of the dielectric layers 63 is disposed over the sacrificial layers 66. The dielectric layers 63 may include, for example, but not limited to, silicon nitride, silicon oxide, silicon oxynitride, or the like. The sacrificial layers 66 may include, for example, but not limited to, silicon nitride, silicon oxide, silicon oxynitride, or the like. The dielectric layers 63 are made of a material different from that of the sacrificial layers 66. In certain embodiments, the dielectric layers 63 are made of silicon oxide, and the sacrificial layers 66 are made of silicon nitride. The dielectric layers 63 serve as an insulator between two adjacent ones of the sacrificial layers 66. Other suitable materials for the dielectric layers 63 and the sacrificial layer 66 are within the contemplated scope of the disclosure.

Each of the dielectric layers 63 and the sacrificial layers 66 may be formed by suitable fabrication techniques, such as chemical vapor deposition (CVD), metalorganic CVD (MOCVD), physical vapor deposition (PVD), atomic layer deposition (ALD), thermal oxidation, UV-ozone oxidation, remote plasma atomic layer deposition (RPALD), plasma-enhanced atomic layer deposition (PEALD), molecular beam deposition (MBD), or combinations thereof. In certain embodiments, the stack assembly 60 may include at least 16 layers of the dielectric layers 63 and the sacrificial layers 66, although the numbers of the layers are not limited thereto. In some embodiments, each of the dielectric layers 63 and the sacrificial layers 66 has a thickness ranging from about 10 nm to about 200 nm. Other suitable techniques for forming the dielectric layers 63 and the sacrificial layers 66 are within the contemplated scope of the disclosure.

In some embodiments, the underlying substrate 2 may be made of a dielectric material different from those of the dielectric layers 63 and the sacrificial layers 66 so as to serve as an etch stop layer. In some embodiments, the underlying substrate 2 may not include nitride and/or silicon oxide. Other suitable materials for the underlying substrate 2 are within the contemplated scope of disclosure.

Figure 3A:
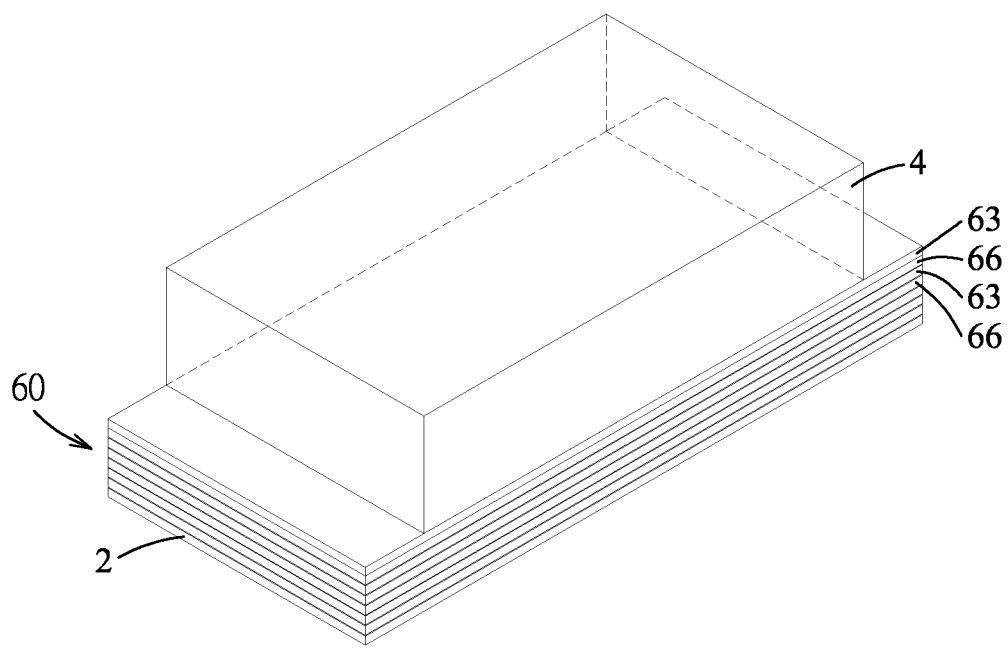
Figure 3B:
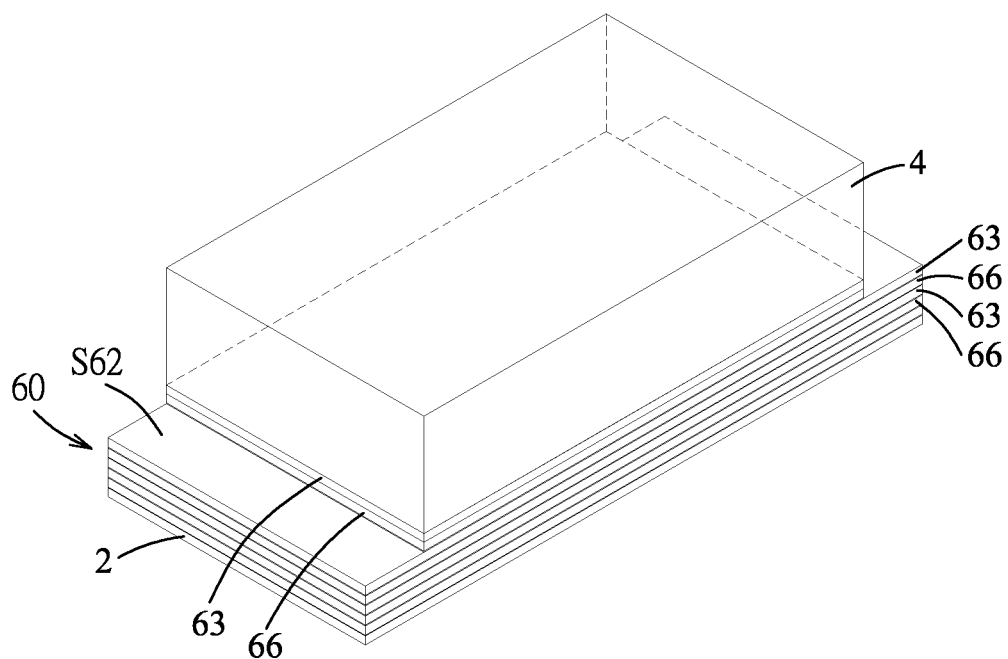
Figure 4:
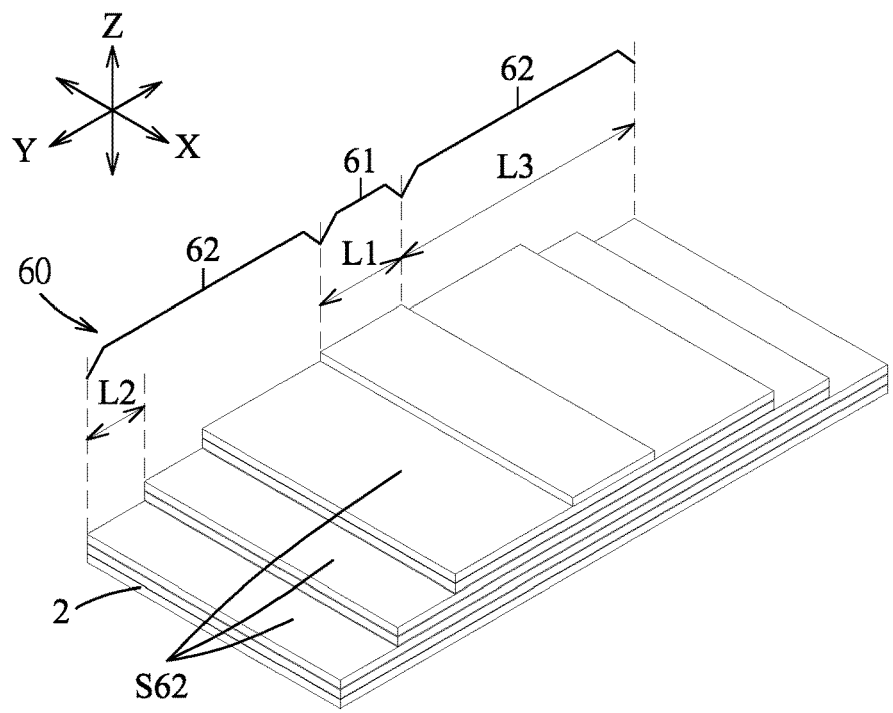

Referring to FIG. 1D and the examples illustrated in FIGS. 3A, 3B and 4, the method 100 proceeds to step 102, where the stack assembly 60 is patterned to have a main structure 61 and a staircase structure 62 aside the main structure 61. FIGS. 3A, 3B and 4 are perspective views illustrating subsequent sub-steps for patterning the stack assembly 60 shown in FIG. 2. In addition, the uppermost one of the dielectric layers 63 has a dimension smaller than those of the sacrificial layers 66 and those of remaining ones of the dielectric layers 63. In some embodiments, a distal one of the dielectric layers 63 has a dimension smaller than that of a proximate one of the dielectric layers 63 relative to the underlying substrate 2, and a distal one of the sacrificial layers 66 has a dimension smaller than that of a proximate one of the sacrificial layers 66 relative to the underlying substrate 2. The main structure 61 may include the uppermost one of the dielectric layers 63, and main portions of the sacrificial layers 66 and the remaining ones of the dielectric layers 63 beneath the uppermost one of the dielectric layers 63. Lateral portions of the sacrificial layers 66 and the remaining ones of the dielectric layers 63 which extend over the uppermost one of the dielectric layers 63 together constitute the staircase structure 62. In some embodiments, an upper one of the sacrificial layers 66 and a next lower one of the dielectric layers 63 have the same dimension.

In some embodiments, step 102 may include sub-steps: (i) forming a photoresist 4 as a mask to cover the uppermost one of the dielectric layers 63 of the stack assembly 60 and etching the stack assembly 60 not covered by the photoresist 4, (ii) trimming the photoresist 4 and further etching the stack assembly 60 not covered by the trimmed photoresist 4, (iii) repeating sub-step (ii) until the staircase structure 62 is obtained, and (iv) removal of the trimmed photoresist 4. Due to the dielectric layers 63 and the sacrificial layers 66 being made of different materials, the dielectric layers 63 and the sacrificial layers 66 can be etched selectively, such that the dielectric layers 63 serve as an etch stop layer for etching the sacrificial layers 66 and that the sacrificial layers 66 serve as an etch stop layer for etching the dielectric layers 63. Therefore, in some embodiments, etchants used to etch the dielectric layers 63 and the sacrificial layers 66 may be different. The etching may be performed using any suitable etching process, for example, but not limited to, dry etching, reactive ion etching (RIE), or the like, or a combination thereof. The etching process may be an anisotropic etching process. In certain embodiments, the etching process may be a timed process so that etching is stopped after a period of time when desired parts of the dielectric layers 63 and the sacrificial layers 66 are removed. The photoresist 4 may be formed by, for example, but not limited to, a spin-on technique, and may be patterned using suitable photolithographic techniques. In some alternative embodiments, the stack assembly 60 may be patterned multiple times using different photoresists in order to obtain the staircase structure 62 according to requirements. Other suitable processes for etching the dielectric layers 63 and the sacrificial layers 66 are within the contemplated scope of the disclosure. After step 102, the photoresist 4 is removed (see FIG. 4). In some embodiments, the trimmed photoresist 4 may be removed from the stack assembly 60 by, for example, but not limited to, an ashing process, or the like. Other suitable processes for removing the photoresist 4 are within the contemplated scope of the disclosure.

In some embodiments, the main structure 61 has a length (L1) along the Y direction that ranges from about 50 μm to about 5000 μm. In certain embodiments, each of non-covered upper surfaces S62 of the lateral portions of the sacrificial layers 66 has a length (L2) along the Y direction that ranges from about 50 nm to about 1000 nm. In certain embodiments, a ratio of a length (L3) of the staircase structure 62 along the Y direction to the length (L1) of the main structure 61 along the Y direction may be greater than 0 and less than about 0.2.

Figure 5:
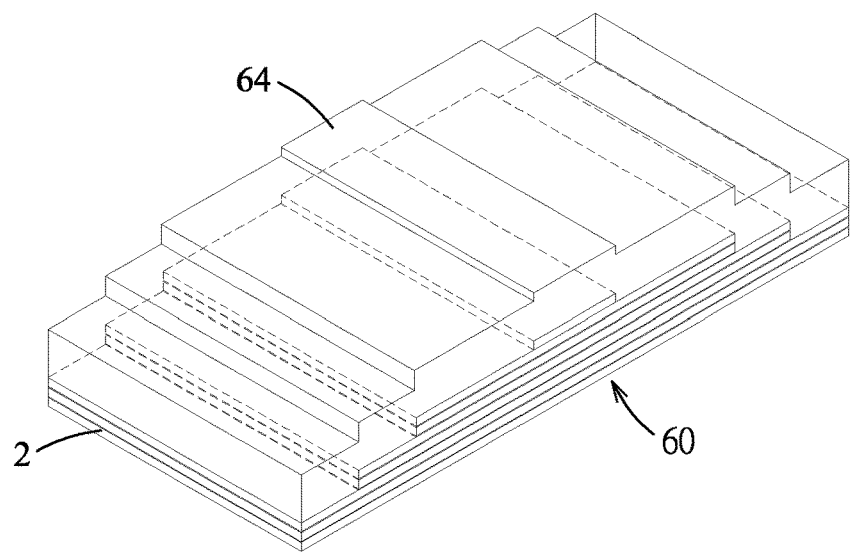

Referring to FIG. 1D and the example illustrated in FIG. 5, the method 100 proceeds to step 103, where an inter-metal dielectric (IMD) layer 64 is formed over the stack assembly 60 such that a lowest region of an upper surface of the IMD layer 64 is at least higher than an upper surface of the main structure 61 of the stack assembly 60. FIG. 5 is similar to FIG. 4 but illustrating the structure after step 103 in accordance with some embodiments. In this embodiment, the upper surface of the main structure 61 of the stack assembly 60 is the upper surface of the uppermost one of the dielectric layers 63 of the stack assembly 60. The IMD layer 64 is formed to cover the upper surface of the stack assembly 60 (i.e., the upper surface of the uppermost one of the dielectric layers 63 and the non-covered upper surfaces S62 of the lateral portions of the sacrificial layers 66), and at least a portion of the side surfaces of the stack assembly 60.

The IMD layer 64 may be formed by suitable fabrication techniques, such as CVD, plasma-enhanced chemical vapor deposition (PECVD), or the like. Other suitable techniques for forming the IMD layer are within the contemplated scope of the disclosure. The IMD layer 64 may be made of, for example, but not limited to, boro-silicate glass (BSG), boron-doped phospho-silicate glass (BPSG), phospho-silicate glass (PSG), undoped silicate glass (USG), or the dielectric materials for the dielectric layers 63. Other suitable materials for the IMD layer 64 are within the contemplated scope of the disclosure. The IMD layer 64 is made of a material different from that of the sacrificial layers 66.

Figure 6A:
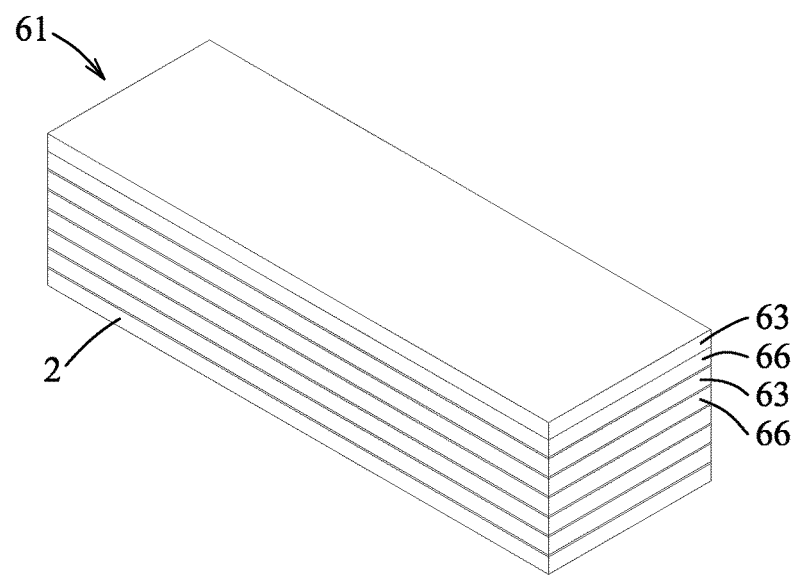
Figure 6B:
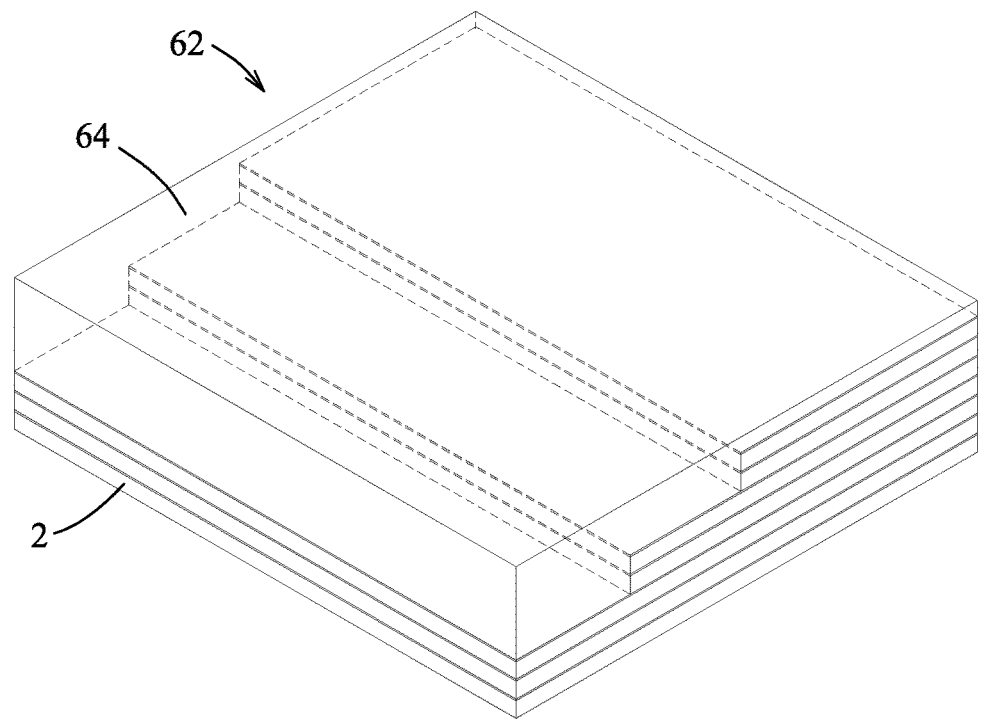
Figure 6C:
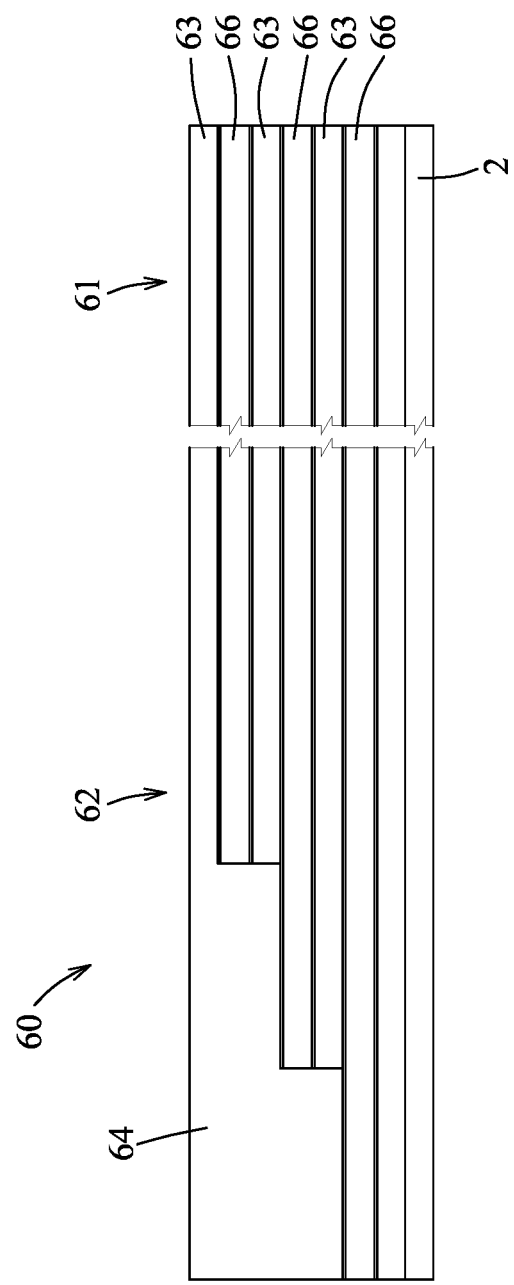

Referring to FIG. 1D and the examples illustrated in FIGS. 6A, 6B, and 6C, the method 100 proceeds to step 104, where the IMD layer 64 shown in FIG. 5 undergoes a planarization process to remove an excess of the IMD layer 64 formed on the stack assembly 60. FIG. 6A is a perspective view illustrating the main structure 61 after step 104 in accordance with some embodiments. FIG. 6B is a perspective view illustrating the staircase structure 62 after step 104 in accordance with some embodiments. FIG. 6C is a side view illustrating the stack assembly 60 after step 104 in accordance with some embodiments. Some repeating structures of the stack assembly 60 are omitted in FIG. 6C for the sake of brevity.

In some embodiments, the planarization process is performed such that the upper surface of the planarized IMD layer 64 is flush with the upper surface of the uppermost one of the dielectric layers 63 of the stack assembly 60 (i.e., the upper surface of the main structure 61). That is, the upper surface of the uppermost one of the dielectric layers 63 is not covered by the planarized IMD layer 64. The planarization process may be an etch-back process, a chemical-mechanical planarization (CMP) process, or the like, or combinations thereof. Other suitable planarization processes for removing the excess of the IMD layer 64 are within the contemplated scope of the disclosure.

Figure 7A:
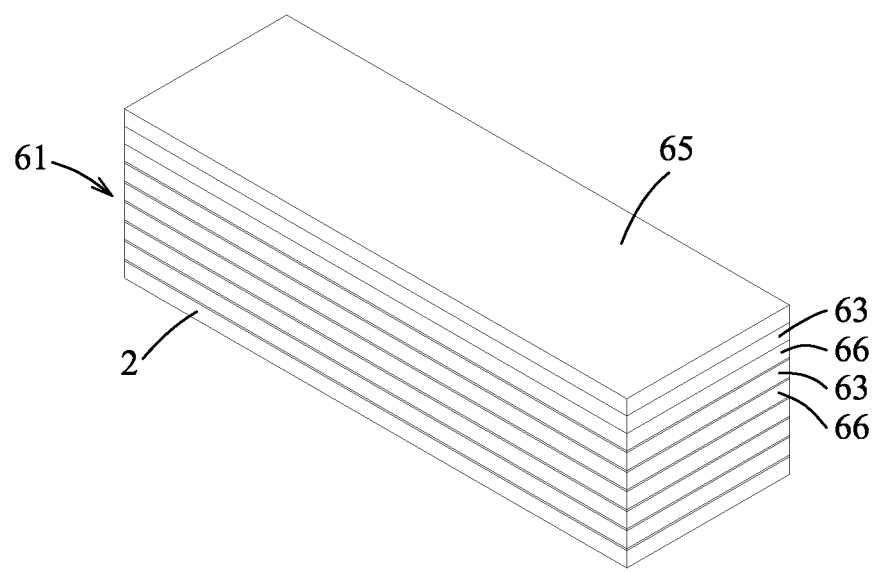
Figure 7B:
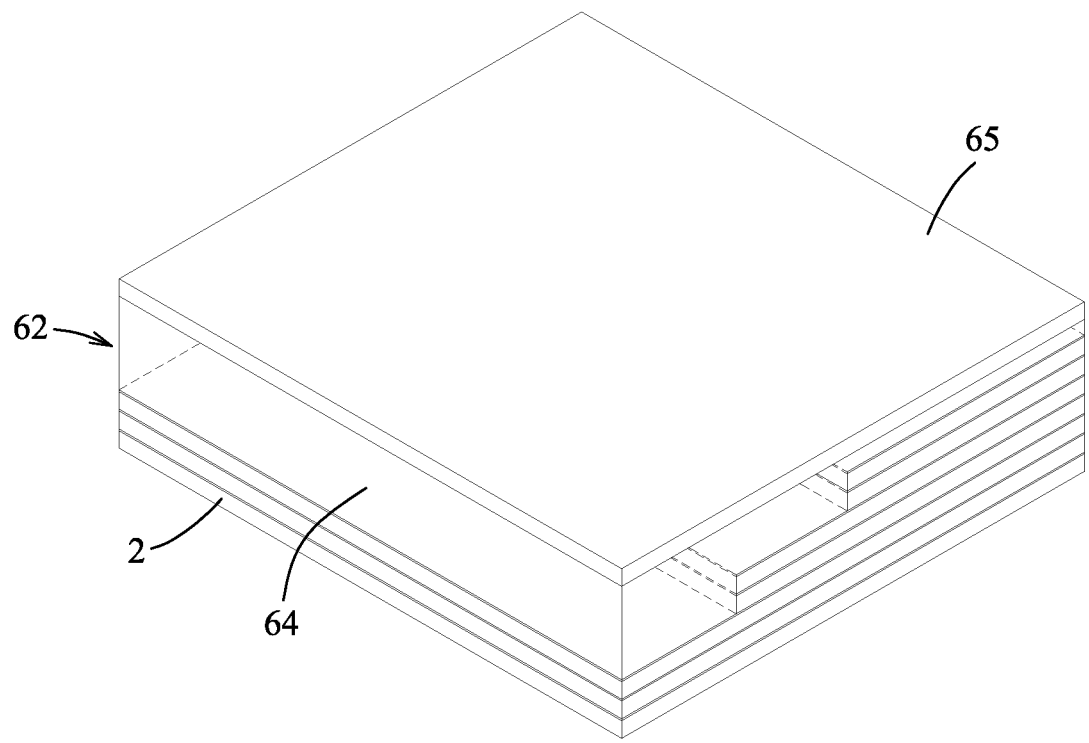
Figure 7C:
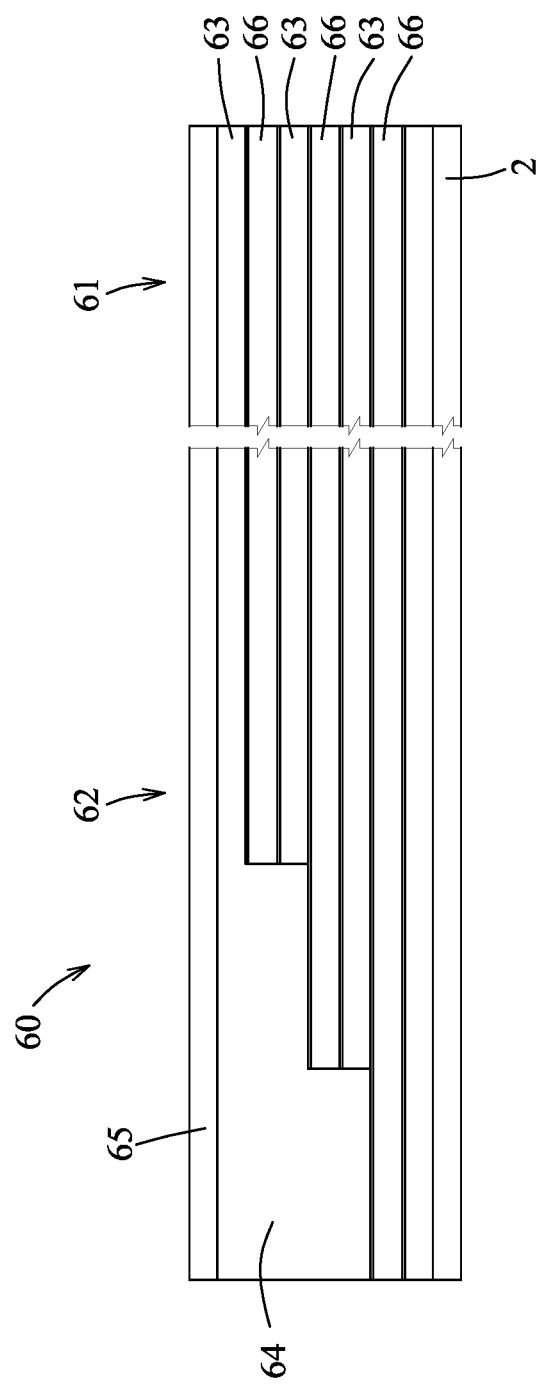

Referring to FIG. 1D and the examples illustrated in FIGS. 7A, 7B, and 7C, the method 100 proceeds to step 105, where a hard mask layer 65 is formed to cover the IMD layer 64 and the upper surface of the main structure 61 of the stack assembly 60. FIGS. 7A to 7C are respectively similar to FIGS. 6A to 6C but illustrating the structure after step 105 in accordance with some embodiments.

In some embodiments, the hard mask layer 65 may be made of, for example, but not limited to, silicon-oxynitride (SiON), titanium nitride, silicon oxide, silicon nitride, silicon carbide nitride, silicon oxide nitride, metal oxide (e.g., titanium oxide, aluminum oxide), or the like, or combinations thereof. Other suitable materials for the hard mask layer 65 are within the contemplated scope of the disclosure.

The hard mask layer 65 is made of a material different from those of the IMD layer 64, the dielectric layers 63, and the sacrificial layers 66. The hard mask layer 65 may be formed by suitable fabrication techniques, such as CVD, PVD, PECVD, ALD, or the like. Other suitable techniques for forming the hard mask layer 65 are within the contemplated scope of the disclosure. In certain embodiments, the hard mask layer 65 may have a thickness ranging from about 10 nm to about 1000 nm.

Figure 8A:
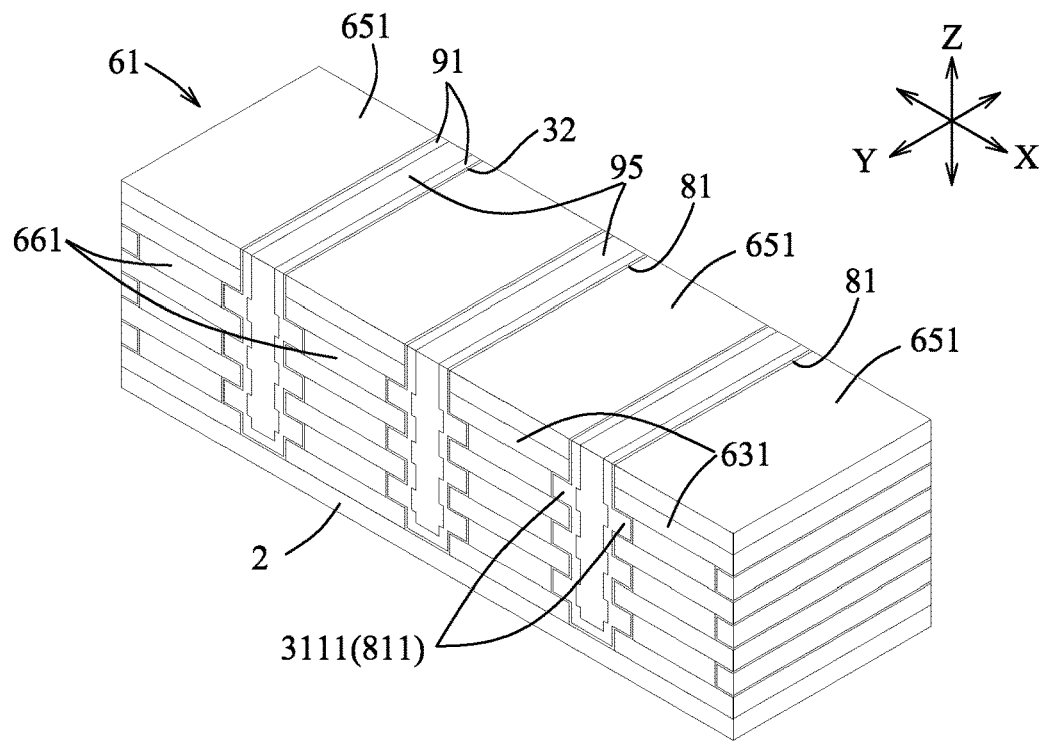
Figure 8B:
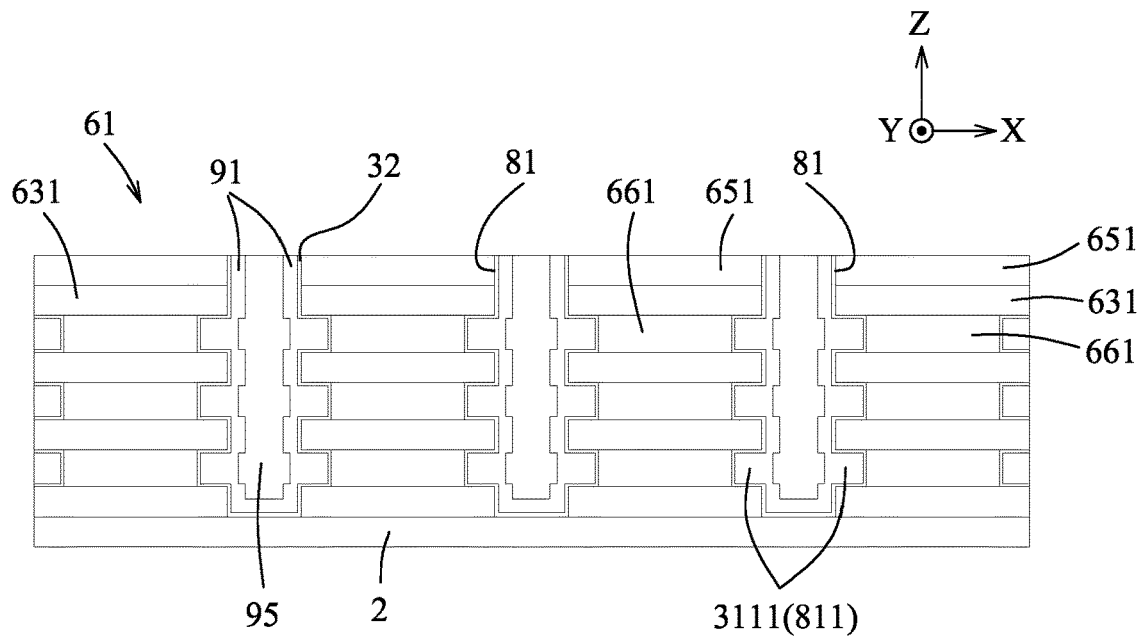
Figure 8C:
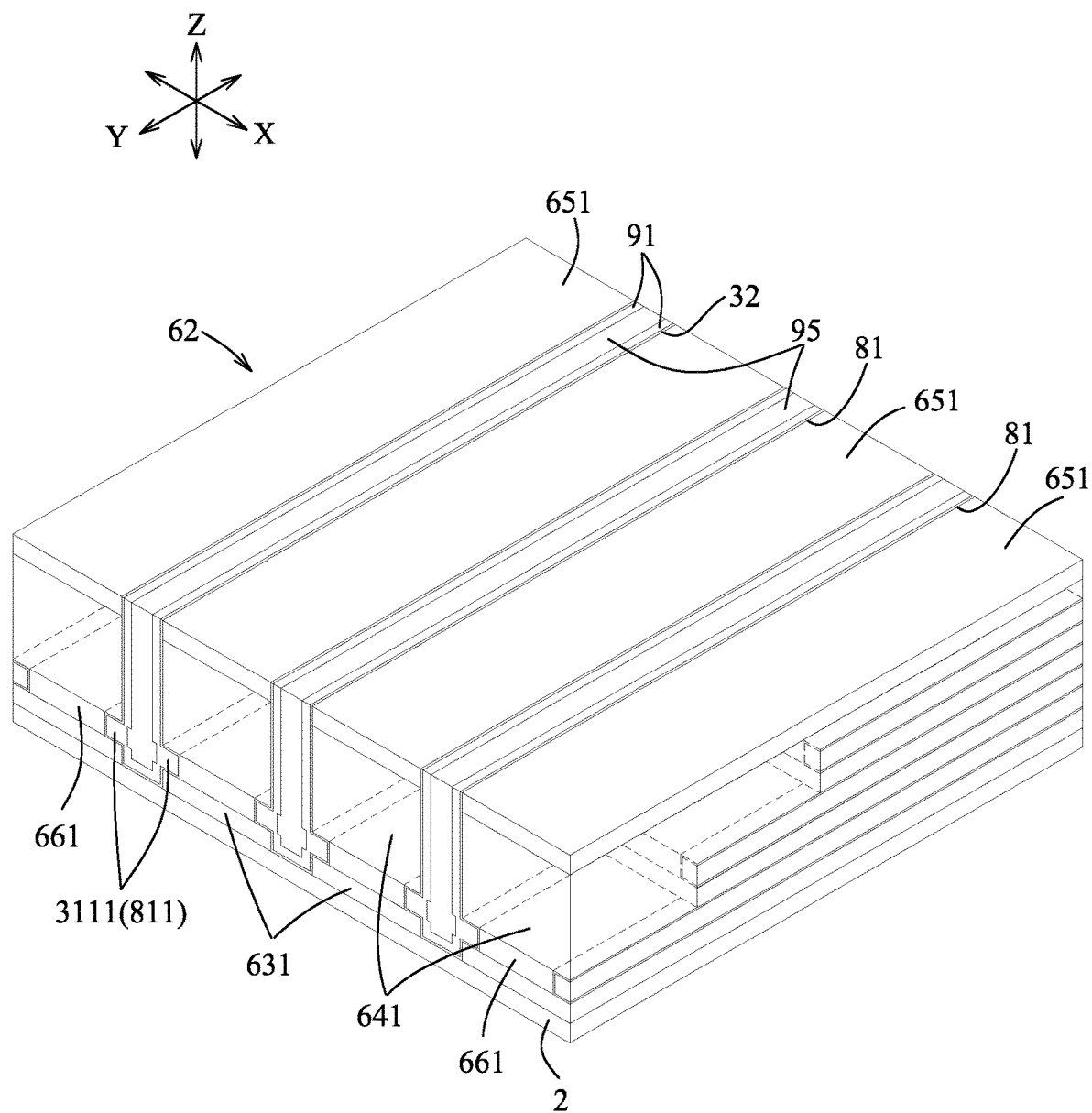

Referring to FIG. 1D and the examples illustrated in FIGS. 8A, 8B, and 8C, the method 100 proceeds to step 106, where the hard mask layer 65, the IMD layer 64, and the stack assembly 60 are subjected to a first patterning process and a first replacing process. FIGS. 8A and 8C are respectively similar to FIGS. 7A and 7B but illustrating the structure after step 106 in accordance with some embodiments. FIG. 8B is a front view of FIG. 8A in accordance with some embodiments.

In the first patterning process, a plurality of first trenches 81 are formed in the hard mask layer 65, the IMD layer 64 and the stack assembly 60, and each of the first trenches 81 extends in the Y direction such that each of the sacrificial layers 66 shown in FIGS. 7A and 7C are partially removed to form into a plurality of sacrificial segments 661, two adjacent ones of which are separated by a corresponding one of the first trenches 81. In some embodiments, the first patterning process for patterning the hard mask layer 65, the IMD layer 64 and the stack assembly 601 is performed by an anisotropic etching process. Other suitable techniques for the first patterning process are within the contemplated scope of the disclosure.

The anisotropic etching process is performed using a first mask (not shown) to recess the hard mask layer 65, the IMD layer 64, and the stack assembly 60, and to form the first trenches 81 that extend along the Z direction. The underlying substrate 2 serves as an etch stop layer for the anisotropic etching process. The anisotropic etching process may be, for example but not limited to, anisotropic dry etching. By utilizing the anisotropic etching process, the hard mask layer 65, the IMD layer 64, and the dielectric layers 63 are also partially removed to respectively form a plurality of hard mask segments 651, IMD segments 641 (see FIG. 8C), and dielectric segments 631 spaced apart by the first trenches 81. In certain embodiments, two adjacent ones of the first trenches 81 may be spaced apart by a distance ranging from about 100 nm to about 1000 nm. Other suitable techniques for the first patterning process are within the contemplated scope of the disclosure.

The first replacing process is performed to replace end portions of the sacrificial segments 661 with first conductive regions 3111 through the first trenches 81. In some embodiments, the first replacing process includes sub-steps (a) to (d). In sub-step (a), the end portions of each of the sacrificial segments 661 is selectively etched back by an isotropic and selective etching process to form first cavities 811 in the first trenches 81. In the isotropic and selective etching process, an etchant having a relatively high etching selectivity to the sacrificial segments 661 with respect to the dielectric segments 631, the hard mask segments 651, and the IMD segments 641 is used. Other suitable techniques for selectively etch back of the sacrificial segments 661 are within the contemplated scope of the disclosure. In sub-step (b), a first conductive layer 91 is deposited in the first cavities 81 to conformally cover inner surfaces of the first trenches 81 so as to form the first conductive regions 3111, respectively, in the first cavities 81. That is, after sub-step (b), the removed end portions of each of the sacrificial segments 661 are first replaced with the first conductive regions 3111. In certain embodiments, before forming the first conductive layer 91, the glue portion 32 may be formed to conformally cover inner surfaces of the first cavities 811 and the inner surface of the first trenches 81. In sub-step (c), a first filling material 95 is filled in the first trenches 81 to enhance a structural strength of remaining portions of the stack assembly 60. In sub-step (d), a planarization process, such as a CMP process, may be conducted to remove an excess of the first filling material 95, an excess of the first conductive material 91, and an excess of the glue portion 32 (if any), and to expose the hard mask segments 651. Other suitable planarization processes and other suitable first replacing processes are within the contemplated scope of the disclosure.

The first conductive layer 91 may be deposited by suitable techniques, such as CVD, PVD, PECVD, ALD, or the like. The glue portion 32 may be formed by suitable fabrication techniques, such as ALD, or the like. The first filling material 95 may be filled in the first trenches 81 by suitable deposition techniques, such as CVD, PECVD, or the like. Other suitable techniques for depositing the first conductive material 91, forming the glue portion 32, and filling the first filling material 95 are within the contemplated scope of the disclosure.

The first conductive layer 91 may be made of, for example, but not limited to, aluminum, zirconium, titanium, tungsten, tantalum, ruthenium, palladium, platinum, cobalt, nickel, or the like, or alloys thereof. The first filling material 95 may be, for example, but not limited to, silicon nitride, silicon oxide, silicon oxynitride, or the like. The first filling material 95 may be a material the same as that of the dielectric layers 63 of the stack assembly 60 as described above. The glue portion 32 may be made of, for example, but not limited to, titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), or the like, or a combination thereof. Other suitable materials for the first conductive layer 91, the glue portion 32, and the first filling material 95 are within the contemplated scope of the disclosure.

Figure 9A:
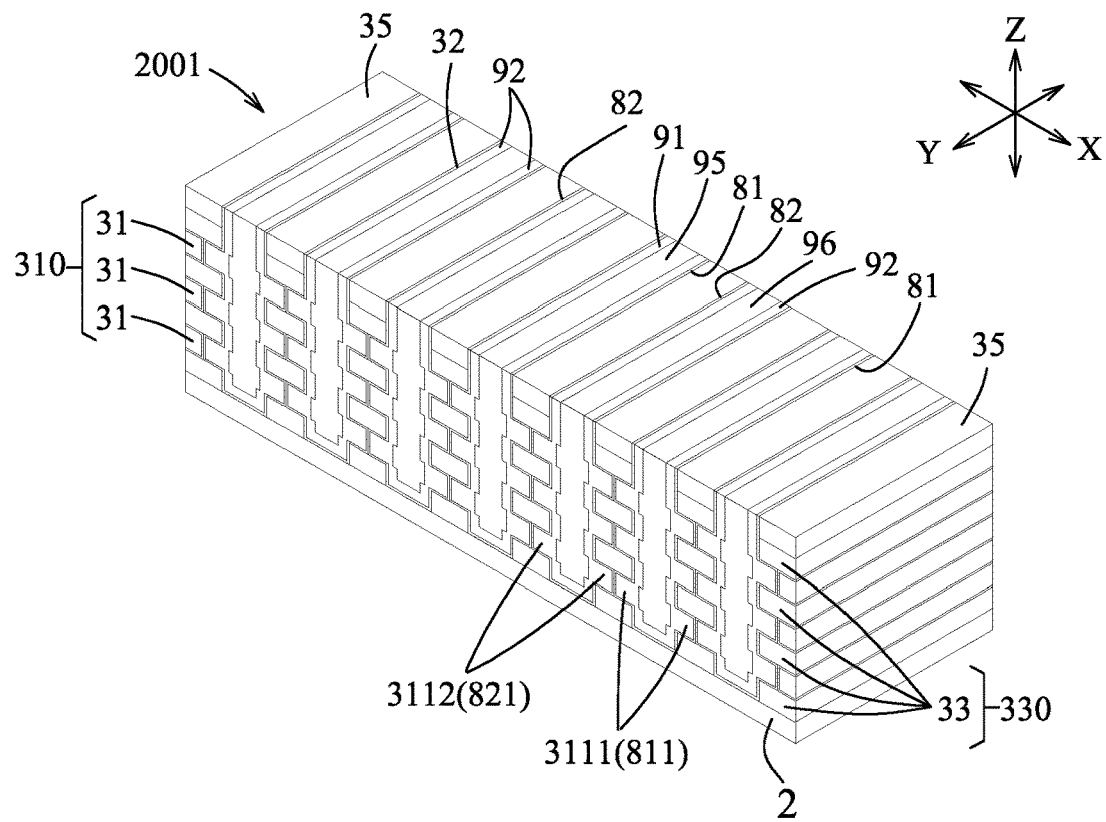
Figure 9B:
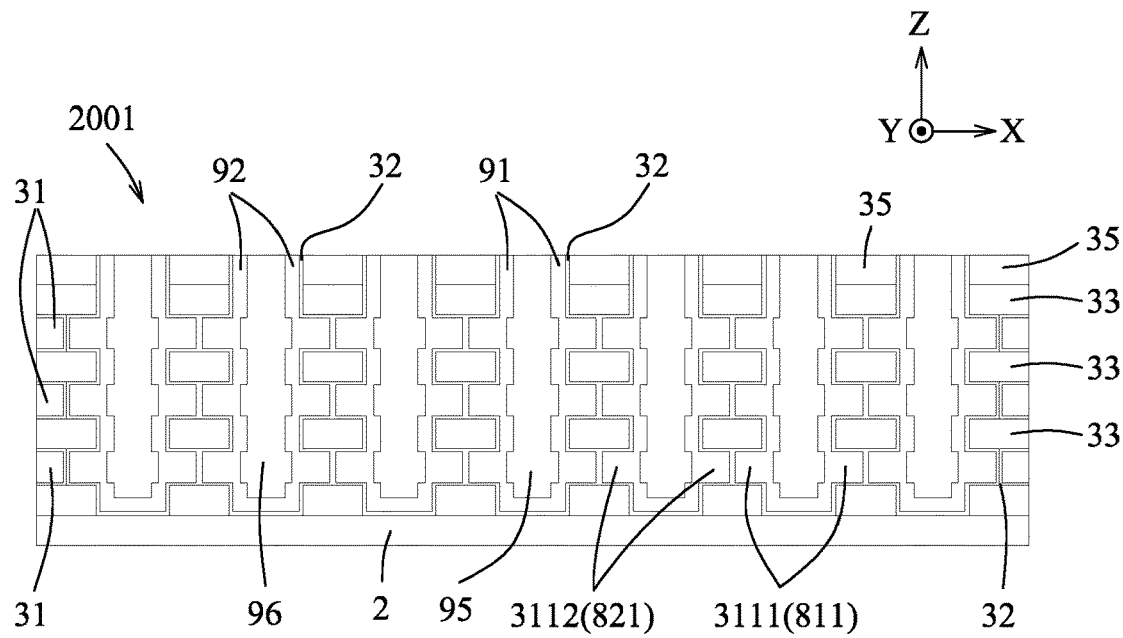
Figure 9C:
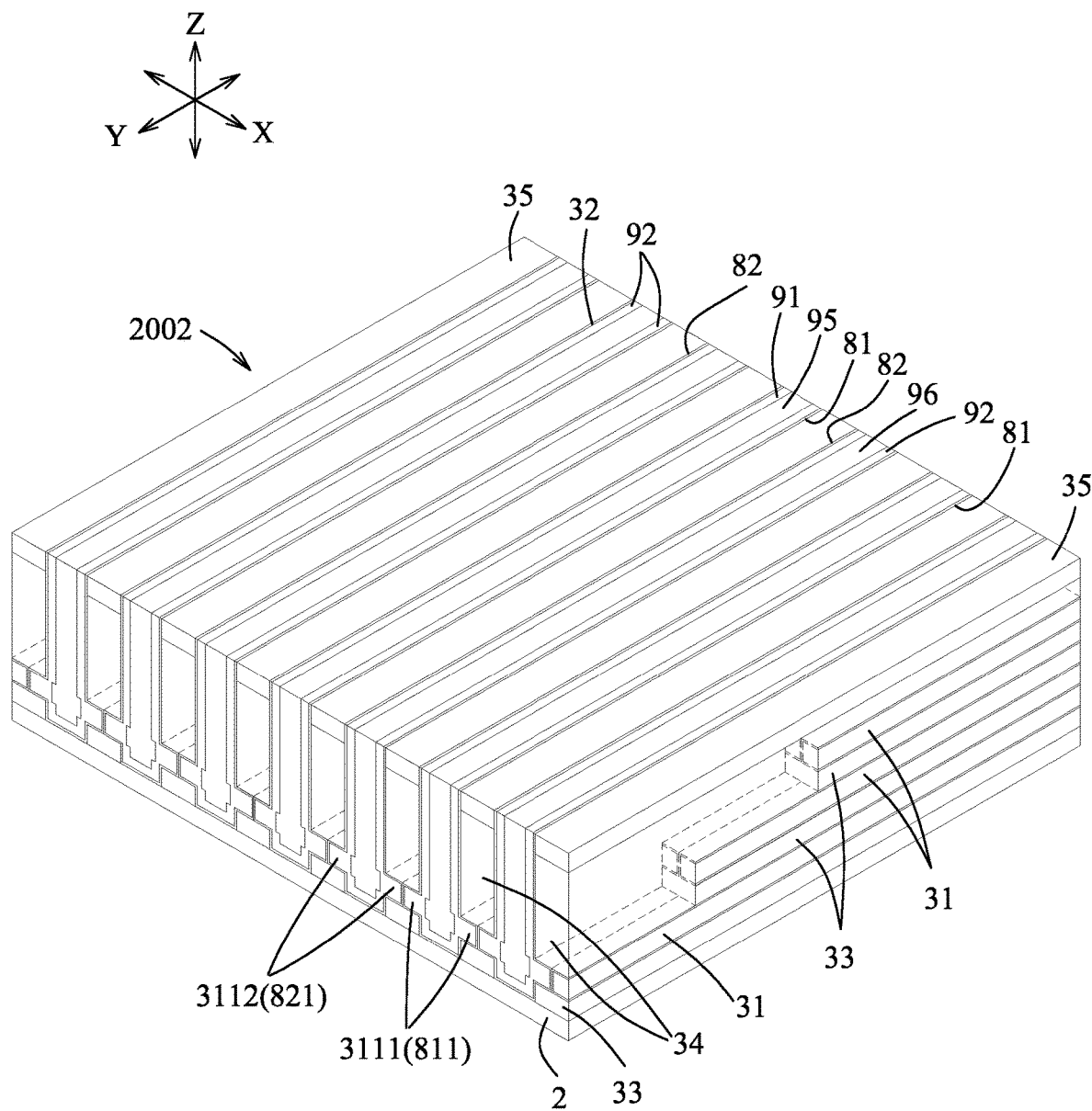

Referring to FIG. 1D and the examples illustrated in FIGS. 9A, 9B, and 9C, the method 100 proceeds to step 107, where the hard mask segments 651, the IMD segments 641, and the remaining portions of the stack assembly 60 are subjected to a second patterning process and a second filling process. FIGS. 9A to 9C are respectively similar to FIGS. 8A to 8C but illustrating the structure after step 107.

In the second patterning process, a plurality of second trenches 82 are formed in the hard mask segments 651, the IMD segments 641, the dielectric segments 631, and remaining portions of the sacrificial segments 661, and each of the second trenches 82 extends in the Y direction to alternate with the first trenches 81 such that the remaining portions of the sacrificial segments 661 are partially removed to form into a plurality of sacrificial regions (not shown) which are spaced apart by the second trenches 82. In some embodiments, the second patterning process is performed using an anisotropic etching process similar to that described in step 106 and the details thereof are omitted for the sake of brevity. Other suitable techniques for the second patterning process are within the contemplated scope of the disclosure.

After the second patterning process, each of the hard mask segments 651, the IMD segments 641, and the dielectric segments 631 is partially removed to respectively form a plurality of the hard mask films 35, the IMD portions 34 (see FIG. 9C), and the dielectric films 33. In certain embodiments, each of the second trenches 82 may be spaced apart from an adjacent one of the first trenches 81 by a distance ranging from about 100 nm to about 1000 nm. Other suitable techniques for the second patterning process are within the contemplated scope of the disclosure.

The second replacing process is performed to replace the sacrificial regions with second conductive regions 3112 through the second trenches 82. In some embodiments, the second replacing process includes sub-steps (a) to (d). In sub-step (a), the sacrificial regions are removed to form second cavities 821 in the second trenches 82 using a manner similar to that described in sub-step (a) of the first replacing process. In sub-step (b), a second conductive layer 92 is deposited in the second cavities 821 to conformally cover inner surfaces of the second trenches 82 so as to form the second conductive regions 3112, respectively, in the second cavities 821. That is, after sub-step (b), the sacrificial regions (not shown) are replaced with the second conductive regions 3112. In certain embodiments, before forming the second conductive layer 92, the glue portion 32 may be formed to conformally cover inner surfaces of the second cavities 821 and the inner surface of the second trenches 82. In sub-step (c), a second filling material 96 is filled in the second trenches 82 to enhance a structural strength of the remaining portions of the stack assembly 60. In sub-step (d), a planarization process, such as a CMP process, may be conducted to remove an excess of the second filling material 96, an excess of the second conductive layer 92 and an excess of the glue portion 32 (if any), to thereby expose the hard mask films 35. Other suitable planarization processes and other suitable second replacing processes are within the contemplated scope of the disclosure.

In addition, the materials and processes for making the second conductive layer 92 and the second filling material 96 are similar to those for the first second conductive layer 91 and the first filling material 95, and the details thereof are omitted for the sake of brevity. The second conductive layer 92 may be made of a material same as or similar to that described above for the first conductive layer 91. The second filling material 96 may be the same as or similar to that described above for the first filling material 95. The second filling material 96 may be the same as or similar to that described above for the dielectric layers 63 of the stack assembly 60.

In some embodiments, after step 107, the dielectric layers 63 shown in FIGS. 7A to 7C are divided into a plurality of dielectric portions 330 each including a plurality of the dielectric films 33 displaced from each other in the Z direction, the hard mask layer 65 is divided into the hard mask films 35 which are respectively disposed on the dielectric portions 330, and the IMD layer 64 is divided into a plurality of the IMD portions 34.

Figure 10A:
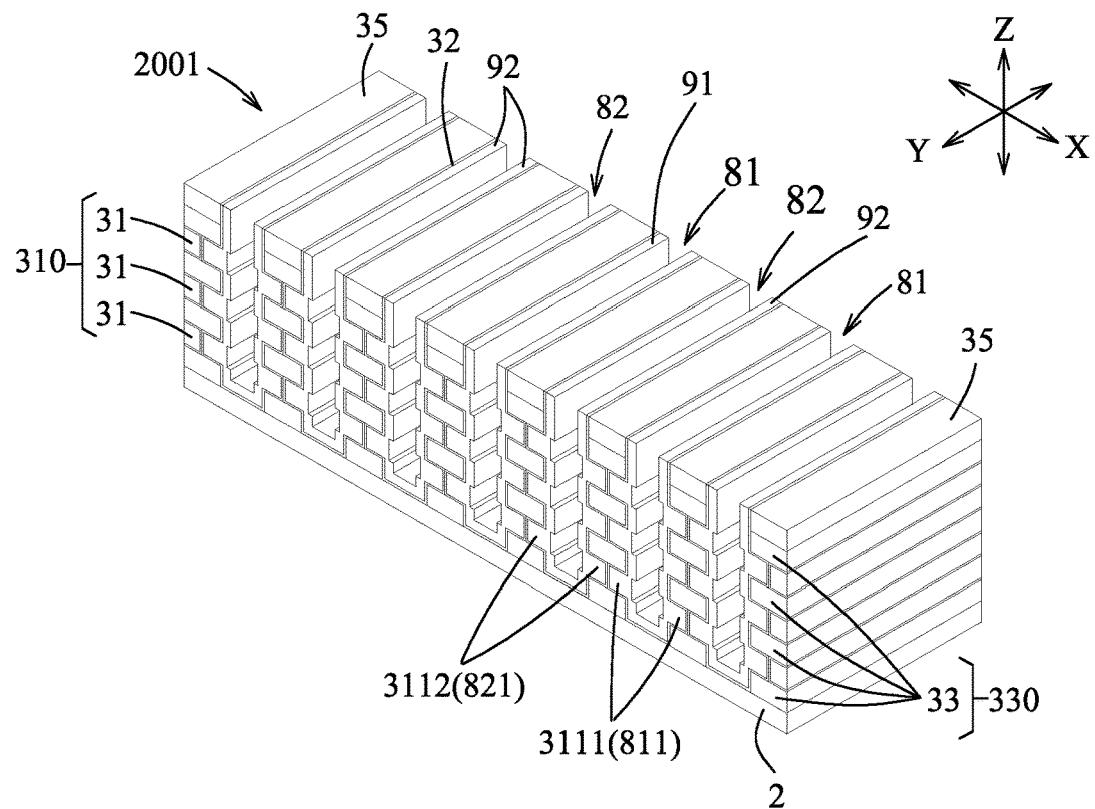
Figure 10B:
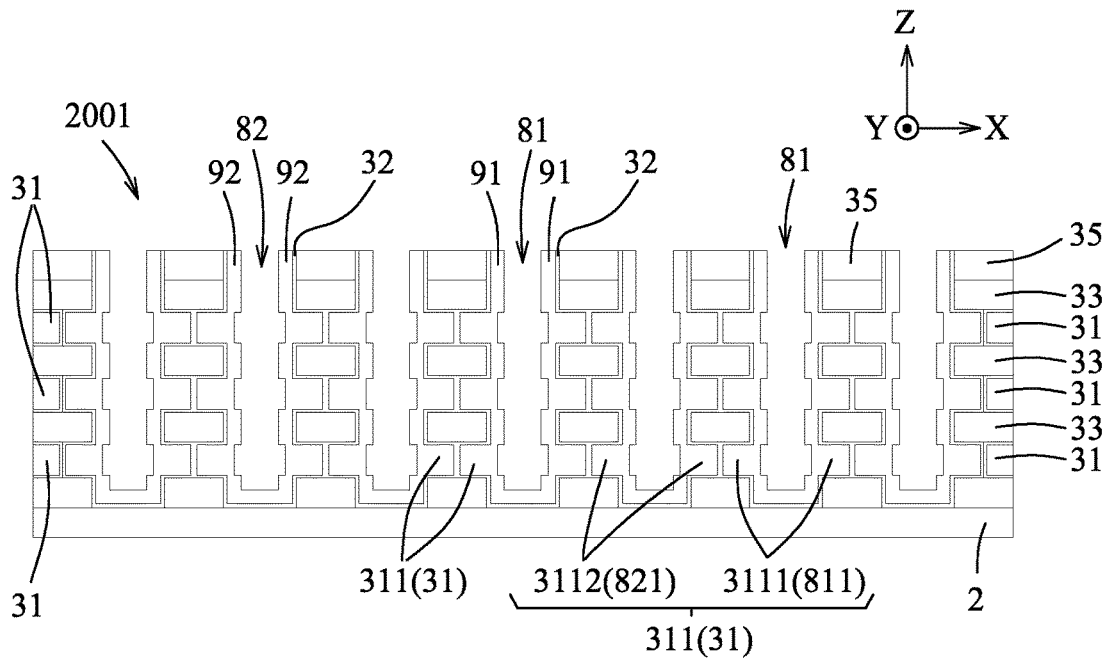
Figure 10C:
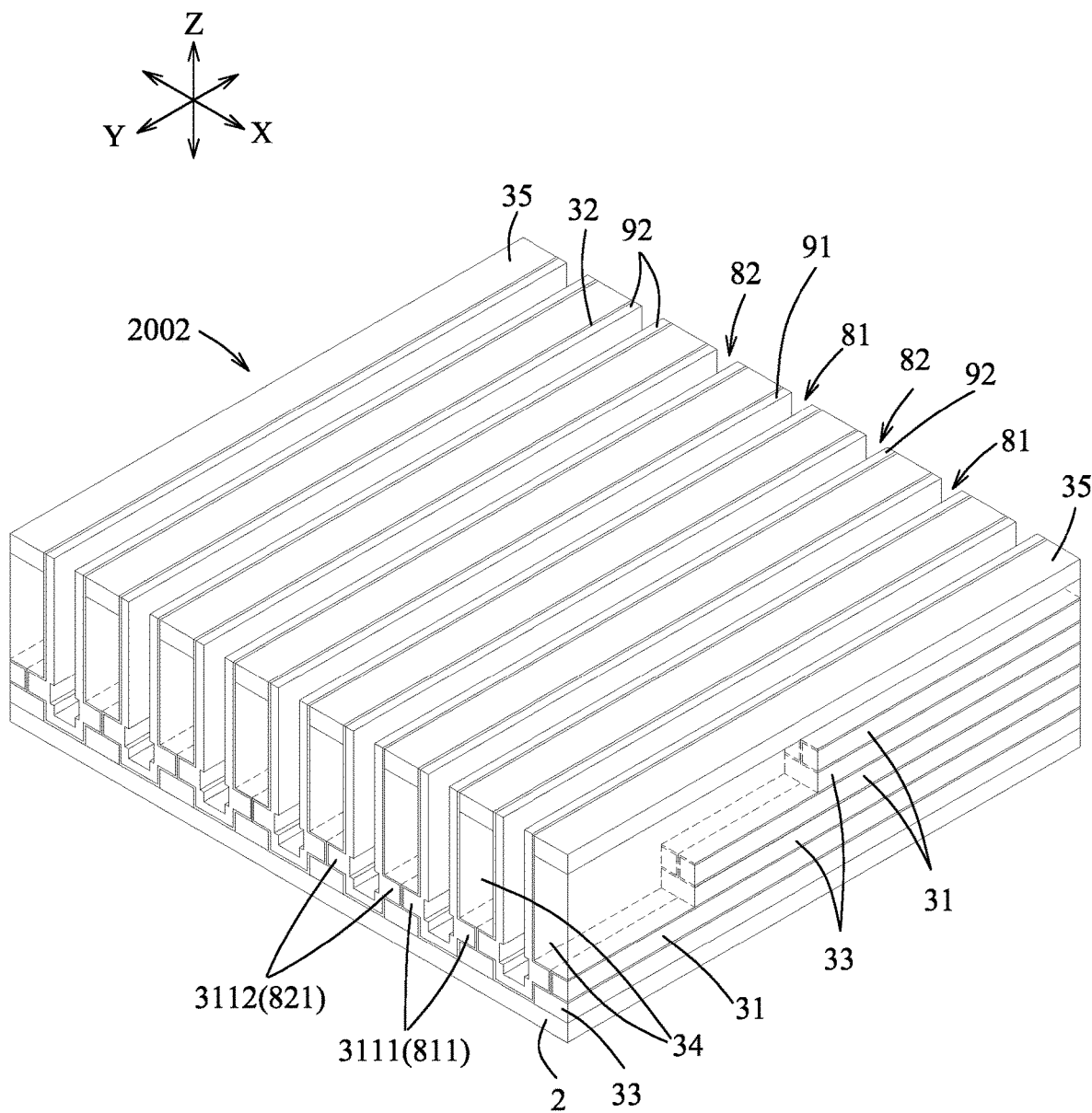

Referring to FIG. 1D and examples illustrated in FIGS. 10A, 10B, and 10C, the method 100 proceeds to step 108, where the first and second filling materials 95, 96 (shown in FIGS. 9A to 9C) are removed to expose the first and second conductive layers 91, 92. FIGS. 10A to 10C are respectively similar to FIGS. 9A to 9C but illustrating the structure after step 108 in accordance with some embodiments.

In some embodiments, the first and second filling materials 95, 96 are removed by an etching process, such as a wet etching process, but not limited thereto. An etchant used in the etching process for selective removal of the first and second filling materials 95, 96 may include, for example, but not limited to, phosphoric acid. Other suitable etchants are within the contemplated scope of the disclosure. Since the hard mask films 35 are made of a material different from those of the first and second filling materials 95, 96, the hard mask films 35 offer protection to the IMD portions 34 and the dielectric films 33 against etching, so that the IMD portions 34 and the dielectric films 33 are not removed along with the first and second filling materials 95, 96.

Figure 11A:
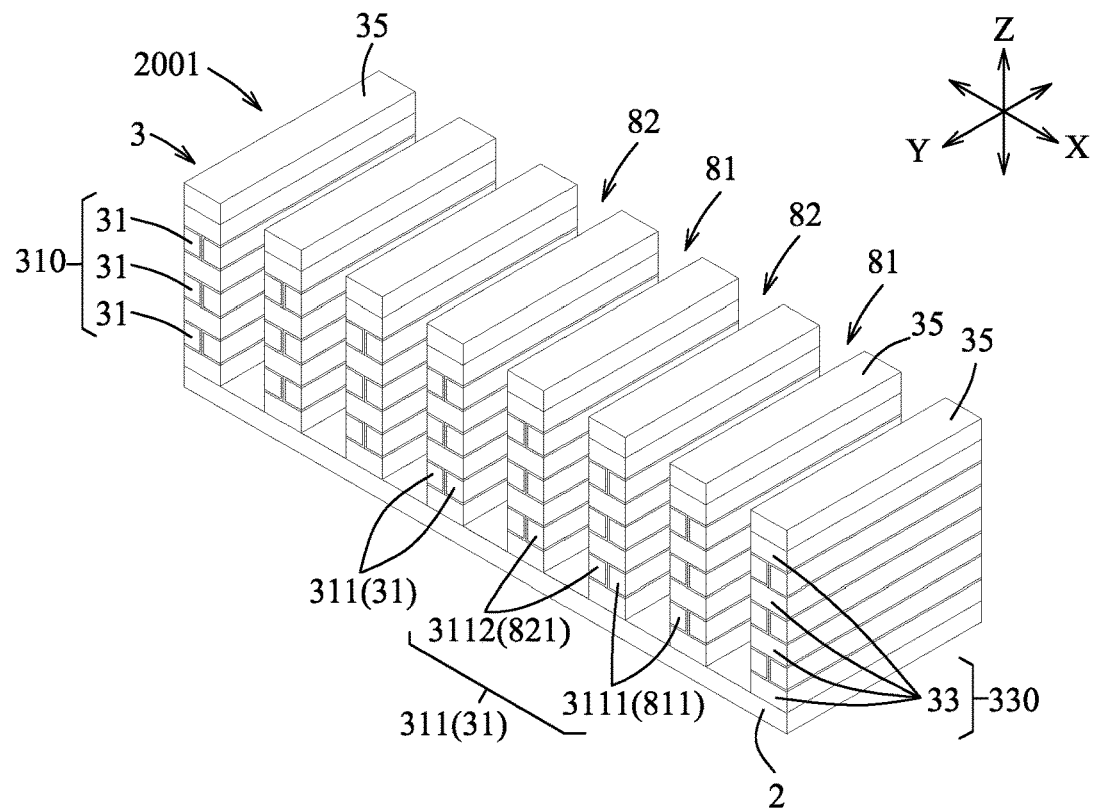
Figure 11B:
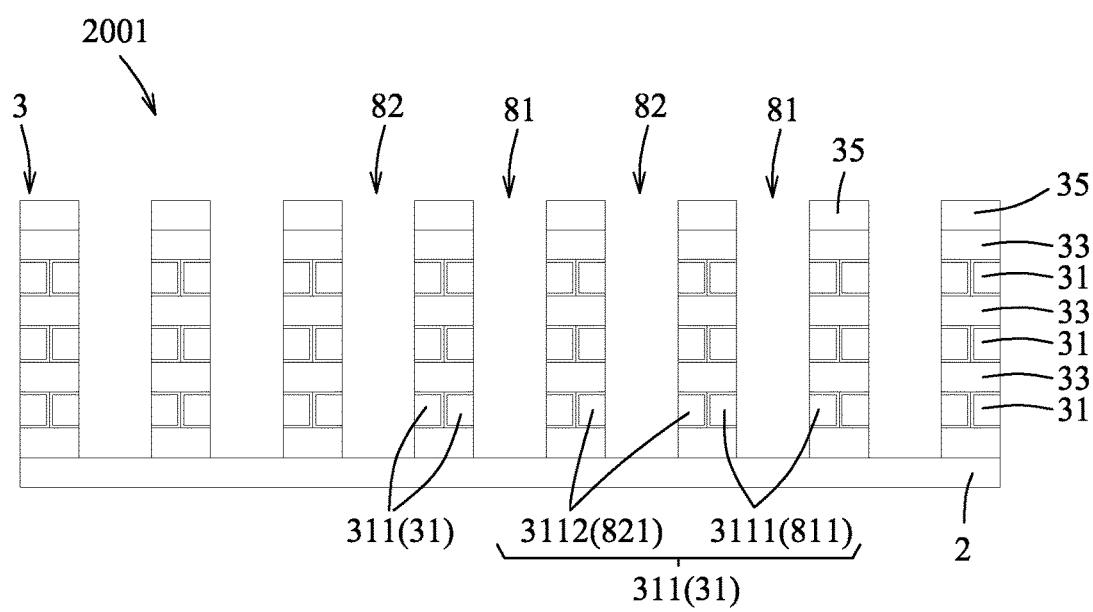
Figure 11C:
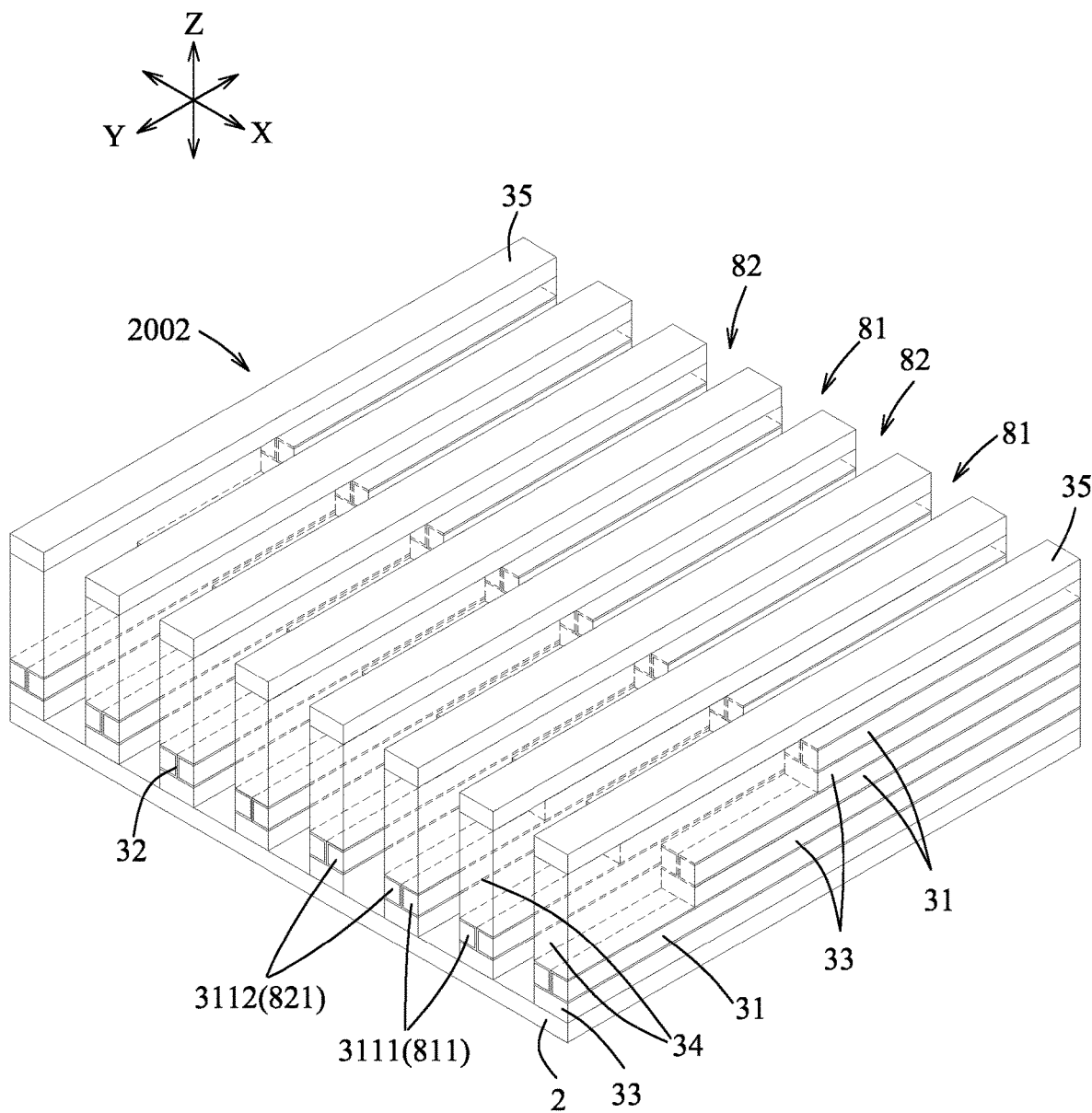

Referring to FIG. 1D and examples illustrated in FIGS. 11A, 11B, and 11C, the method 100 proceeds to step 109, where the first and second conductive layers 91, 92 are etched back to leave the first and second conductive regions 3111, 3112 in the first and second cavities 811, 821, respectively. FIGS. 11A to 11C are respectively similar to FIGS. 10A to 10C but illustrating the structure after step 109 in accordance with some embodiments.

In some embodiments, the first and second conductive layers 91, 92 are etched back by an etching process, such as a dry etching process or an isotropic etching process, to form a plurality of the conductive films 31, each of which includes two conductive regions 311 (i.e., one of the first conductive regions 3111 and an adjacent one of the second conductive regions 3112 in the X direction) alternating with the dielectric films 33. Other suitable etching processes for etching back the first and second conductive layers 91, 92 are within the contemplated scope of the disclosure. After step 109, a plurality of conductive portions 310 are formed, each of which includes a plurality of conductive films 31 disposed to alternate with the dielectric films 33 of a respective one of the dielectric portions 330, thereby obtaining a plurality of the stack units 3 (see also FIGS. 1A to 1C), each of which includes a respective one of the conductive portions 310, a respective one of the dielectric portions 330, a respective one of the IMD portions 34, and a respective one of the hard mask films 35. The first and second trenches 81, 82 are located to alternate with the stack units 3. That is, after step 108, two adjacent ones of the stack units 3 are spaced apart by a corresponding one of the first and second trenches 81, 82.

Figure 12A:
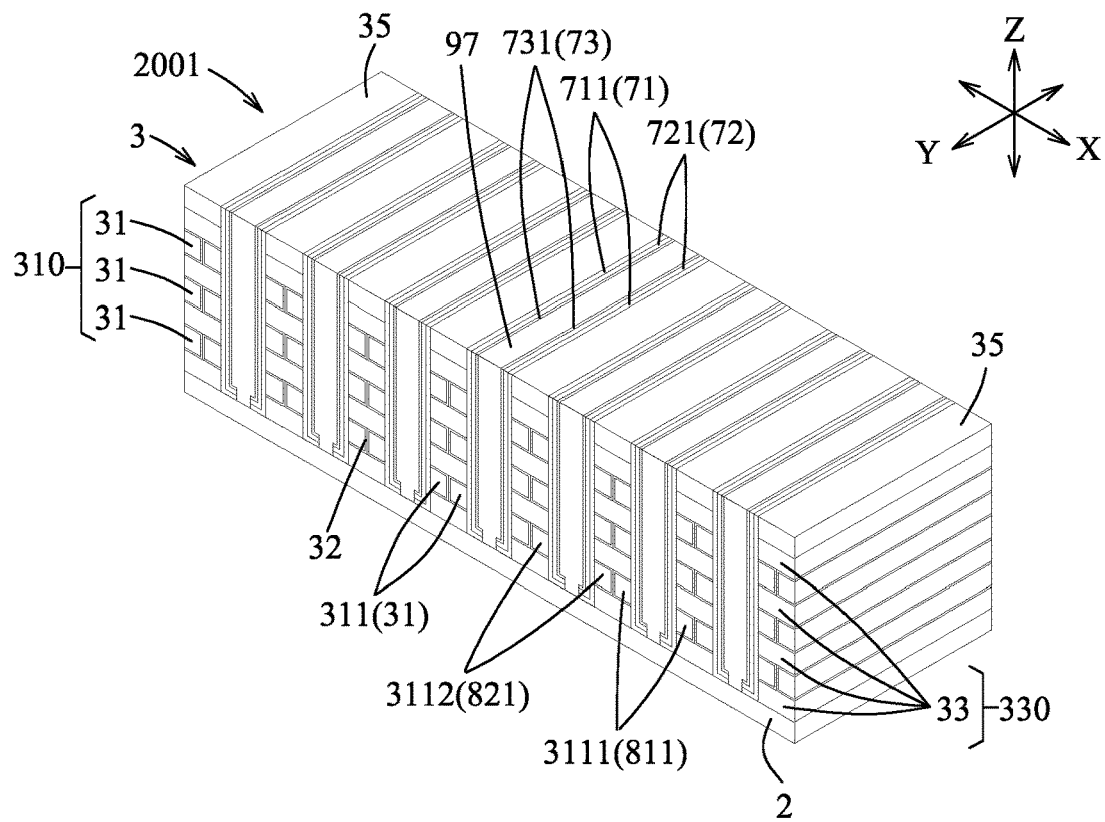
Figure 12B:
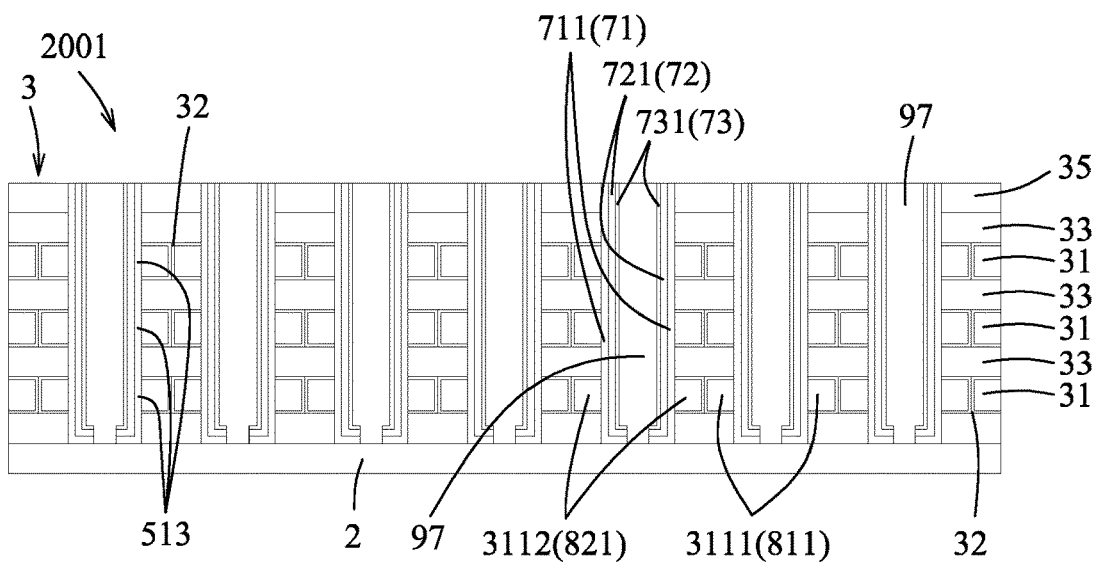
Figure 12C:
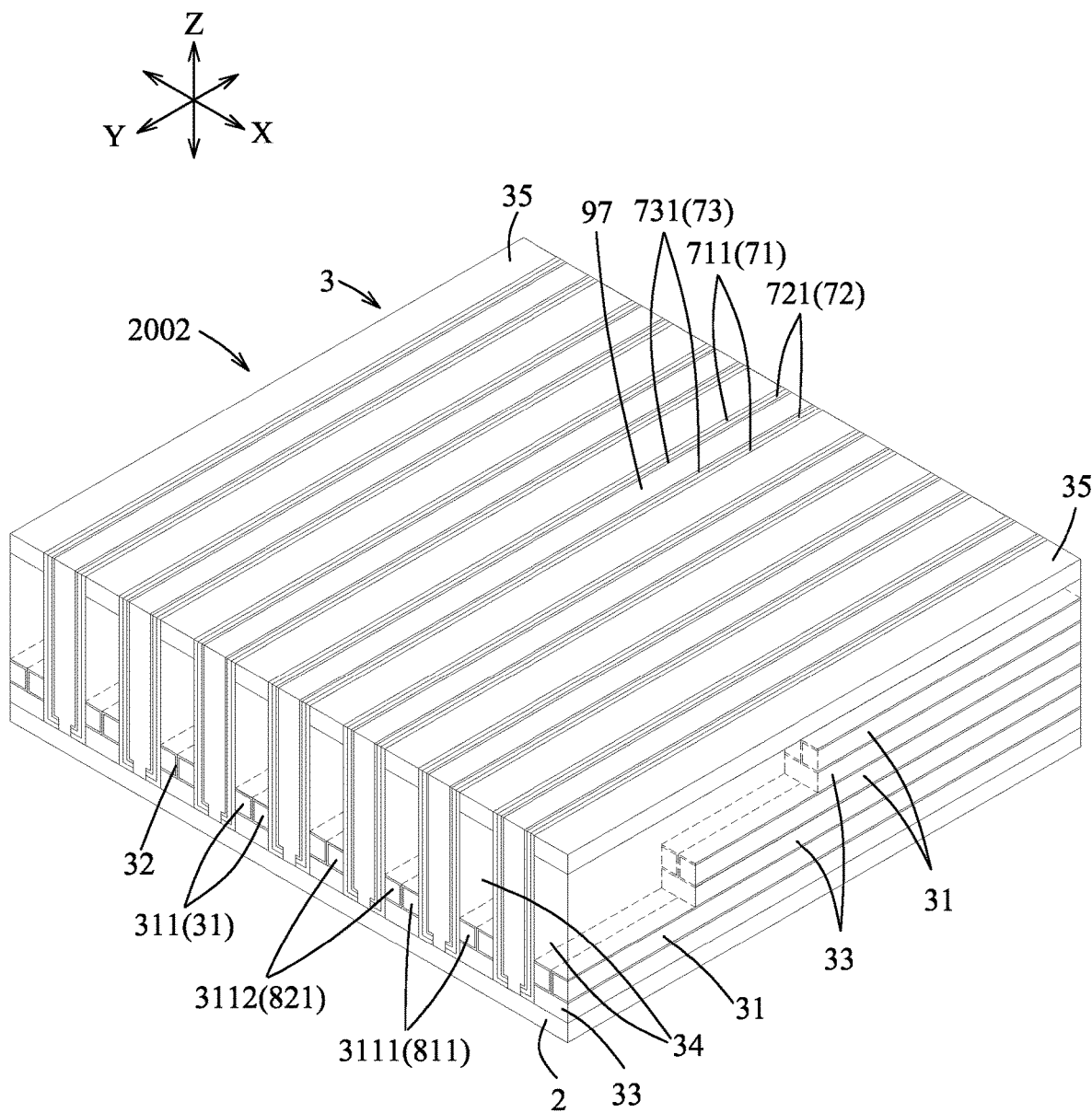

Referring to FIG. 1D and examples illustrated in FIGS. 12A, 12B, and 12C, the method 100 proceeds to step 110, where a memory layer 71, a channel layer 72, and a high-k dielectric layer 73 are conformally and sequentially formed in each of the first and second trenches, and a third filling material (filler layer) 97 is filled in the first and second trenches 81, 82 shown in FIGS. 11A to 11C. FIGS. 12A to 12C are respectively similar to FIGS. 11A to 11C but illustrating the structure after step 110 in accordance with some embodiments.

In some embodiments, each of the memory layer 71, the channel layer 72, and the high-k dielectric layer 73 may have a thickness that ranges from about 20 nm to about 200 nm. Each of the first and second trenches 81, 82 has two lateral surfaces defined respectively by two adjacent ones of the stack units 3 and a bottom surface defined by a portion of an upper surface of the underlying substrate 2. Before filling the third filling material 97, the memory layer 71, the channel layer 72, and the high-k dielectric layer 73 are patterned to partially expose the bottom surface of each of the first and second trenches 81, 82 (i.e., to partially expose the portion of the upper surface of the underlying substrate 2). Therefore, the memory layer 71 is formed into two memory segments 711 disposed respectively on two adjacent ones of the stack units 3 (i.e, disposed respectively on the lateral surfaces of a corresponding one of the first and second trenches 81, 82), the channel layer 72 is formed into two channel segments 721 disposed respectively on the two memory segments 711, and the high-k dielectric layer 73 is formed into two high-k dielectric segments 731 disposed respectively on the two channel segments 721. The memory layer 71, the channel layer 72, and the high-k dielectric layer 73 are patterned by a suitable etching technique, for example, but not limited to, dry etching, wet etching, or a combination thereof. Other suitable techniques for patterning are within the contemplated scope of the disclosure. Next, the third filling material 97 is filled in the first and second trenches 81, 82, and thus covers the high-k dielectric segments 731, the channel segments 721, and the memory segments 711. Thereafter, the memory segments 711, the channel segments 721, the high-k dielectric segments 731, and the third filling material 97 are subjected to a planarization process, for example, but not limited to, CMP, to remove excesses of the memory segments 711, the channel segments 721, the high-k dielectric segments 731, and the third filling material 97, to thereby expose the hard mask films 35. Other suitable techniques for planarization process are within the contemplated scope of the disclosure.

In some embodiments, each of the memory segments 711 includes a plurality of the memory portions 513 (see FIGS. 1A and 1C) which extend in the Z direction, and which are displaced from one another in the Y direction.

The memory layer 71, the channel layer 72, and the high-k dielectric layer 73 may be formed by suitable fabrication techniques such as CVD, ALD, PVD, PECVD, or the like, or combinations thereof. Other suitable techniques for forming the memory layer 71, the channel layer 72, and the high-k dielectric layer 73 are within the contemplated scope of the disclosure. The third filling material 97 may be filled in the first and second trenches 81, 82 by suitable deposition techniques such as CVD, PVD, PECVD, or the like. Other suitable techniques for filling the third filling material 97 are within the contemplated scope of the disclosure. In certain embodiments, an annealing step may be conducted after formation of the memory layer 71 so as to improve the quality of the memory layer 71.

In some embodiments, the memory layer 71 may be made of a high-k dielectric material. In certain embodiments, the memory layer 71 may include, for example, but not limited to, a ferroelectric material, silicon nitride, silicon oxynitride, silicon oxide, or the like. The ferroelectric material may be binary oxides such as hafnium oxide (hafnia, $HfO_2$), ternary oxides such as hafnium silicate ($HfSiO_x$), hafnium zirconate ($HfZrO_x$), barium titanate ($BaTiO_3$), lead titanate ($PbTiO_3$), strontium titanate ($SrTiO_3$), calcium manganite ($CaMnO_3$), bismuth ferrite ($BiFeO_3$), aluminum scandium nitride (AlScN), aluminum gallium nitride (AlGaN), aluminum yttrium nitride (AlYN), or the like, or quaternary oxides such as barium strontium titanate ($BaSrTiO_x$), or the like, or combinations thereof. In certain embodiments, the memory layer 71 may have multiple layers. Other suitable materials for the memory layer 71 are within the contemplated scope of the disclosure.

The channel layer 72 may be made of various semiconductor materials. In certain embodiments, the material for making the channel layer 72 may include, for example, but not limited to, polysilicon, an indium-comprising material, such as $In_{x1}Ga_{x2}Zn_{x3}M_{x4}O$, where M may be Ti, Al, Ag, Si, Sn, W, or the like, and x1, x2, x3 and x4 may each be any value between 0 and 1, or the like, or combinations thereof. In some embodiments, the channel layer 72 may be formed as a single layer having one of the aforesaid materials. In some alternative embodiments, the channel layer 72 may be formed as a laminate structure of at least two of the aforesaid materials of various constitutions. In some embodiments, the channel layer 72 may be doped with a dopant to achieve extra stability. Other suitable materials for the channel layer 72 are within the contemplated scope of the disclosure.

The high-k dielectric layer 73 is generally made of a dielectric material having a dielectric constant higher than 4, greater than about 12, greater than about 16, or even greater than about 20. The high-k dielectric layer 73 may include, for example, but not limited to, aluminum oxide ($Al_2O_3$), hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, hafnium dioxide-alumina ($HfO2-Al_2O_3$), yttrium oxide, zirconium oxide, titanium oxide, ytterbium oxide, silicon nitride, or the like. Other suitable materials for the high-k dielectric layer 73 are within the contemplated scope of the disclosure. The third filling material 97 may be the same as or similar to the first and second filling materials 95, 96. Other suitable materials for the third filling material 97 are within the contemplated scope of the disclosure.

Figure 13A:
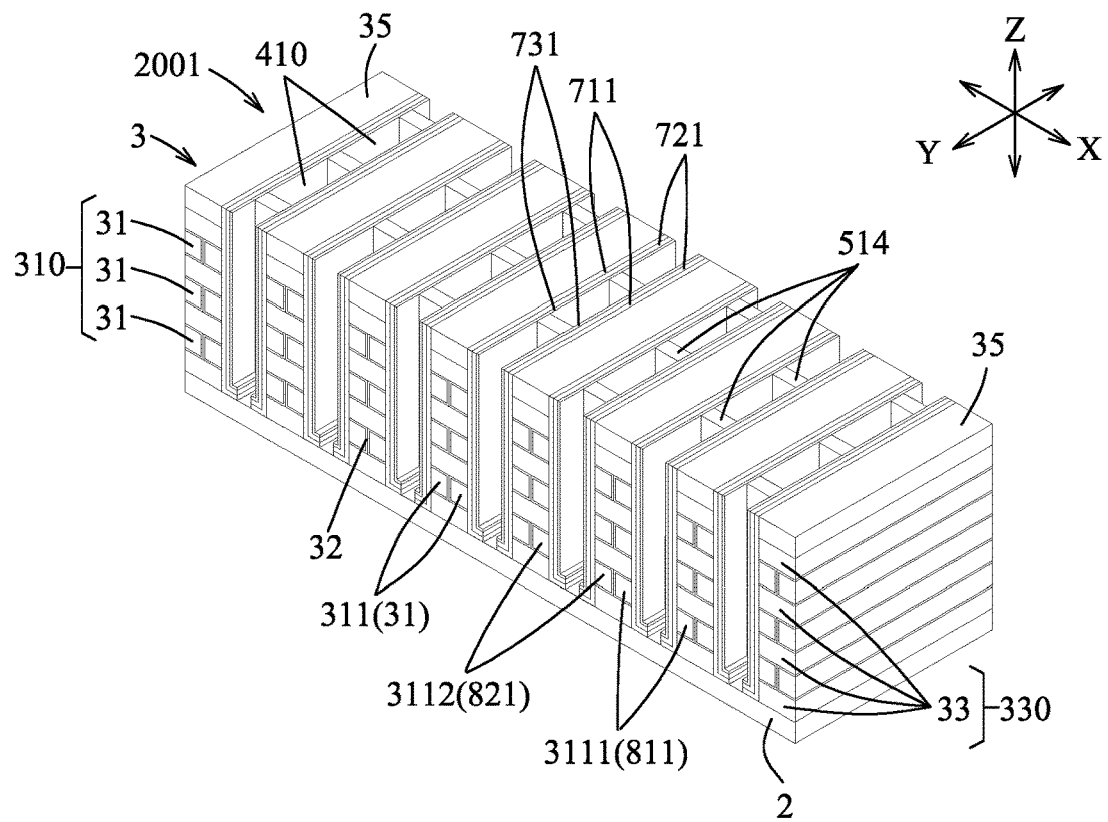
Figure 13B:
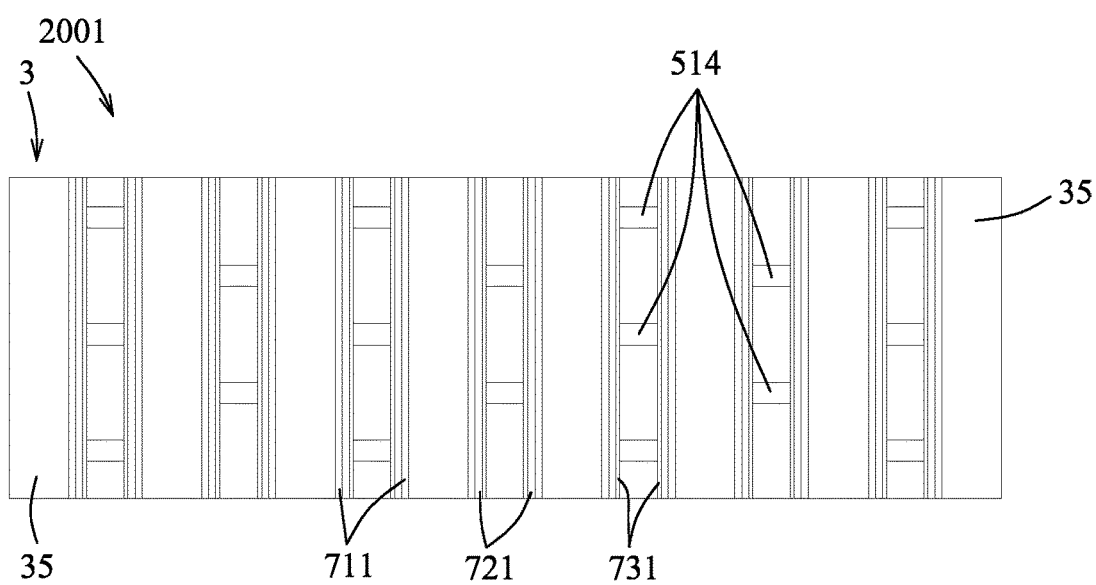
Figure 13C:
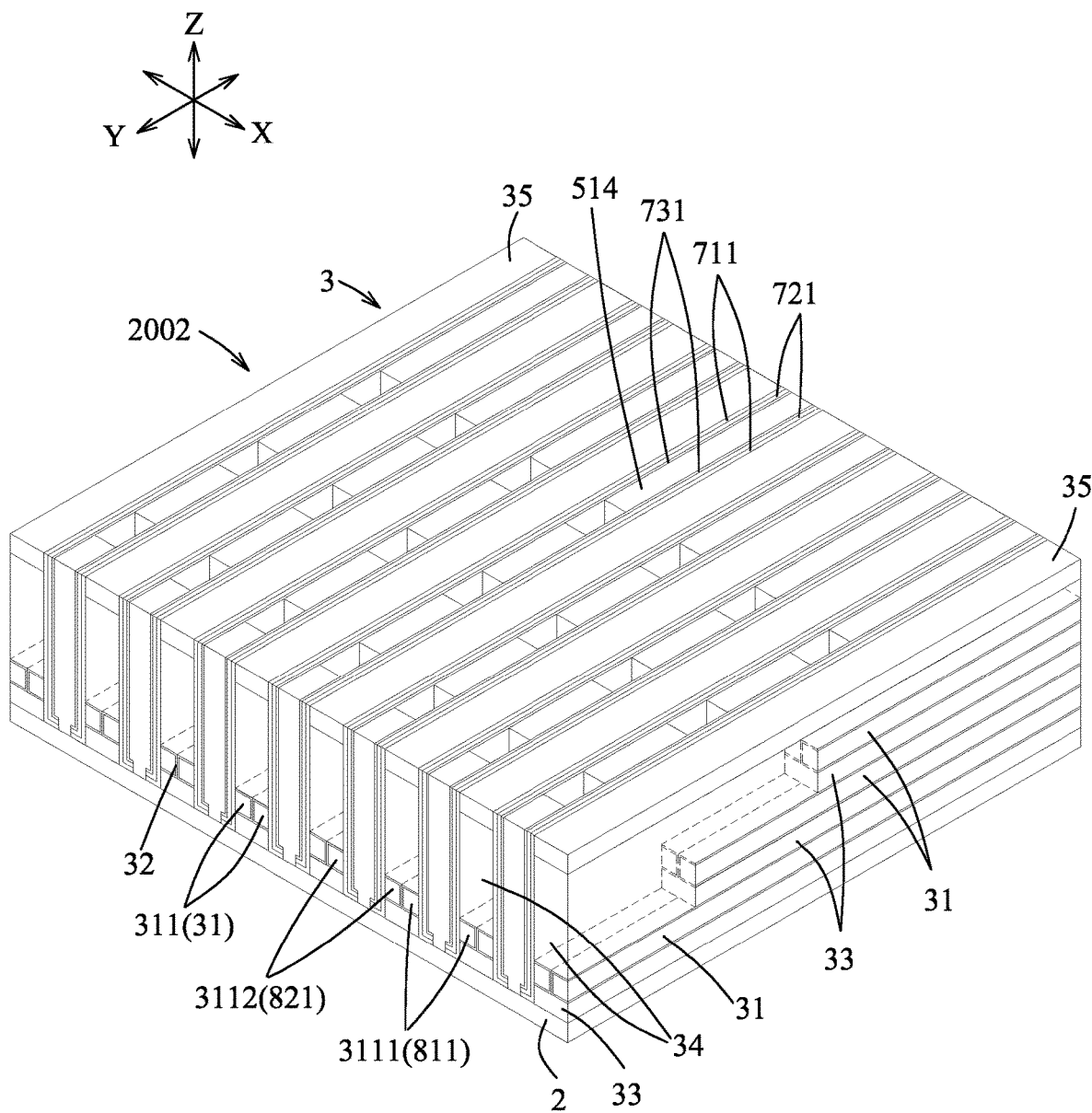
Figure 13D:
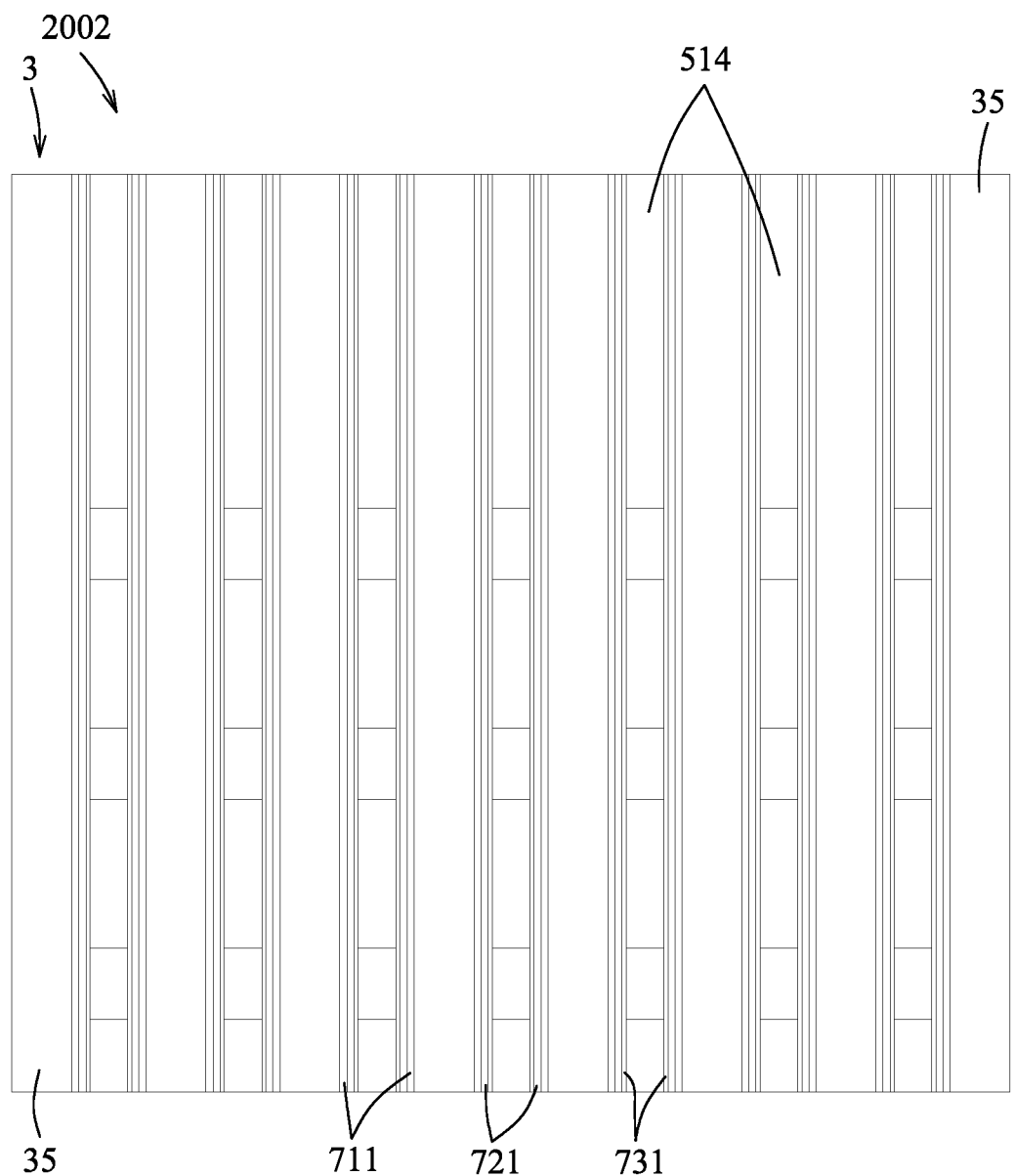
Figure 14A:
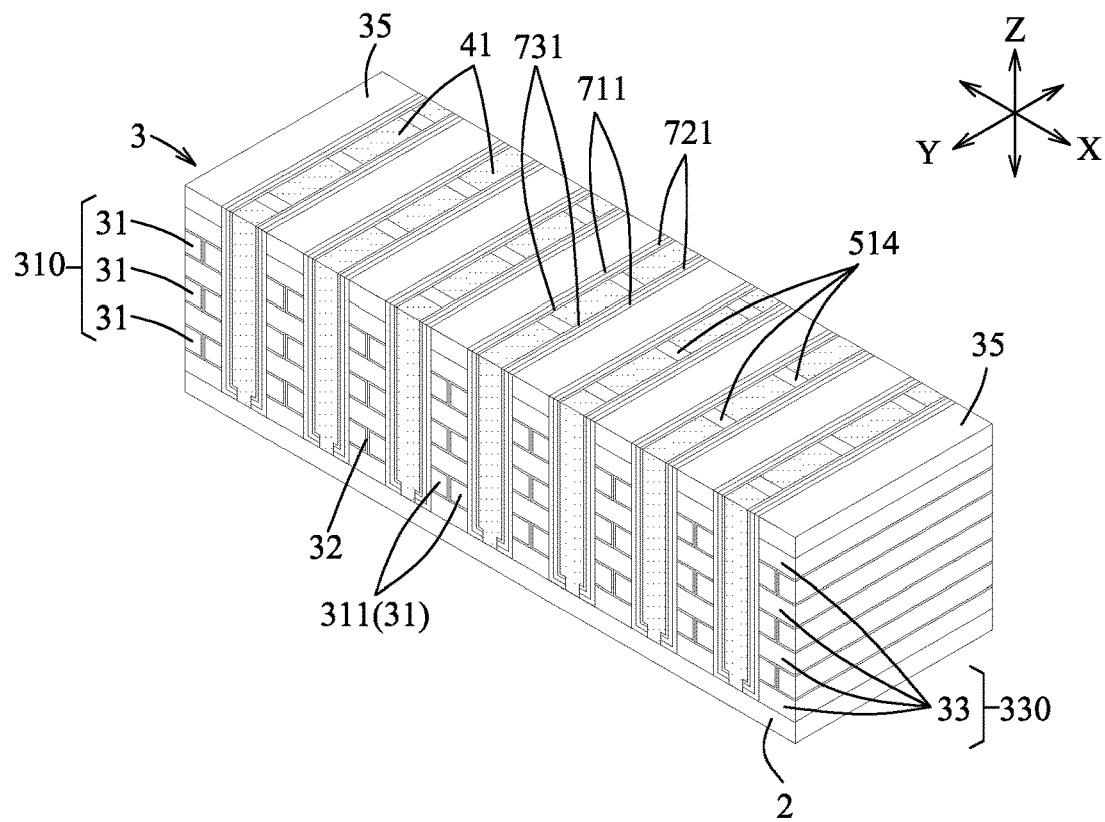
Figure 14B:
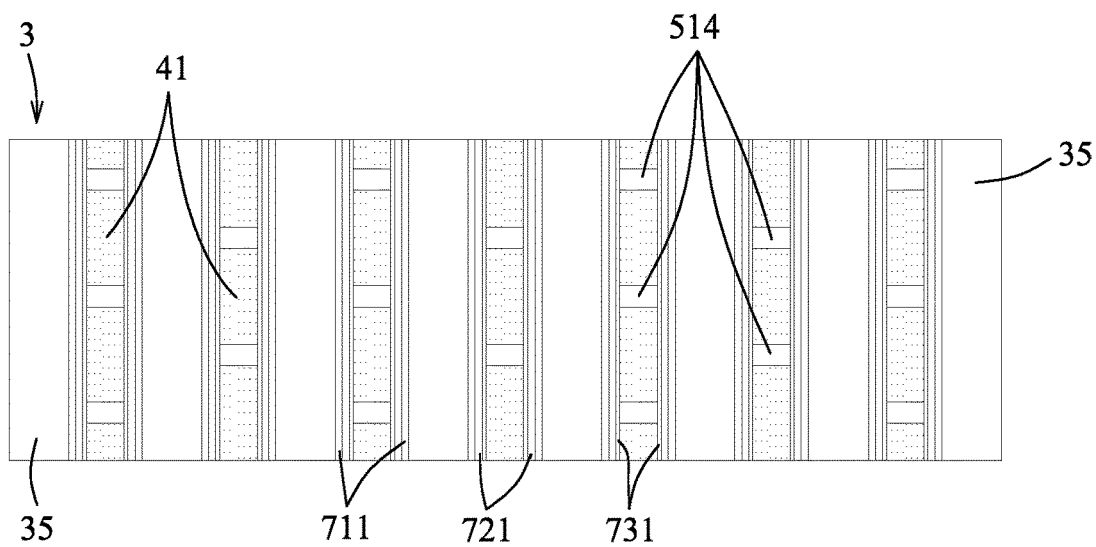
Figure 14C:
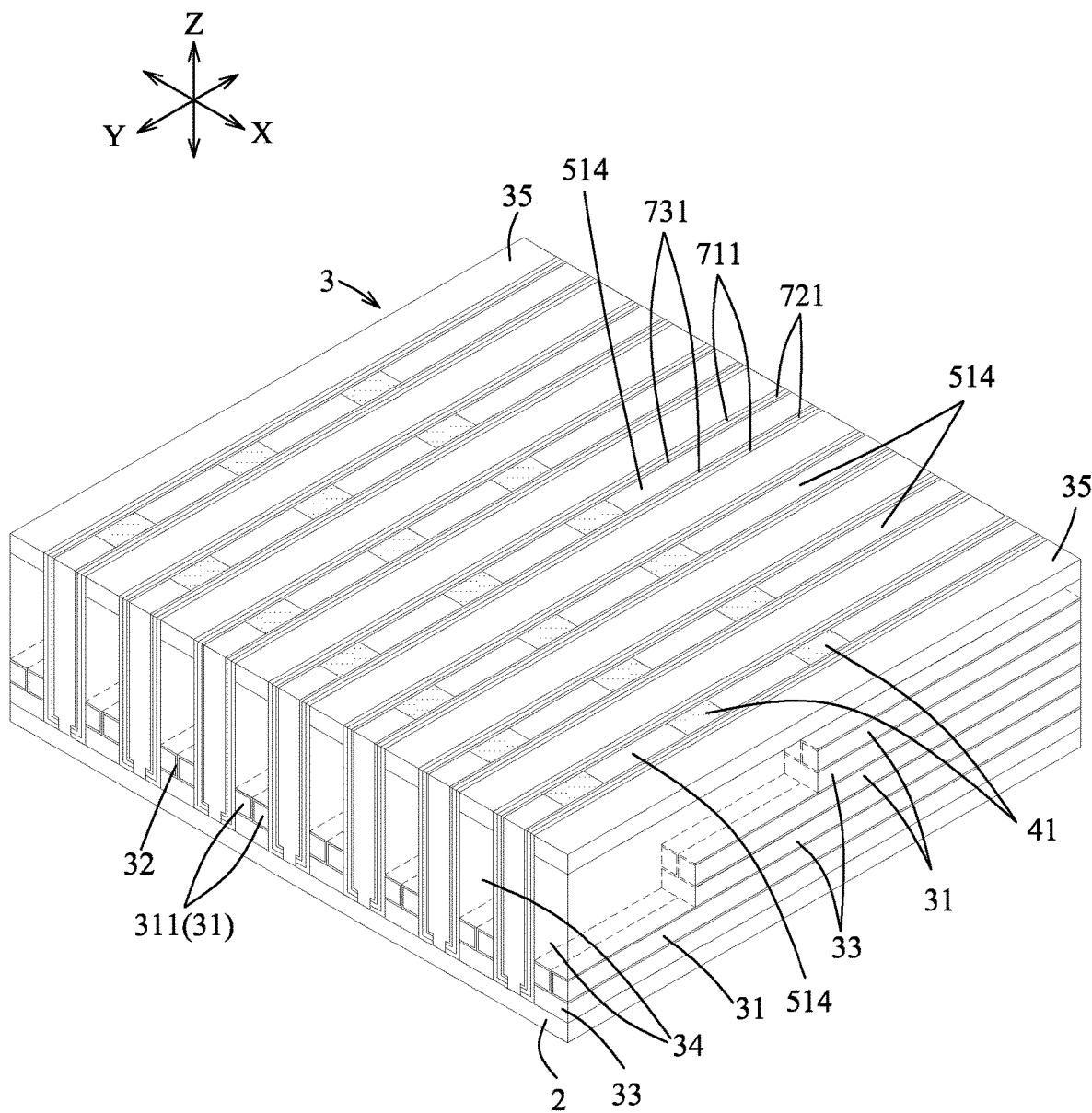
Figure 14D:
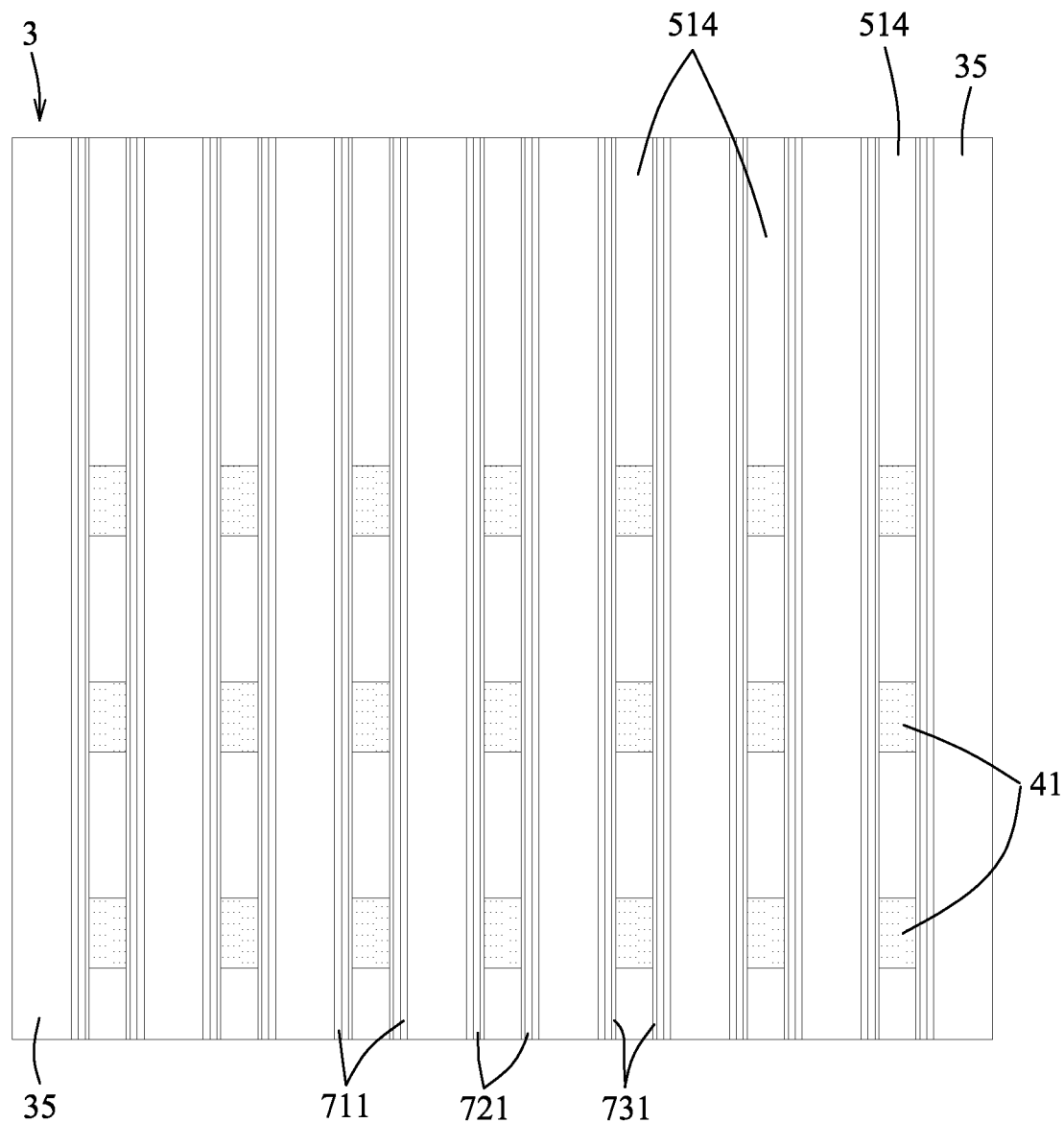
Figure 15A:
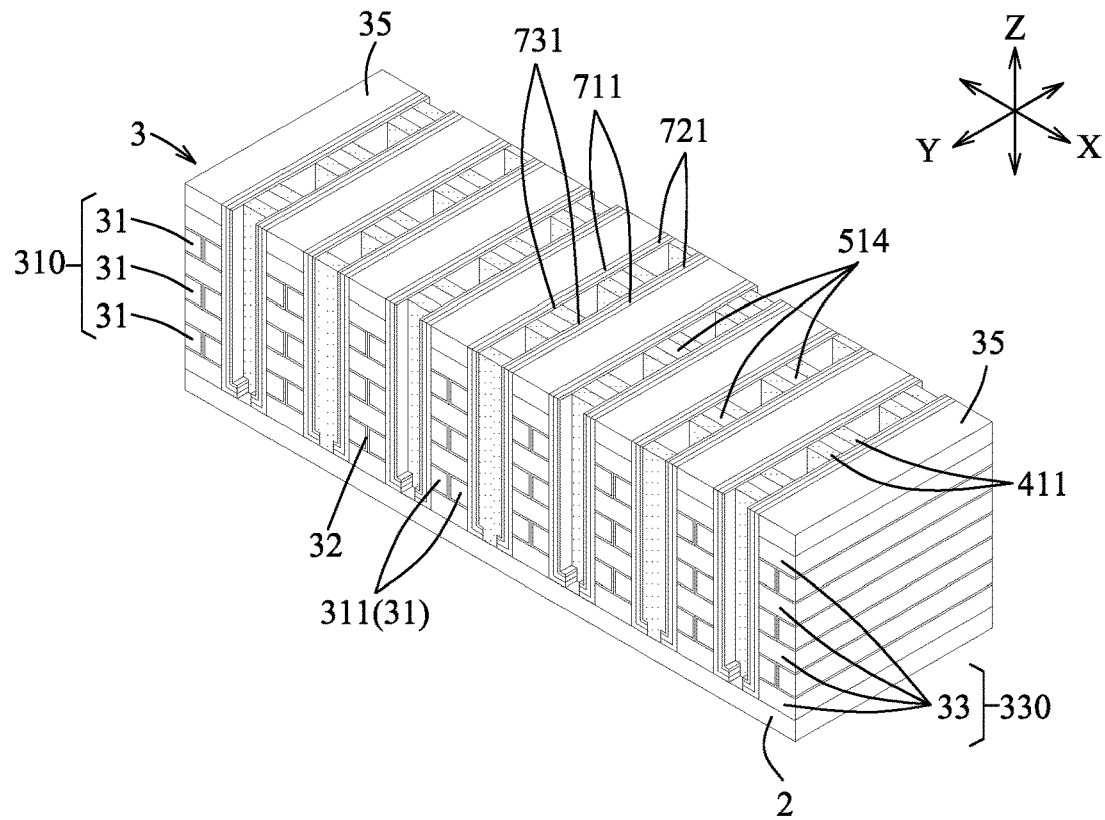
Figure 15B:
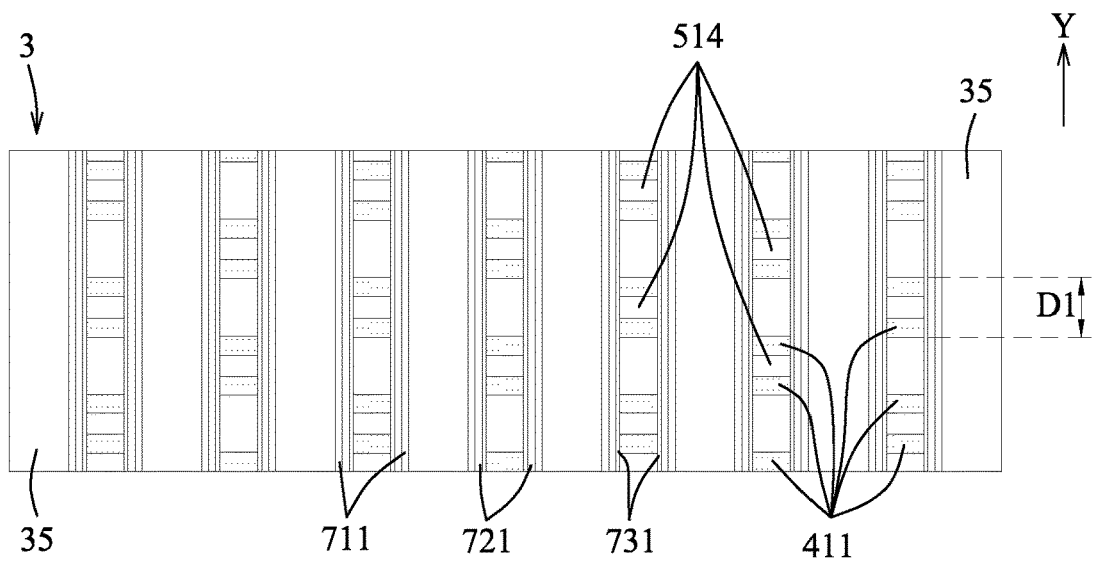
Figure 15C:
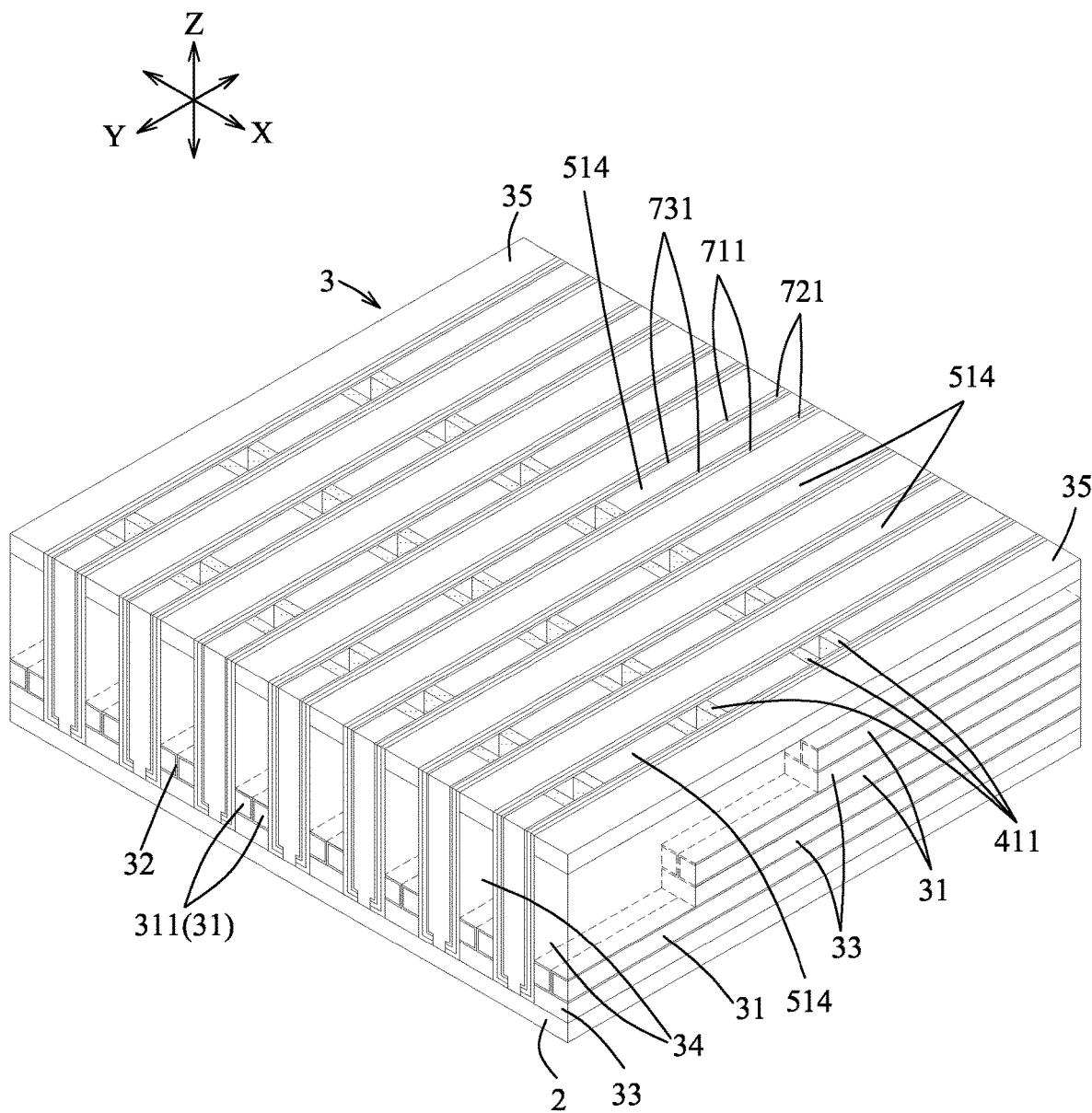
Figure 15D:
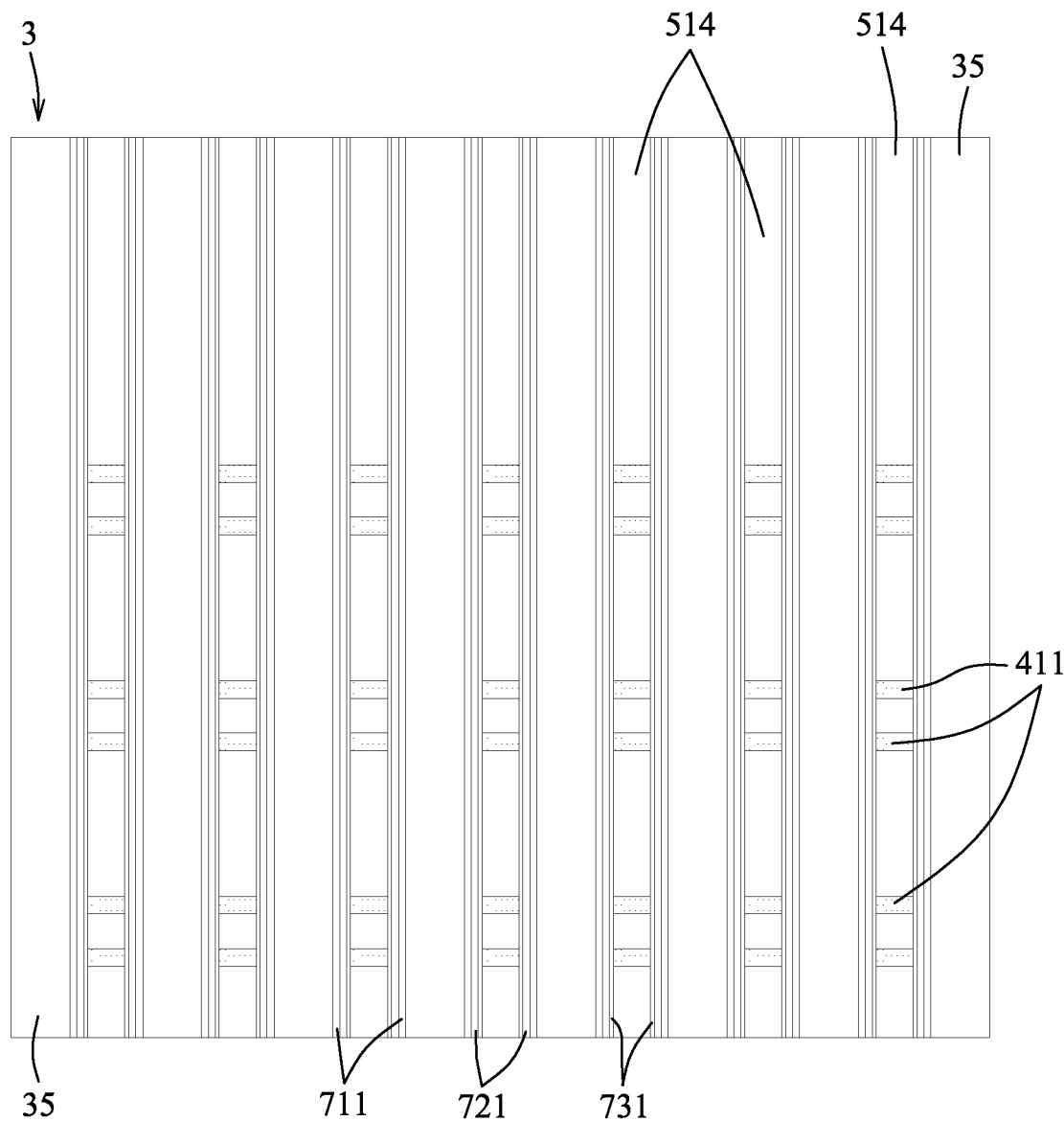
Figure 16A:
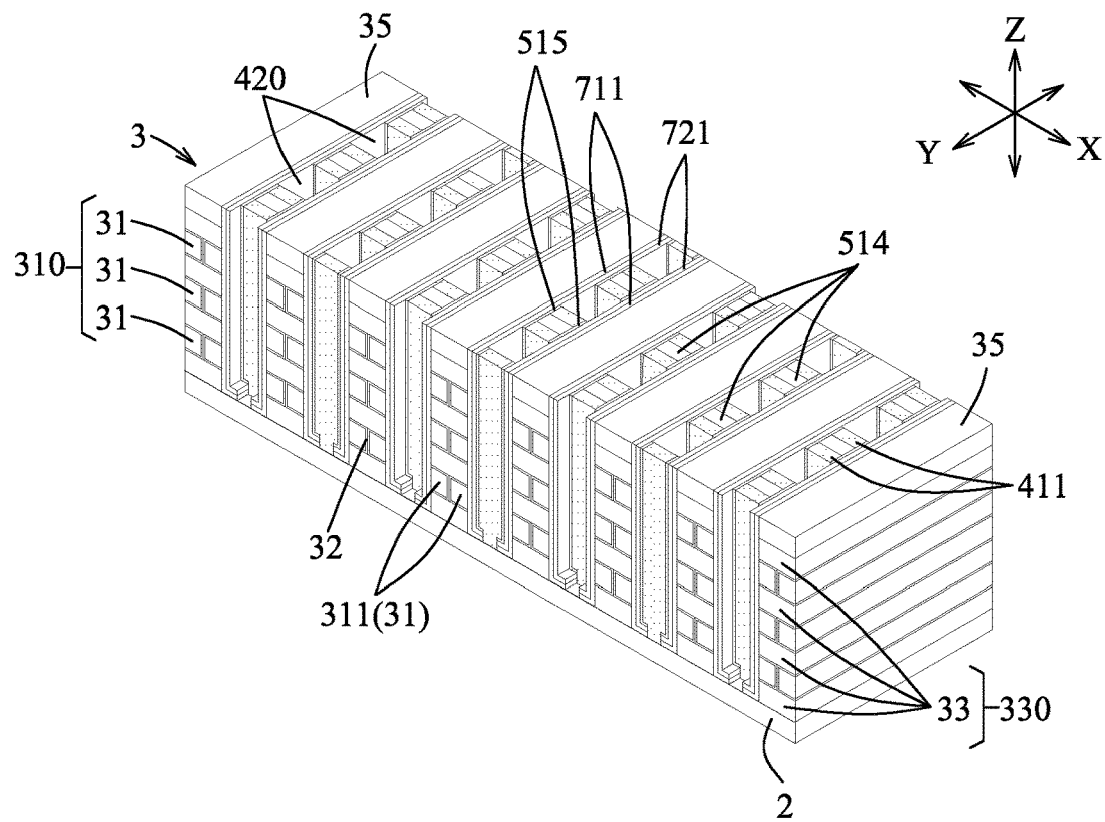
Figure 16B:
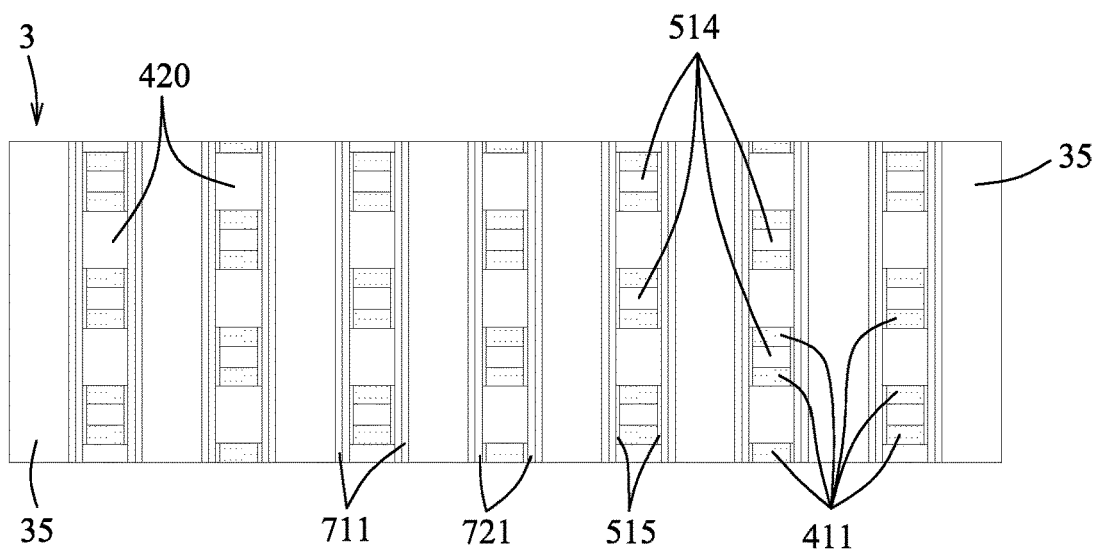
Figure 16C:
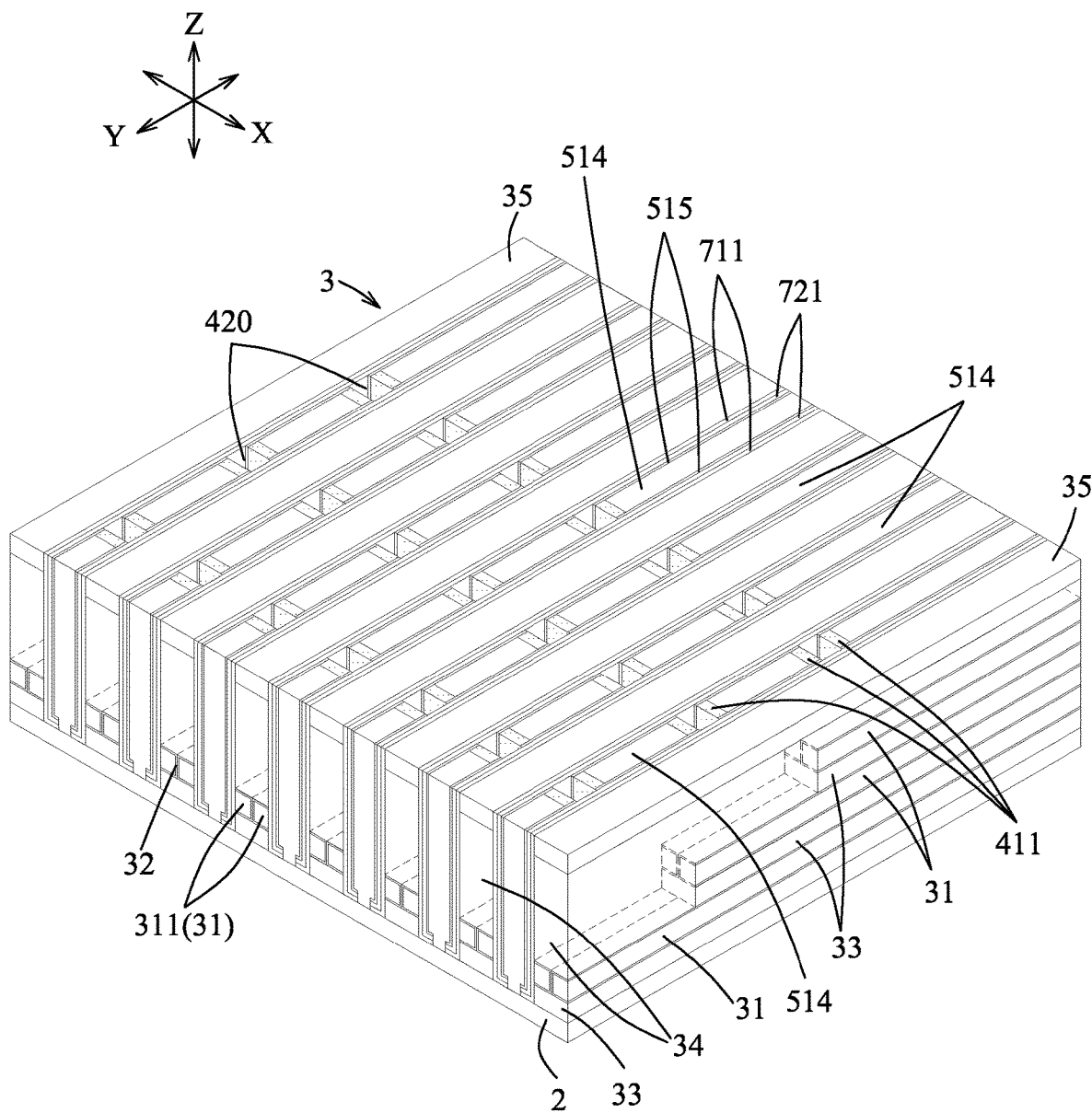
Figure 16D:
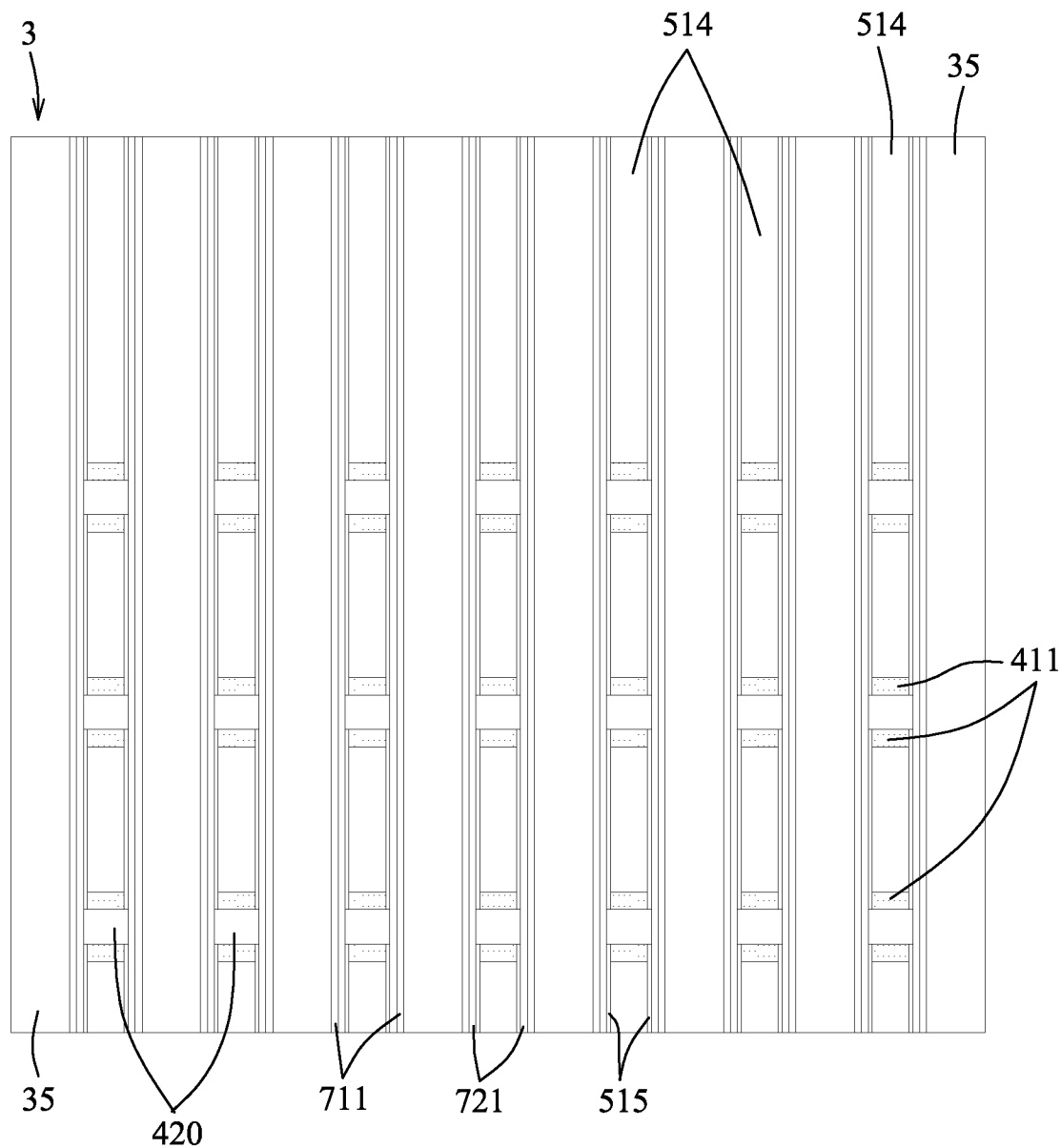
Figure 17A:
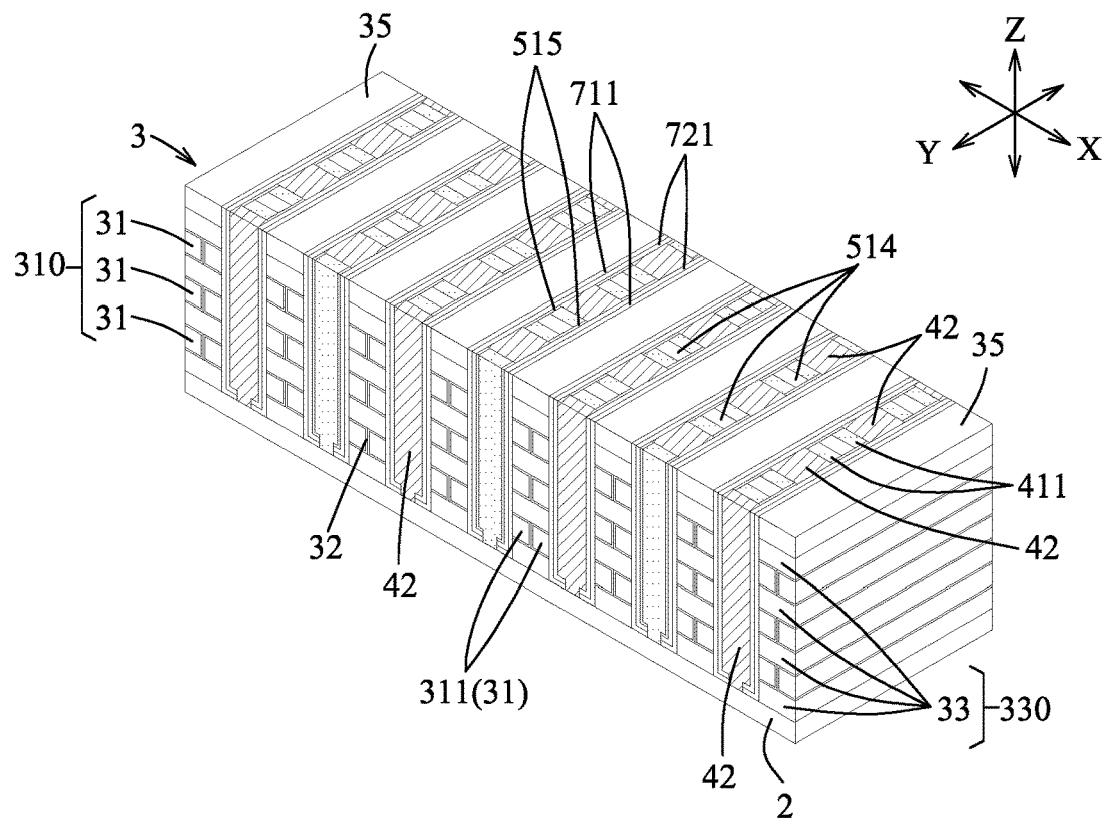
Figure 17B:
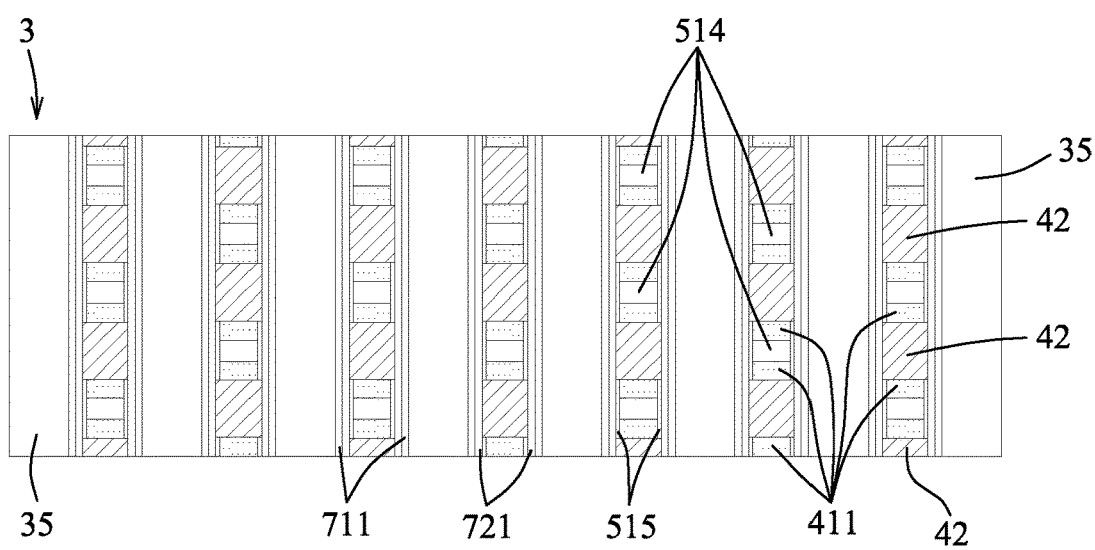
Figure 17C:
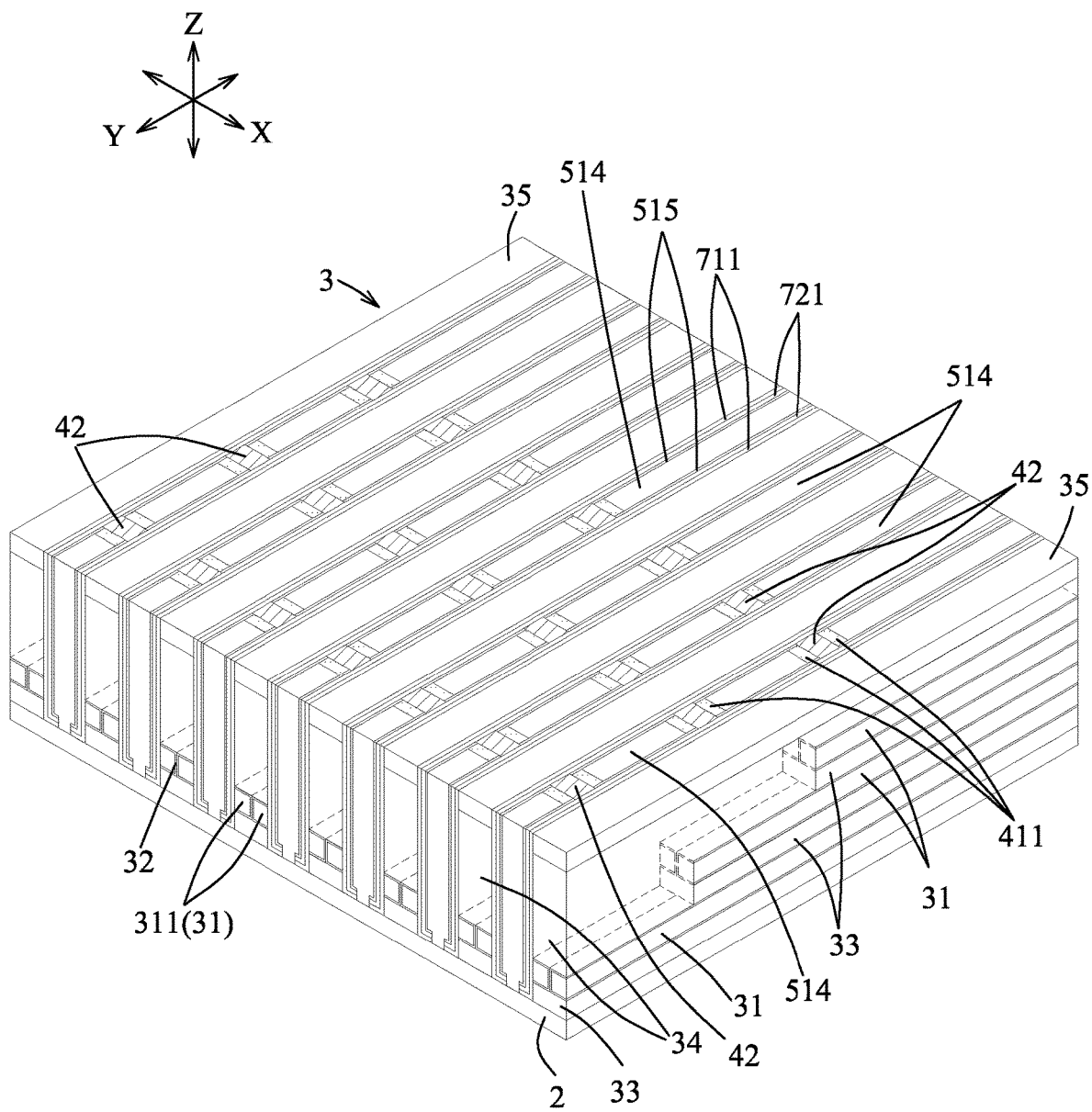
Figure 17D:
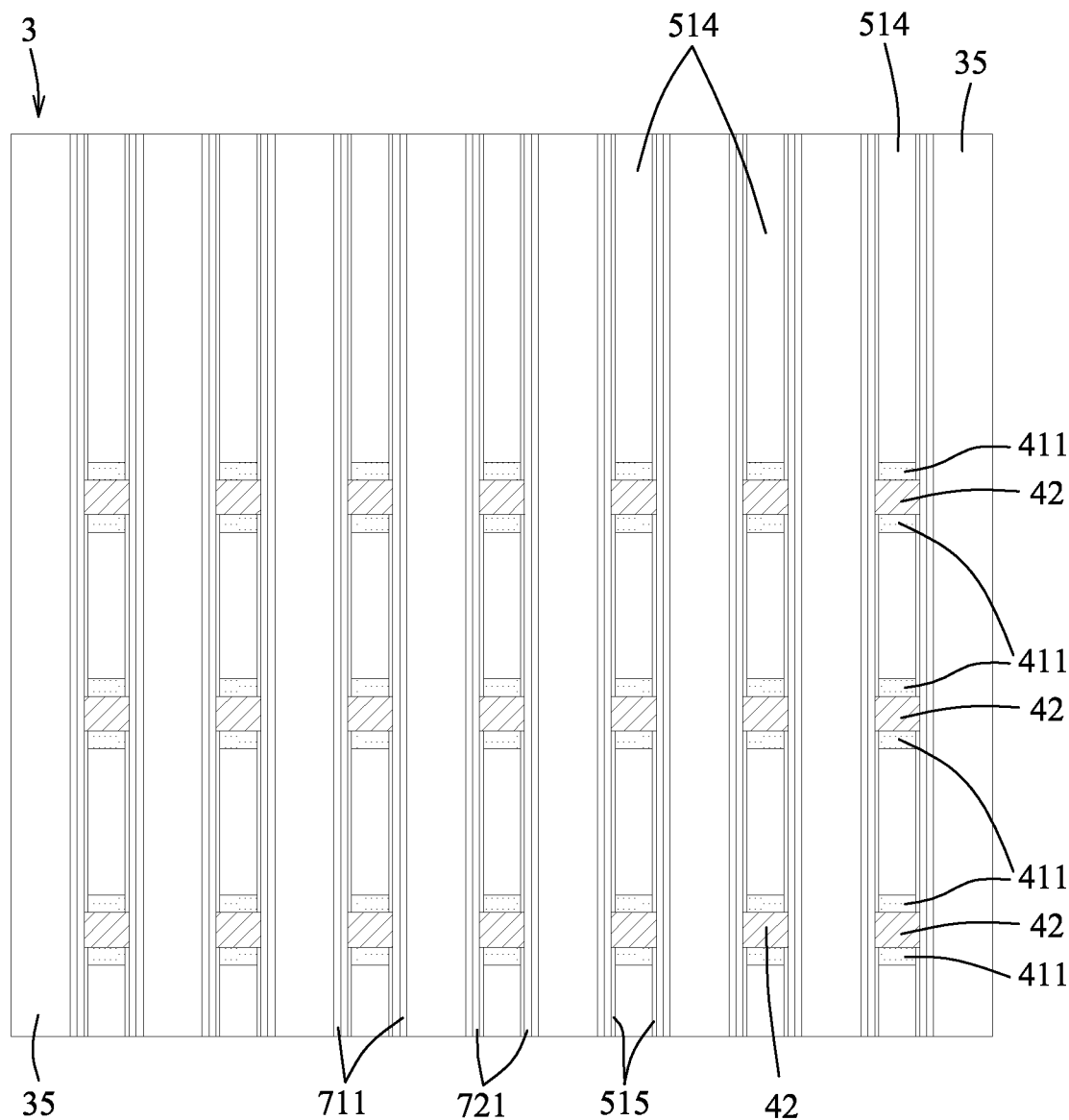
Figure 18A:
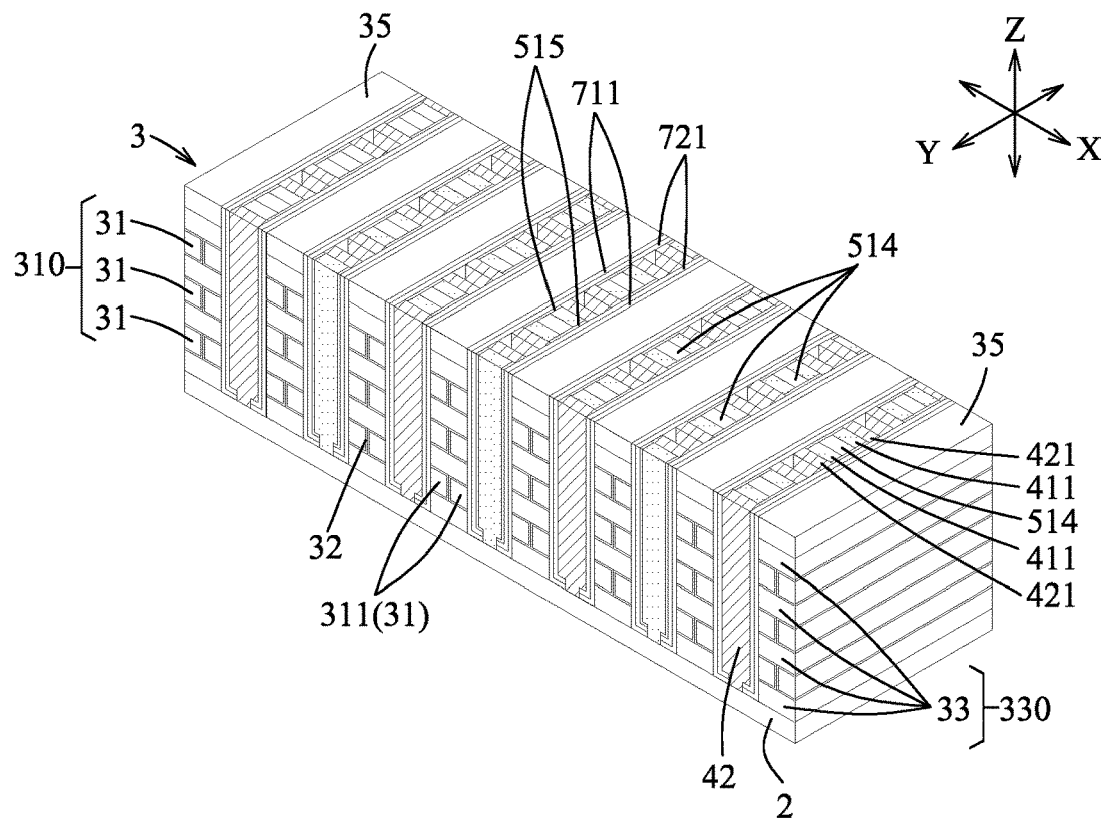
Figure 18B:
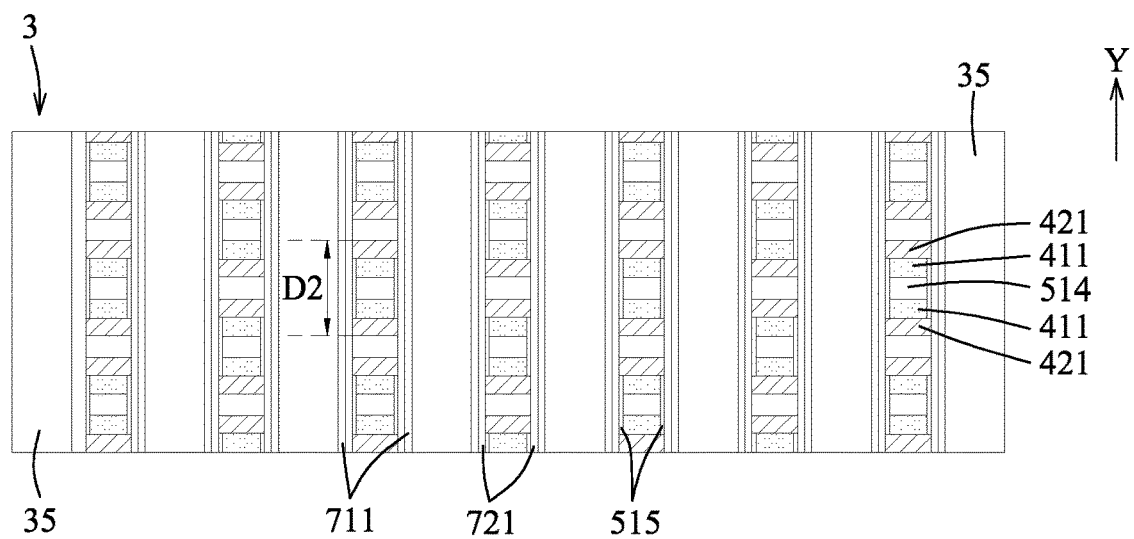
Figure 18C:
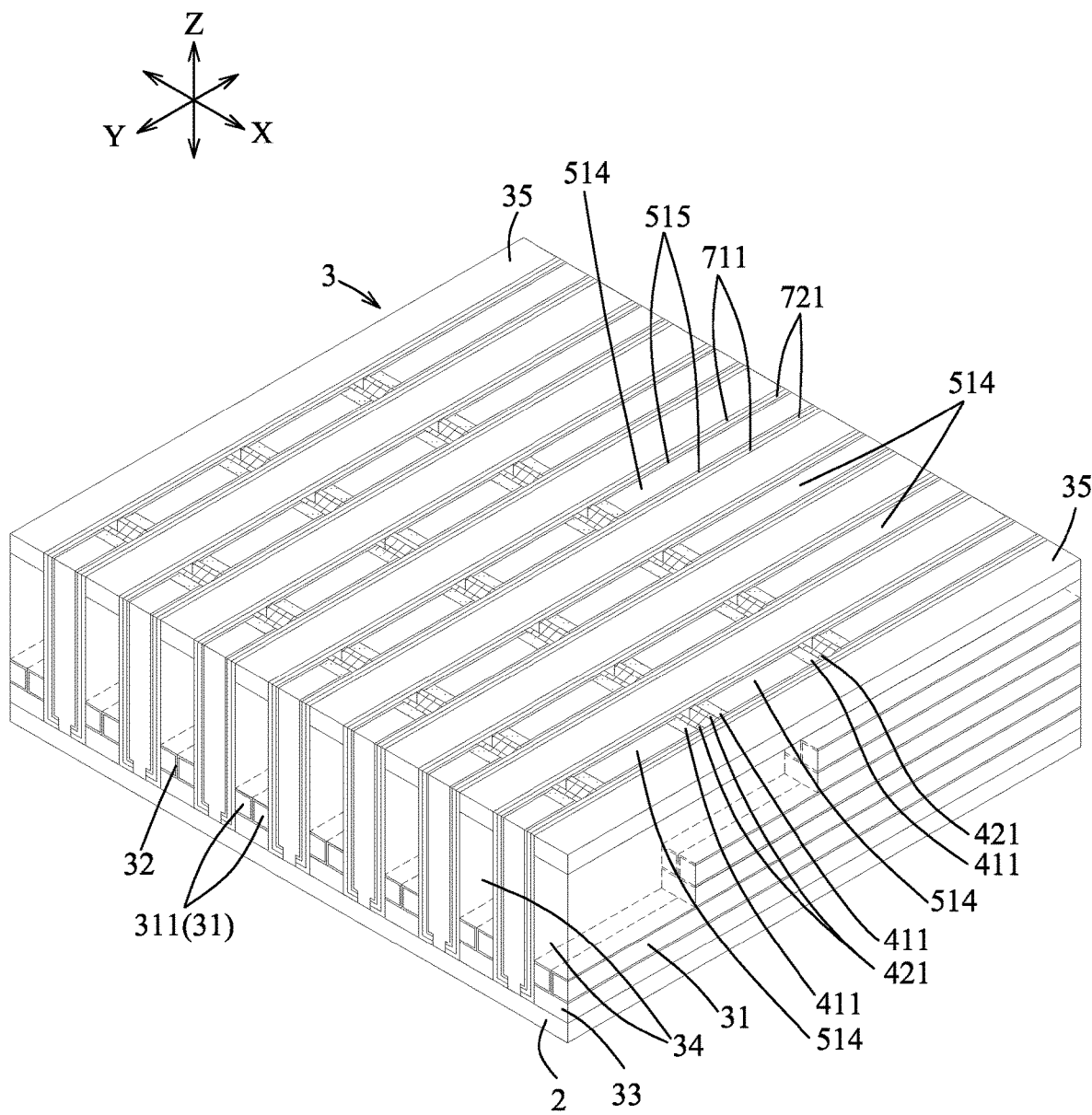
Figure 18D:
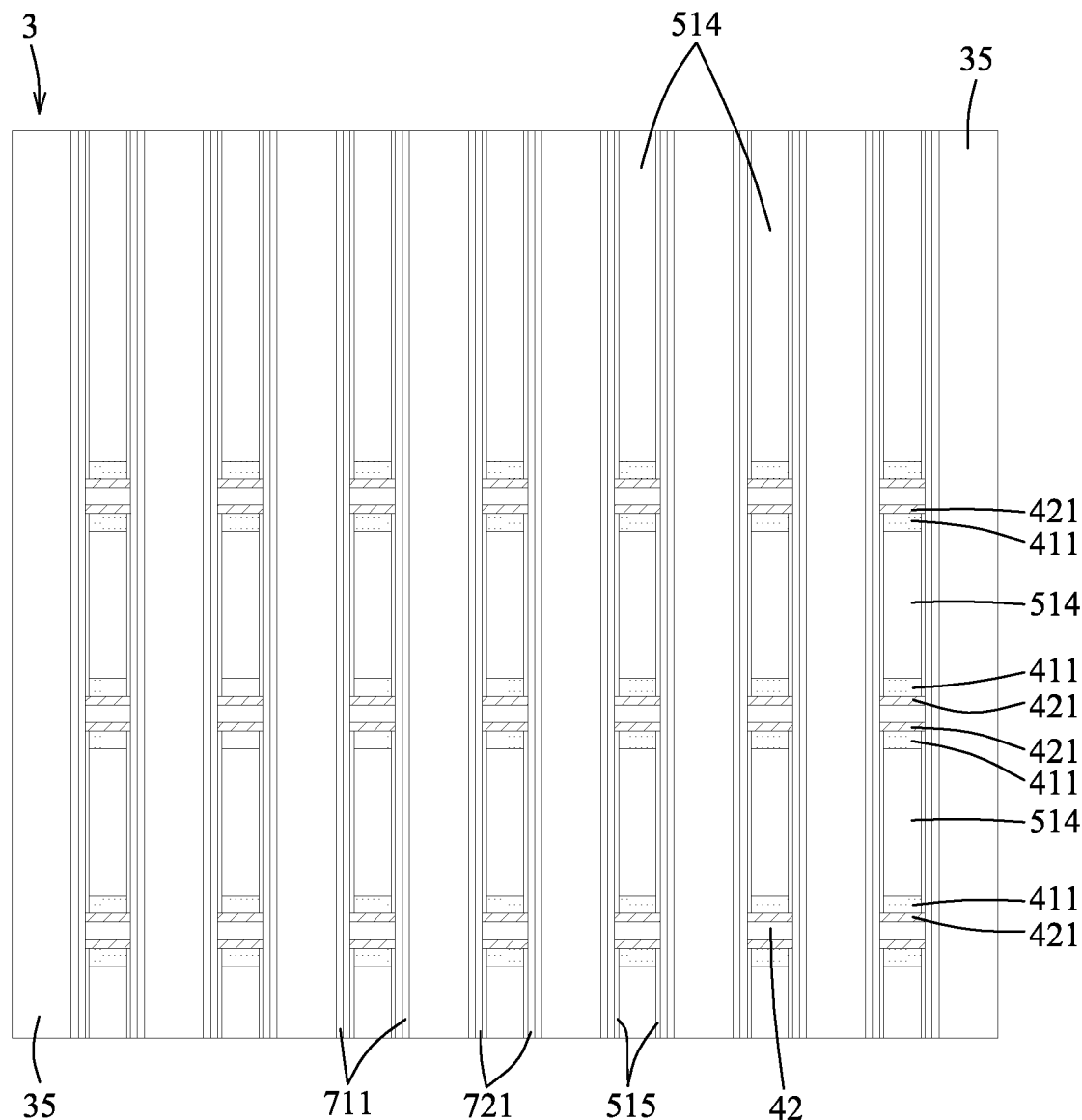
Figure 19A:
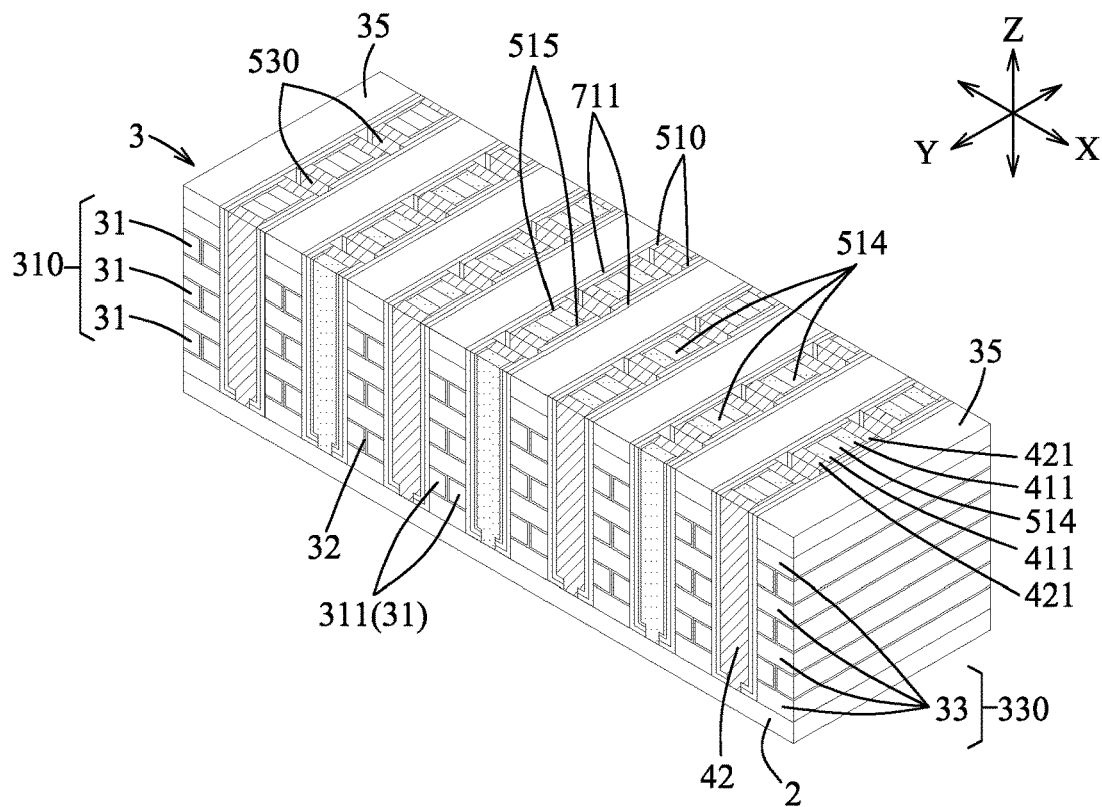
Figure 19B:
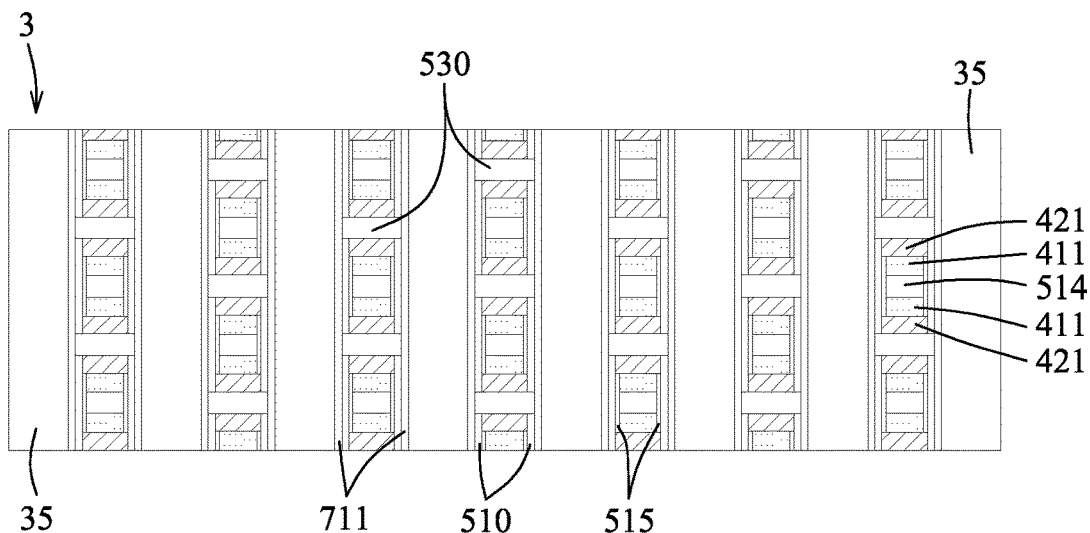
Figure 19C:
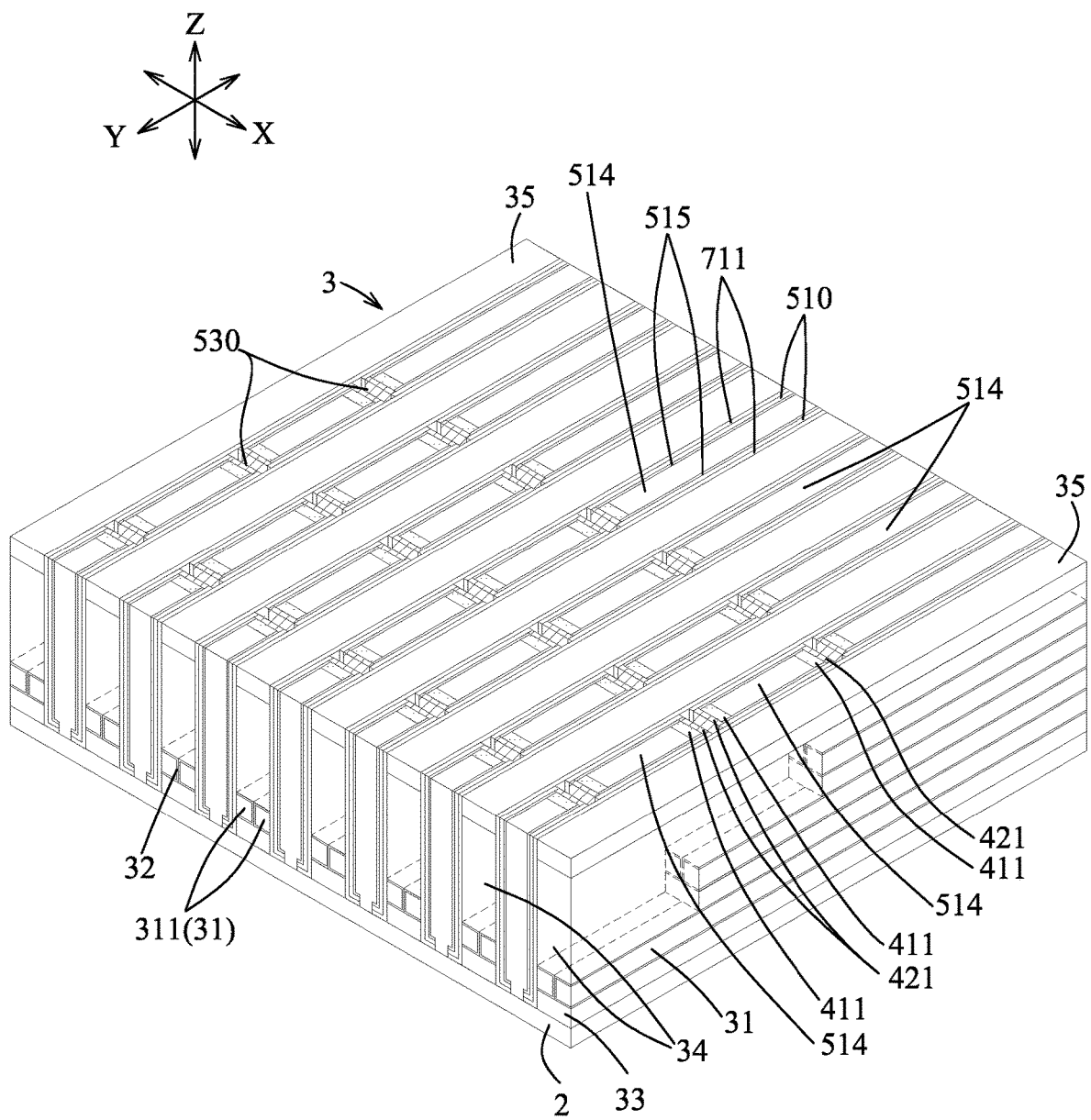
Figure 19D:
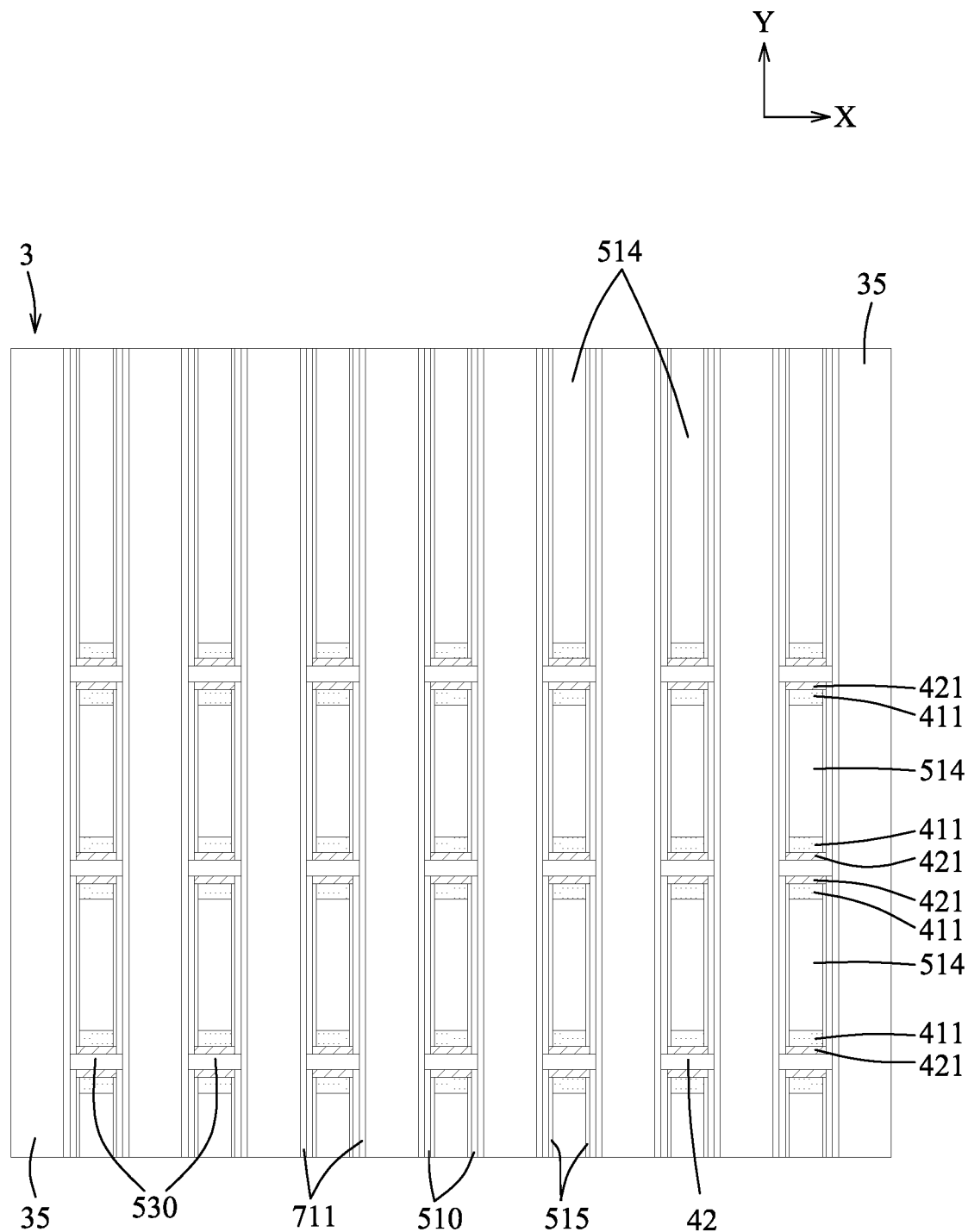
Figure 20A:
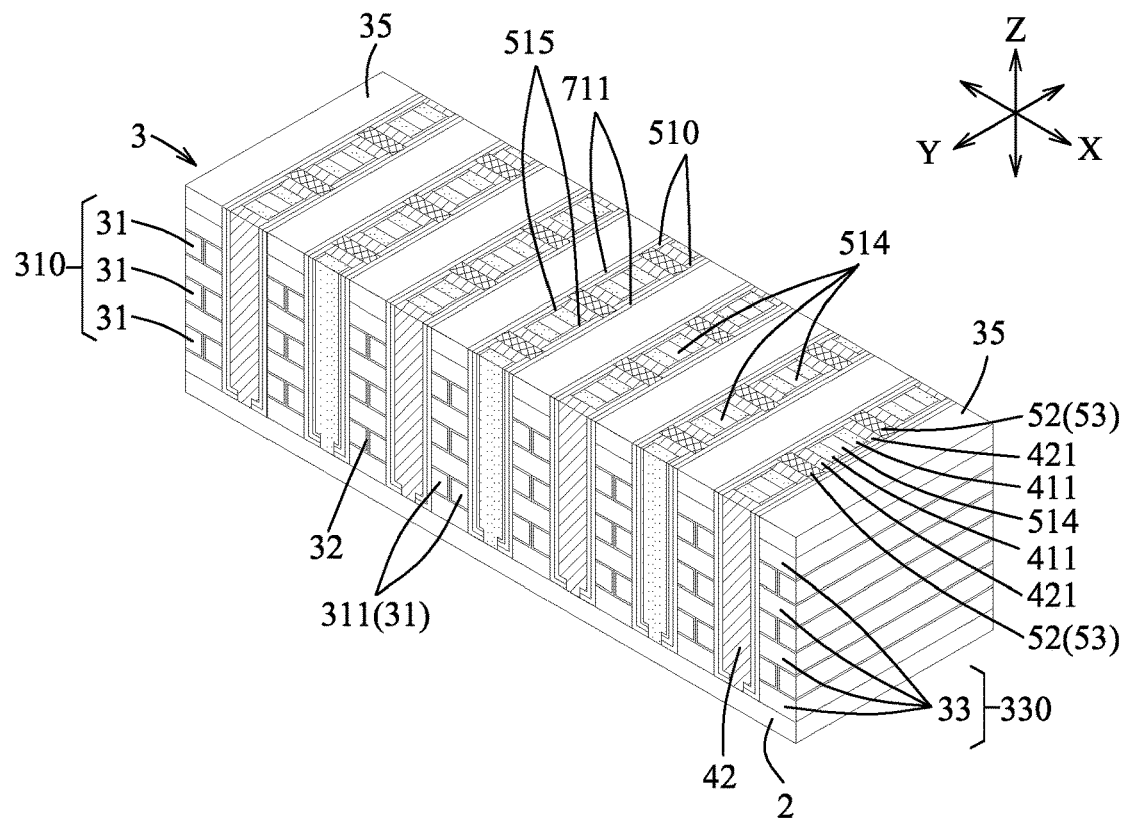
Figure 20B:
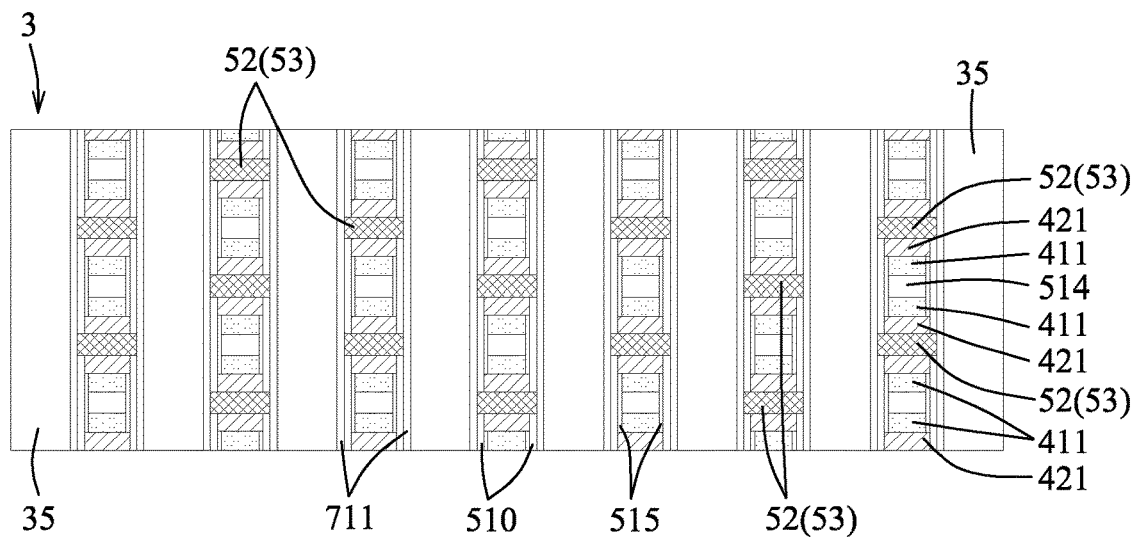
Figure 20C:
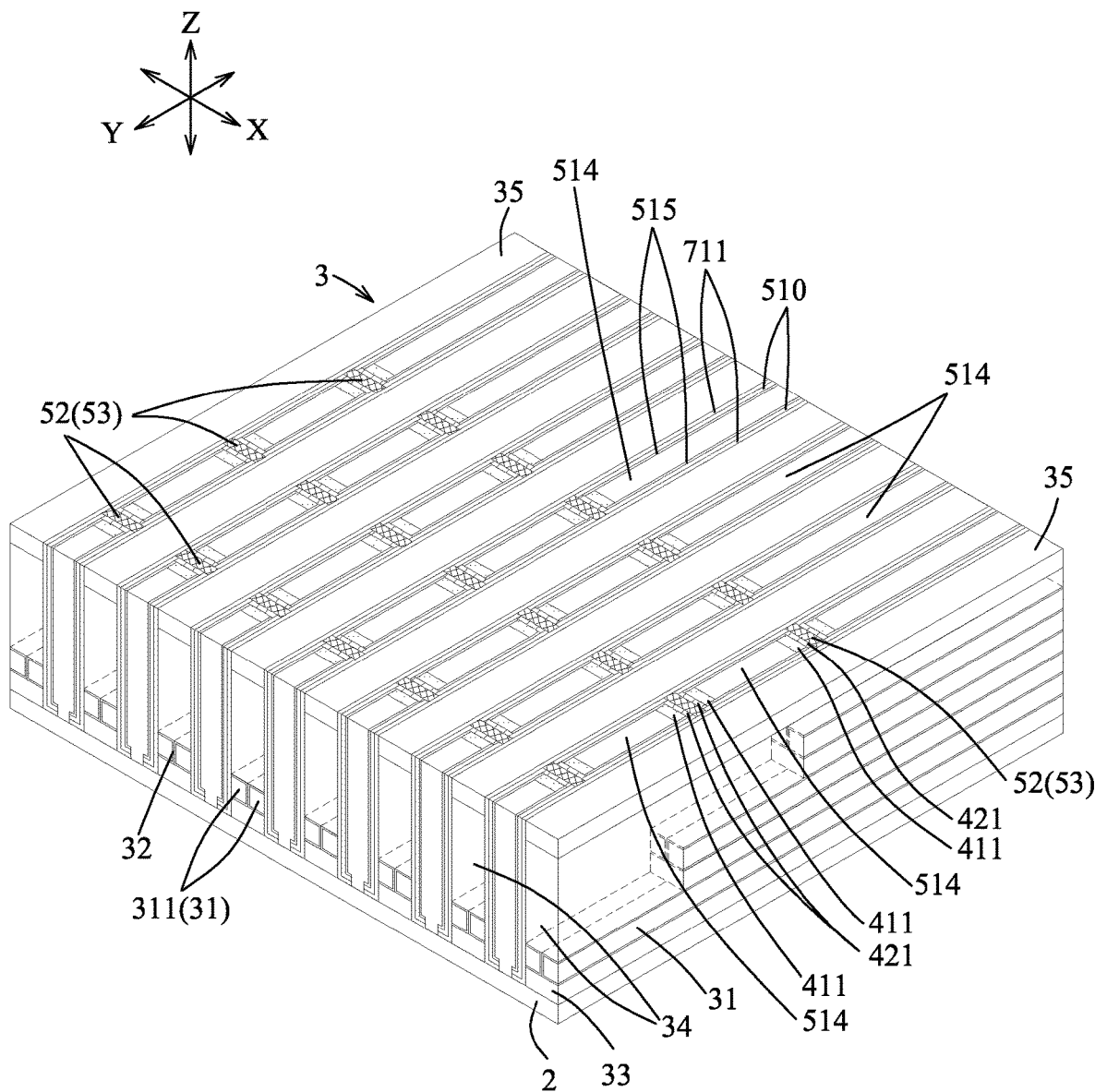
Figure 20D:
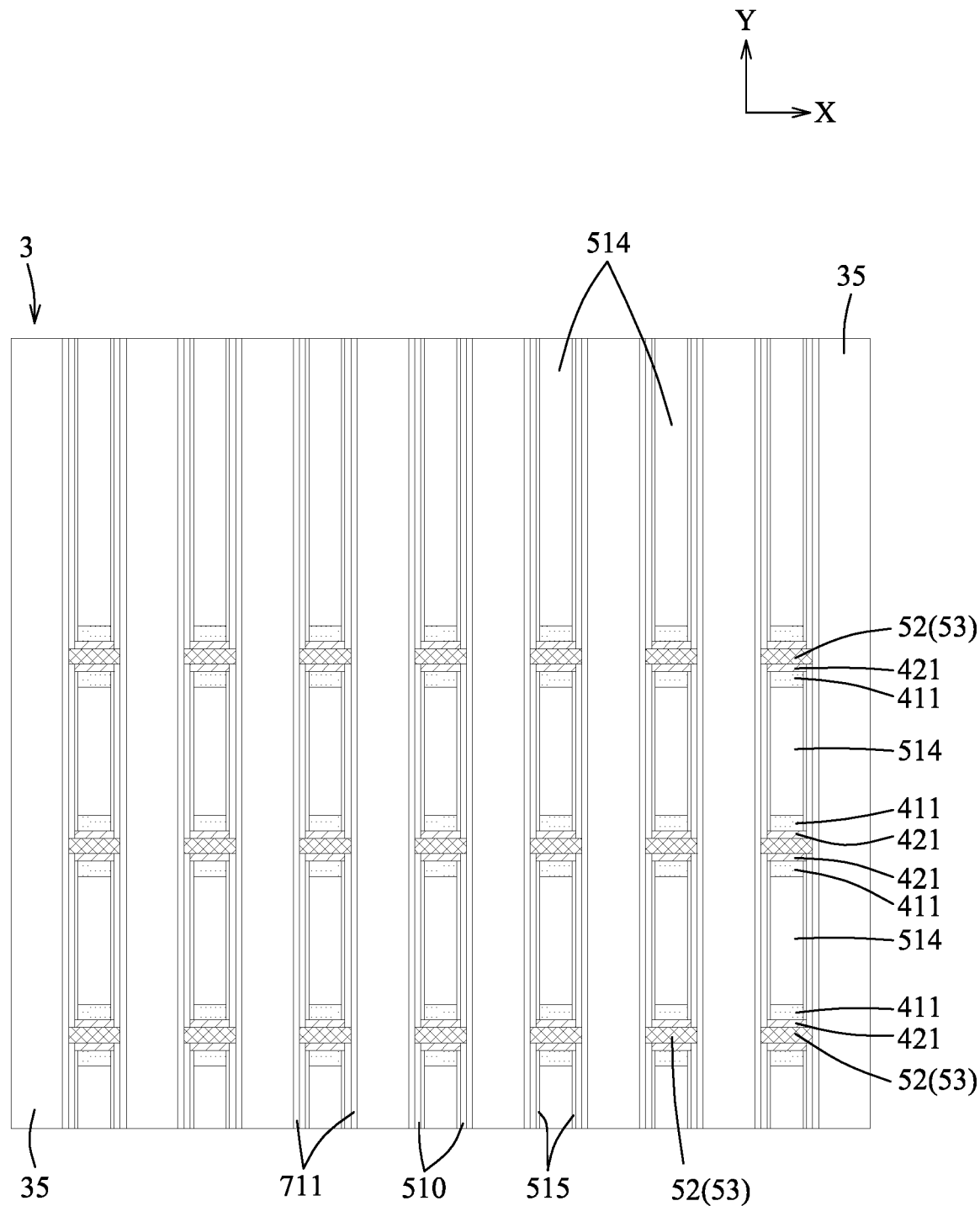
Figure 21A:
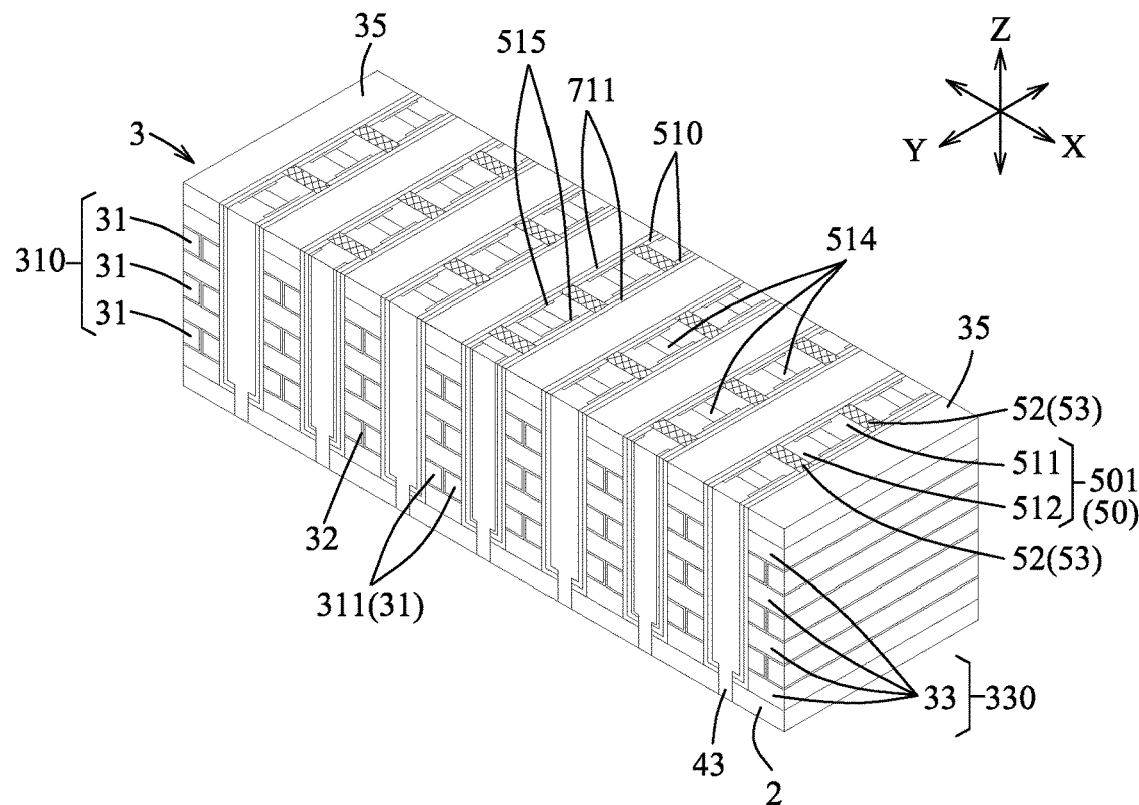
Figure 21B:
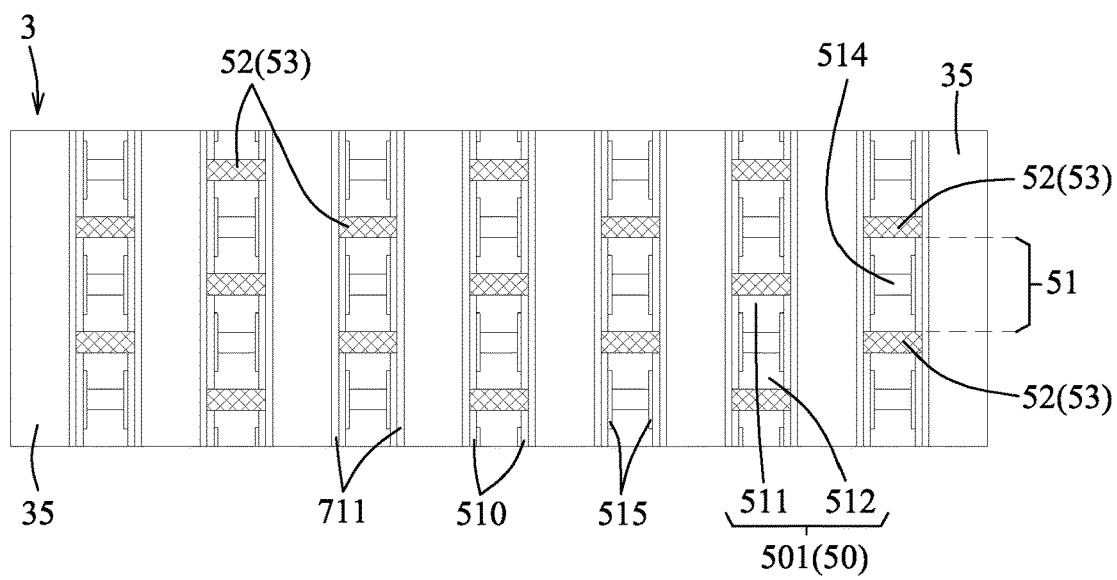
Figure 21C:
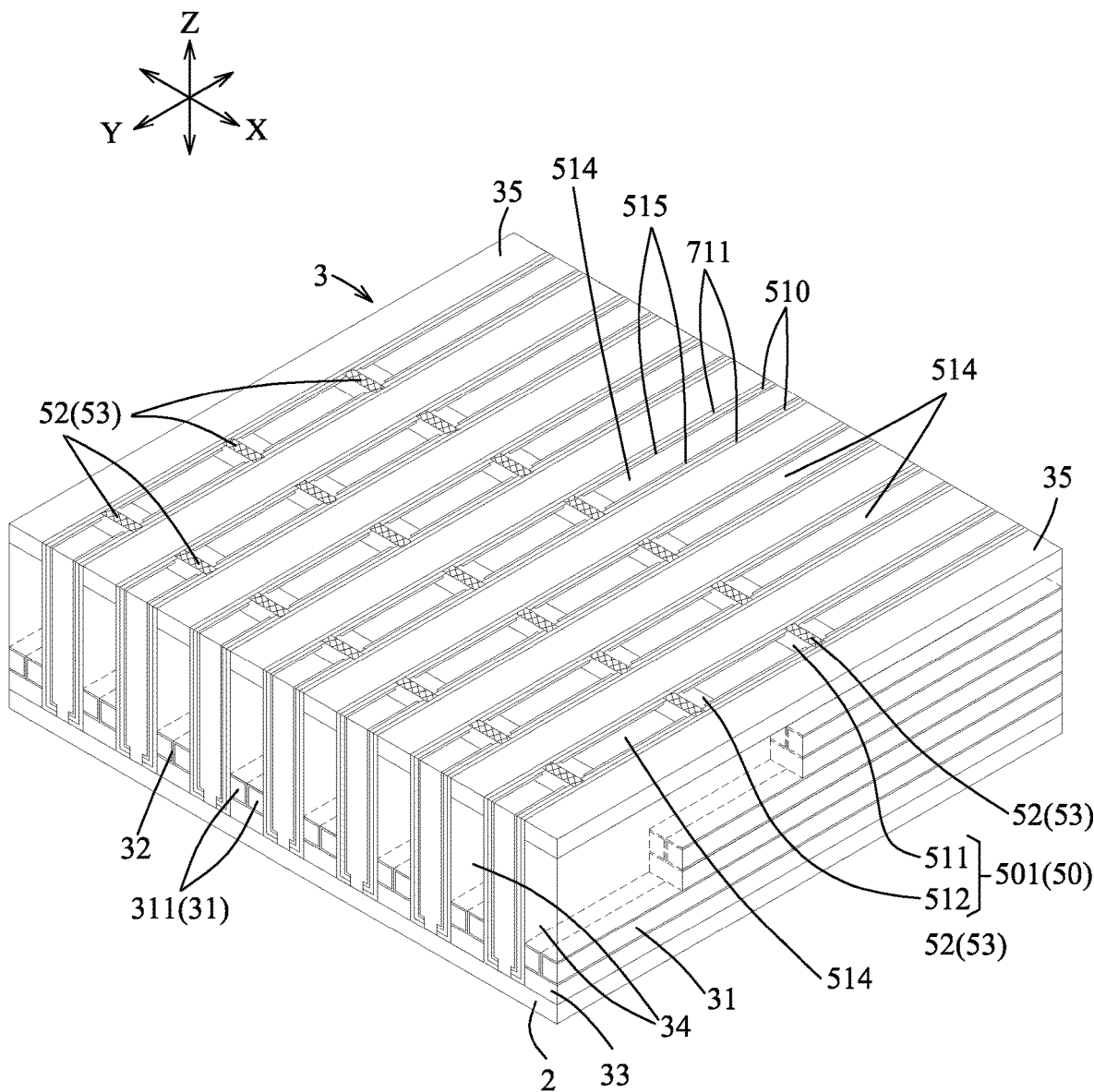
Figure 21D:
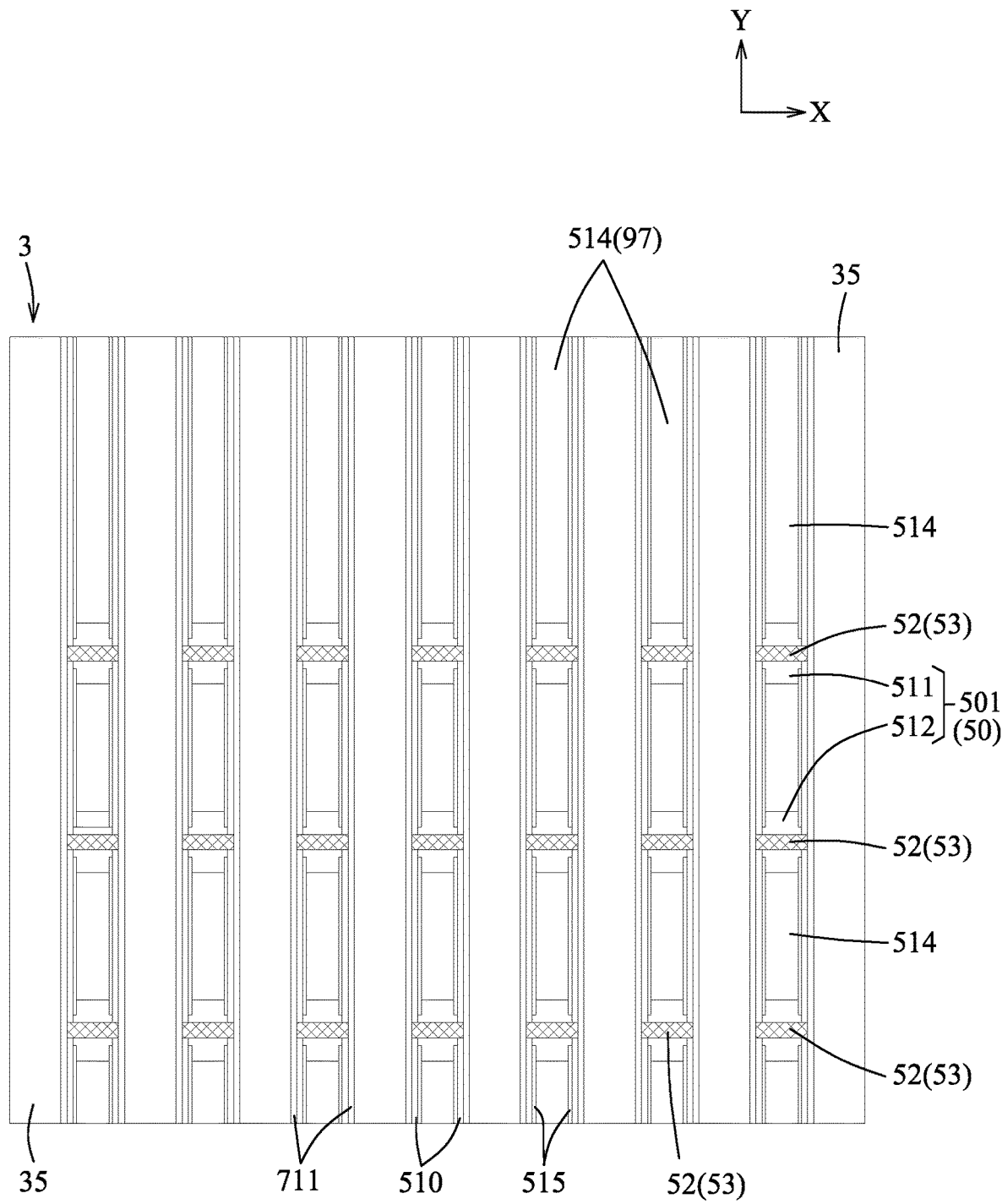

Referring to FIG. 1D and the examples illustrated in FIGS. 13A, 13B, 13C, and 13D, the method 100 proceeds to step 111, where the third filling material 97 is patterned to form a plurality of the isolation portions 514 (see also FIGS. 1A to 1C) which are disposed between and which contact the high-k dielectric segments 731 in each of first and second trenches 81, 82 (see also FIGS. 11A to 11C). Two adjacent ones of the isolation portions 514 in the corresponding one of the first and second trenches 81, 82 are spaced apart from each other in the Y direction. FIGS. 13A and 13C are respectively similar to FIGS. 12A and 12C but illustrating the structure after step 111 in accordance with some embodiments. FIGS. 13B and 13D are respectively top views of FIGS. 13A and 13C in accordance with some embodiments.

In some embodiments, the isolation portions 514 formed in the first trenches 81 are staggered from and are not in alignment with the isolation portions 514 formed in the second trenches 82 in the X direction. The isolation portions 514 may have a thickness that is along the Y direction and that ranges from about 10 nm to about 1000 nm, and a length that is along the X direction and that ranges from about 50 nm to about 5000 nm. The third filling material 97 may be patterned through a patterned mask by a suitable etching technique, for example, but not limited to, wet etching, dry etching, or a combination thereof. Other suitable techniques for patterning the third filling material 97 are within the contemplated scope of the disclosure.

Referring to FIG. 1D and the examples illustrated in FIGS. 14A, 14B, 14C, and 14D, the method 100 proceeds to step 112, where a first sacrificial material 41 is filled in recesses 410 defined by the isolation portions 514 and the high-k dielectric segments 731 shown in FIGS. 13A to 13D. FIGS. 14A to 14D are respectively similar to FIGS. 13A to 13D but illustrating the structure after step 112 in accordance with some embodiments.

In some embodiments, the first sacrificial material 41 may be filled in the recesses 410 using a suitable deposition technique such as CVD, PVD, PECVD, or the like, or combinations thereof. Other suitable techniques for filling the first sacrificial material 41 in the recesses 410 are within the contemplated scope of the disclosure. After filling the first sacrificial material 41, the first sacrificial material 41 is planarized by a planarization technique, such as CMP, to remove an excess of the first sacrificial material 41, thereby exposing the hard mask films 35. The first sacrificial material 41 may be the same as or similar to a material used for making the sacrificial layers 66 of the stack assembly 6 as described above, but not limited thereto, and is different from the material of the isolation portions 514.

Referring to FIG. 1E and the examples illustrated in FIGS. 15A, 15B, 15C, and 15D, the method 100 proceeds to step 113, where the first sacrificial material 41 shown in FIGS. 14A to 14D is patterned such that the first sacrificial material 41 forms into a plurality pairs of first sacrificial portions 411, each pair of which are respectively disposed in contact with two opposite sides of a corresponding one of the isolation portions 514 along the Y direction. FIGS. 14A to 14D are respectively similar to FIGS. 13A to 13D but illustrating the structure after step 113 in accordance with some embodiments.

In some embodiments, each pair of the first sacrificial portions 411 and a corresponding one of the isolation portions 514 together define a distance (D1) that is along the Y direction and that ranges from about 10 nm to about 1000 nm. The first sacrificial portions 411 are spaced apart from each other along the Y direction in a corresponding one of the first and second trenches 81, 82 (see FIGS. 11A to 11C). The first sacrificial material 41 may be patterned by a suitable etching technique, such as dry etching, but not limited thereto. Other suitable techniques for patterning the first sacrificial material 41 are within contemplated scope of the disclosure.

Referring to FIG. 1E and the examples illustrated in FIGS. 16A, 16B, 16C, and 16D, the method 100 proceeds to step 114, where the high-k dielectric segments 731 shown in FIGS. 15A to 15D are patterned to form into a plurality of the high-k dielectric portions 515 and to partially expose the channel segments 721. FIGS. 16A to 16D are respectively similar to FIGS. 15A to 15D but illustrating the structure after step 114 in accordance with some embodiments.

In some embodiments, the high-k dielectric segments 731 exposed from the first sacrificial portions 411 and the isolation portions 514 are etched to form the high-k dielectric portions 515 which are spaced apart from each other. Each of the high-k dielectric portions 515 has a length that is along the Y direction and that is substantially the same as the distance (D1). The high-k dielectric segments 731 may be patterned by a suitable etching technique such as dry etching, but not limited thereto. Other suitable techniques for patterning the high-k dielectric segments 731 are within the contemplated scope of the disclosure.

Referring to FIG. 1E and the examples illustrated in FIGS. 17A, 17B, 17C, and 17D, the method 100 proceeds to step 115, where a second sacrificial material 42 is filled in recesses 420 defined by the first sacrificial portions 411, the high-k dielectric portions 515, and the channel segments 721 (see also FIGS. 16A to 16D). FIGS. 17A to 17D are respectively similar to FIGS. 16A to 16D but illustrating the structure after step 115 in accordance with some embodiments.

In some embodiments, the second sacrificial material 42 may be filled in the recesses 420 using a suitable deposition technique such as CVD, PVD, PECVD, or the like, or combinations thereof. Other suitable techniques for filling the second sacrificial material 42 in the recesses 420 are within the contemplated scope of the disclosure. After filling the second sacrificial material 42, the second sacrificial material 42 is planarized by a planarization technique, such as CMP, to remove an excess of the second sacrificial material 42 to thereby expose the hard mask films 35. The second sacrificial material 42 may be the same as or similar to the first sacrificial material 41 as described above, but not limited thereto.

Referring to FIG. 1E and the examples illustrated in FIGS. 18A, 18B, 18C, and 18D, the method 100 proceeds to step 116, where the second sacrificial material 42 is patterned such that the second sacrificial material 42 forms into a plurality pairs of second sacrificial portions 421, each pair of which are disposed in contact respectively with a corresponding pair of the first sacrificial portions 411 along the Y direction. In other words, each pair of the second sacrificial portions 421 are disposed to sandwich a corresponding pair of the first sacrificial portions 411 and a corresponding one of the isolation portions 514 in the Y direction. FIGS. 18A to 18D are respectively similar to FIGS. 17A to 17D but illustrating the structure after step 116 in accordance with some embodiments.

In some embodiments, each pair of the second sacrificial portions 421, a corresponding pair of the first sacrificial portions 411 and a corresponding one of the isolation portions 514 together define a distance (D2) that is along the Y direction and that ranges from about 50 nm to about 5000 nm. The second sacrificial material 42 may be patterned by a suitable etching technique, such as dry etching, but not limited thereto. Other suitable techniques for patterning the second sacrificial material 42 are within contemplated scope of the disclosure.

Referring to FIG. 1E and the examples illustrated in FIGS. 19A, 19B, 19C, and 19D, the method 100 proceeds to step 117, where the channel segments 721 shown in FIGS. 18A to 18D are patterned to form into a plurality of the channel portions 510 (see also FIGS. 1A and 1C) and to partially expose the memory segments 711. FIGS. 19A to 19D are respectively similar to FIGS. 18A to 18D but illustrating the structure after step 117 in accordance with some embodiments.

In some embodiments, each of the channel segments 721 exposed from the first and second sacrificial portions 411, 421 and the isolation portions 514 is etched to form a plurality of the channel portions 510 which are spaced apart from each other in the Y direction. Each of the channel portions 510 has a length that is along the Y direction and that is substantially the same as the distance (D2). The channel segments 721 may be patterned by a suitable etching technique such as dry etching and reactive-ion etching (RIE), but not limited thereto. Other suitable techniques for patterning the channel segments 721 are within the contemplated scope of the disclosure.

In some embodiments, in step 117, each of the channel segments 721 is patterned to expose a plurality of exposed regions on a respective one of the memory segments 711.

Referring to FIG. 1E and the example illustrated in FIGS. 20A, 20B, 20C, and 20D, the method 100 proceeds to step 118, where a dielectric material 53 is filled in recesses 530 defined by the second sacrificial portions 421, the channel portions 510, and the memory segments 711 (see also FIGS. 19A to 19D) so as to form a plurality of the separators 52. FIGS. 20A to 20D are respectively similar to FIGS. 19A to 19D but illustrating the structure after step 118 in accordance with some embodiments.

In some embodiments, each of the separators 52 in a corresponding one of the first and second trenches 81, 82 (see FIGS. 11A to 11C) is disposed to connect one of the exposed regions on one of the memory segments 711 with a corresponding one of the exposed regions on the other one of the memory segments 711. The dielectric material 53 may be filled in the recesses 530 using a suitable fabrication technique such as CVD, PVD, PECVD, or the like, or combinations thereof. Other suitable techniques for forming the separators 52 are within the contemplated scope of the disclosure. After filling the dielectric material 53 in the recesses 530, the dielectric material 53 is planarized by a planarization technique, such as CMP, to remove an excess of the dielectric material 53, so as to expose the hard mask films 35. The dielectric material 53 may be the same as or similar to a material used for forming the dielectric layers 63 of the stack assembly 6 as described above, but not limited thereto. Other materials suitable for separators 52 are within the contemplated scope of the disclosure.

Referring to FIG. 1E and the examples illustrated in FIGS. 21A, 21B, 21C, and 21D, the method 100 proceeds to step 119, where the first sacrificial portions 411 and the second sacrificial portions 421 shown in FIGS. 20A to 20D are removed to be replaced with a conductive material 50. FIGS. 21A to 21D are respectively similar to FIGS. 20A to 20D but illustrating the structure after step 119 in accordance with some embodiments.

In some embodiments, after the first and second sacrificial portions 411, 421 are removed, portions of the underlying substrate 2 underlying the first and second sacrificial portions 411, 421 are also removed so as to form through holes 43 in the underlying substrate 2. The first sacrificial portions 411, the second sacrificial portions 421, and the portions of the underlying substrate 2 are removed by a suitable etching technique, such as dry etching and RIE, but not limited thereto. Other suitable techniques for removing the first sacrificial portions 411, the second sacrificial portions 421, and the portions of the underlying substrate 2 are within the contemplated scope of the disclosure. Thereafter, the conductive material 50 is filled into recesses which were previously occupied by the first sacrificial portions 411 and the second sacrificial portions 421, and the filling of the conductive material 50 may be performed using a suitable deposition technique such as CVD, PECVD, or the like, but not limited thereto. Other suitable techniques for filling the conductive material 50 are within the contemplated scope of the present disclosure. The conductive material 50 may be the same as or similar to a material used for forming the first and second conductive layers 91, 92 as described above, and the details of the possible materials for the conductive material 50 are omitted for the sake of brevity. After filling the conductive material 50, the conductive material 50 is planarized by a planarization process, such as CMP, to remove an excess of the conductive material 50 and to form a plurality of conductive pillars 501 in the first and second trenches 81, 82, so as to expose the hard mask films 35. Other suitable processes for planarizing the conductive material 50 are within the contemplated scope of the disclosure. The conductive pillars 501 include the first conductive pillars 511 and the second conductive pillars 512 (see also FIGS. 1A to 1C), each of which is disposed between the conductive films 31 of two adjacent corresponding ones of the stack units 3. Accordingly, an embodiment of the semiconductor device 200 (see also FIGS. 1A to 1C) of the present disclosure is obtained.

Figure 22A:
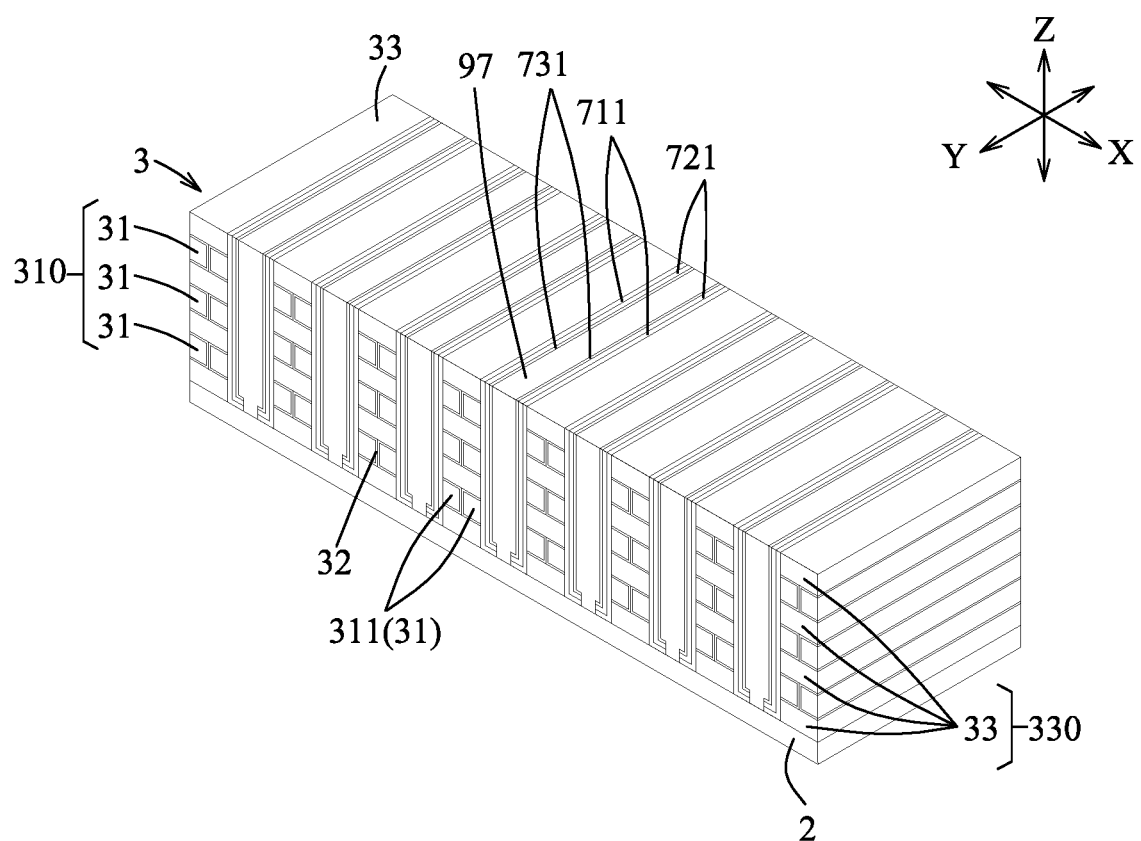
FIGS. 22A and 22B are schematic views illustrating an intermediate stage of a method for manufacturing a semiconductor device in accordance with some embodiments.
Figure 22B:
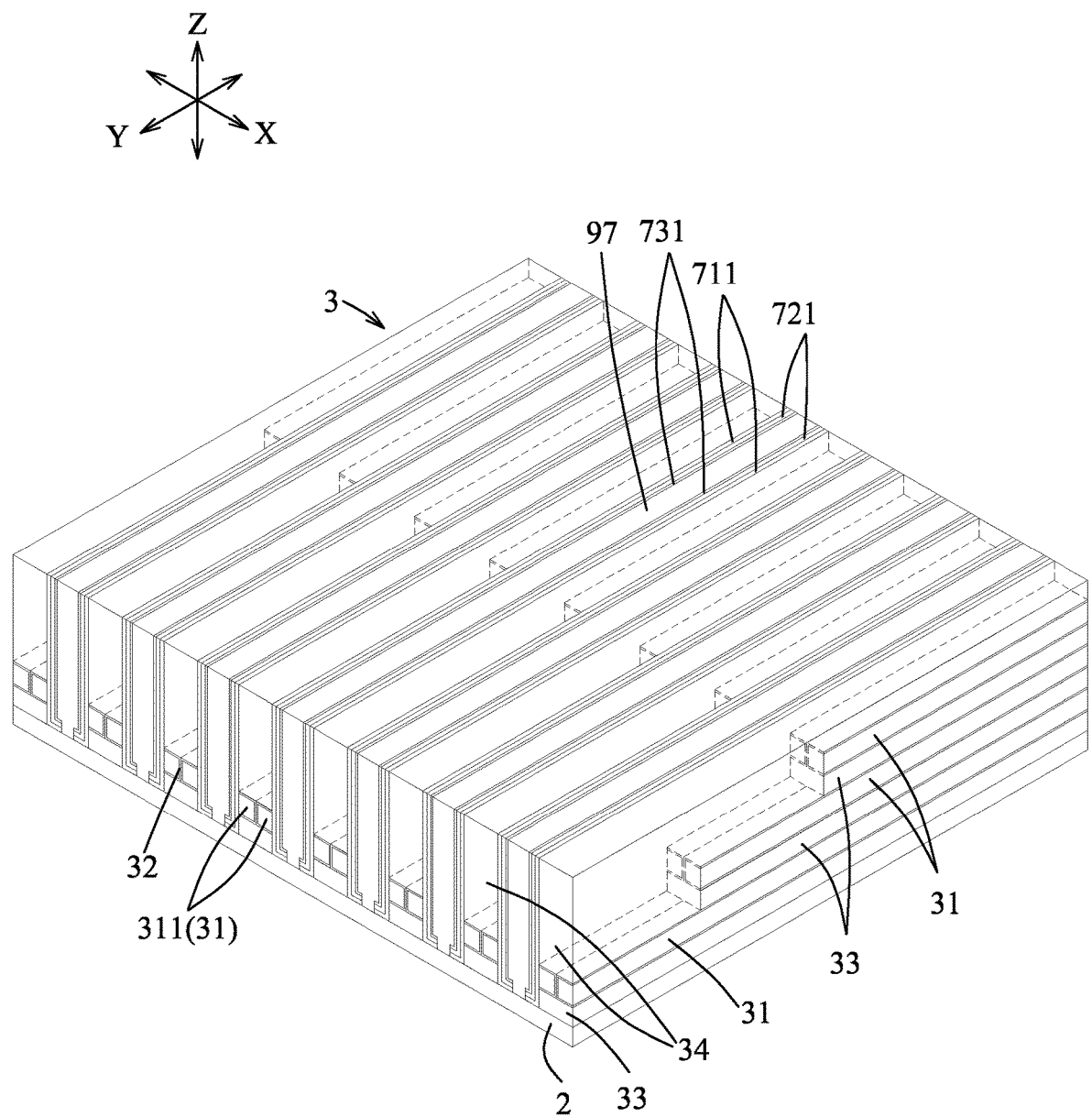
Figure 23:
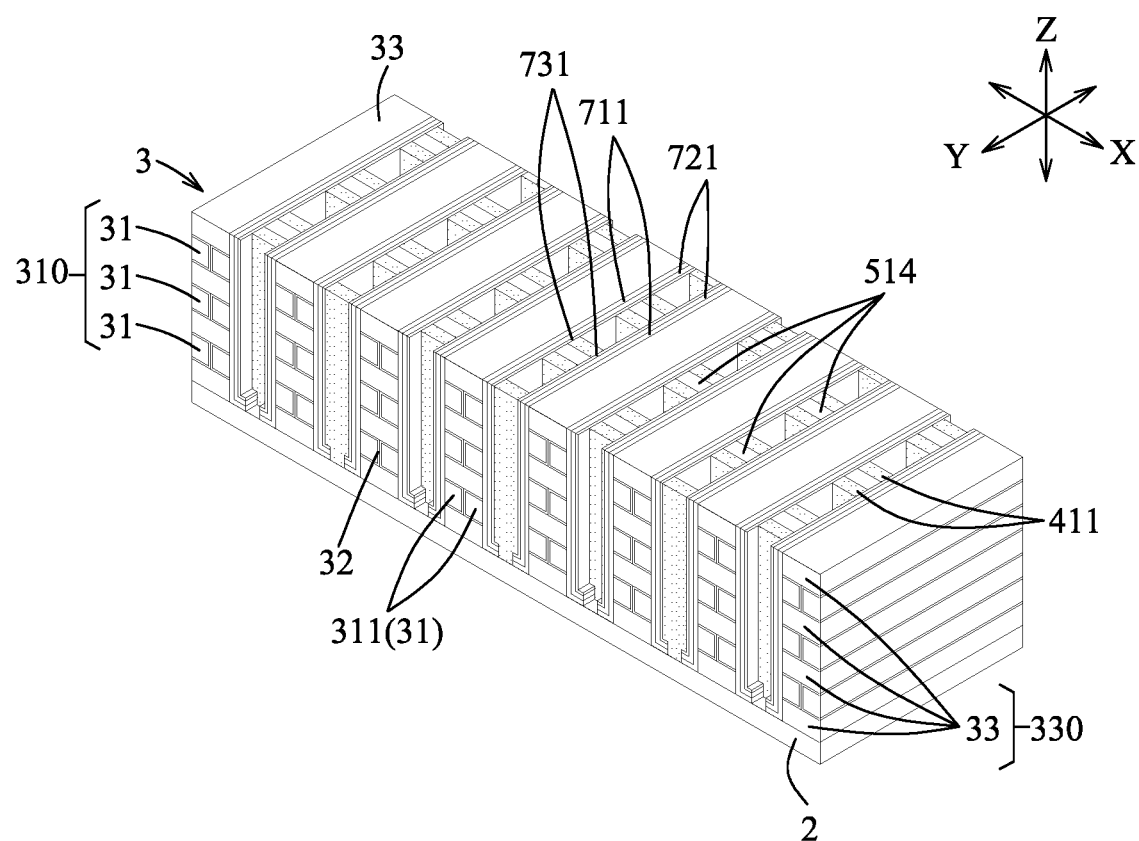
FIG. 23 is a schematic view illustrating an intermediate stage of a method for manufacturing a semiconductor device in accordance with some embodiments.

FIGS. 1D, 1E, and 2 through 21 illustrate the method 100 for making the semiconductor device 200 in accordance with some embodiments. However, other methods and other configurations are also possible. In some embodiments, some steps in the method 100 may be modified, replaced, or eliminated without departure from the spirit and scope of the present disclosure. In alternative embodiments, other suitable methods may also be applied for forming the semiconductor device 200. For example, in some embodiments, the hard mask film 35 may be removed after the first and second filling materials 95, 96 are removed (i.e., after step 108), and the planarization techniques are performed after step 108 to expose the uppermost one of the dielectric films 33 of each of the stack units 3. In certain embodiments, the hard mask film 35 of each of the stack units 3 may be removed after the third filling material 97 is filled in the first and second trenches 81, 82 (see FIGS. 22A and 22B) (i.e., the hard mask films 35 are removed after step 110), and the planarization techniques are performed after step 110 to expose the uppermost one of the dielectric films 33 of each of the stack units 3. In some other embodiments, the hard mask film 35 of each of the stack units 3 may be removed after the first sacrificial material 41 is patterned (see FIG. 23) (i.e., the hard mask films 35 are removed after step 113), and the planarization techniques are performed after step 113 to expose the uppermost one of the dielectric films 33 of each of the stack units 3. The hard mask film 35 may be removed using a planarization technique, such as CMP, but not limited thereto. Other techniques for removing the hard mask film 35 are within the contemplated scope of the disclosure. In some alternative embodiments, the hard mask films 35 may be formed before removal of the first and second filling materials 95, 96.

Figure 24:
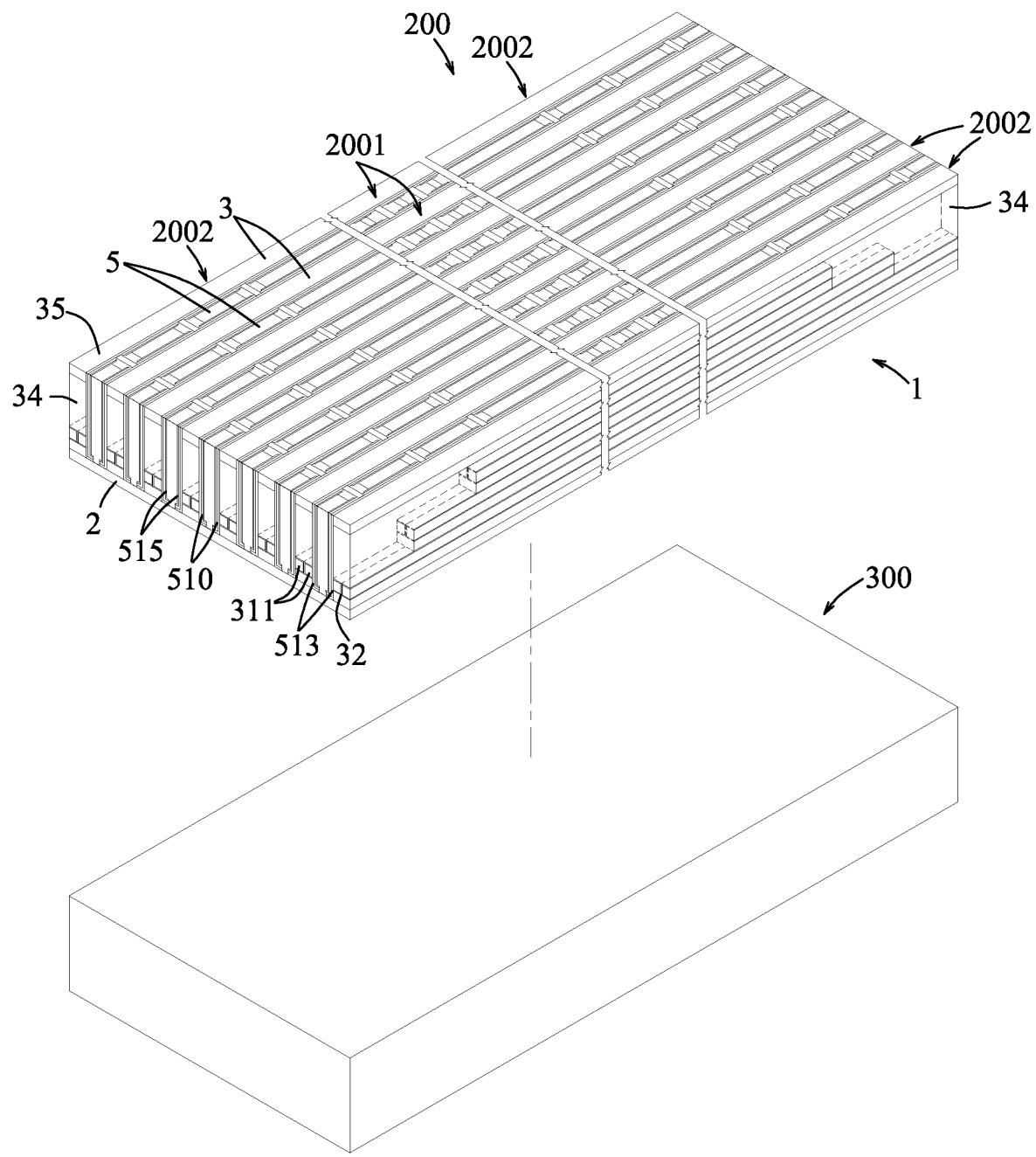
FIG. 24 is a schematic view illustrating a semiconductor device in accordance with some embodiments.

FIG. 24 is a perspective view of the semiconductor device 200 in accordance with some embodiments. The semiconductor device shown in FIG. 24 is similar to that of FIG. 1A but is formed over a substrate 300. Referring to FIG. 24, the semiconductor device 200 may further be formed to connect with the substrate 300. In some embodiments, the substrate 300 may include a semiconductor substrate (not shown). The semiconductor substrate may be, for example, but not limited to, a silicon-on-insulator (SOI) substrate, a germanium-on-insulator (GOI) substrate, a bulk semiconductor substrate, or the like, and may be doped with a dopant. The substrate 300 may have multiple layers. The substrate 300 may include elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. Other materials suitable for the substrate 300 are within the contemplated scope of the disclosure. In certain embodiments, the substrate 300 may further include a circuitry (not shown). The circuitry may be, for example, but not limited to, a CMOS circuitry. Other suitable circuitries are within the contemplated scope of the disclosure.

Dimensions of each of the components of the disclosure, such as the thickness of the isolation portions 514 and the length of the channel portions 510 along the Y direction, may be altered according to requirements, which may affect a contact resistance of the first and second conductive pillars 511, 512 (i.e., the source lines and the bit lines) to the channel portions 510 of the semiconductor device 200.

In this disclosure, the hard mask films of the stack units can provide protection to the IMD portions and the uppermost ones of the dielectric films of the stack units against removal-related processes (e.g., etching processes) during the manufacturing of the semiconductor device. Moreover, since the IMD portions of the stack units are not removed during the removal-related processes due to protection offered by the hard mask films, the remaining ones of the dielectric films of the stack units can further be preserved by the IMD portions. Since the IMD portions and the dielectric films are well-preserved, the structure of the stack units of the semiconductor device of the disclosure can thereby be strengthened and stabilized for follow-up manufacturing processes. Therefore, the hard mask films can enhance the stability of the semiconductor device of the disclosure in that the IMD portions can shield the dielectric films of the stack units and that the hard mask films protect the uppermost ones of the dielectric films of the stack units.

In accordance with some embodiments of the present disclosure, a semiconductor device includes an underlying substrate, two stack units disposed over the underlying substrate, and a feature disposed between the stack units. The two stack units are spaced apart from each other. Each of the stack units includes a plurality of conductive films and a plurality of dielectric films disposed to alternate with the conductive films, an inter-metal dielectric (IMD) portion, and a hard mask film. An uppermost one of the dielectric films is disposed over the conductive films, and has a dimension smaller than those of the conductive films and those of remaining ones of the dielectric films. Each of the conductive films and the remaining ones of the dielectric films has a first portion disposed beneath the uppermost one of the dielectric films, and a second portion extending beyond the uppermost one of the dielectric films. The second portions of the conductive films and the remaining ones of the dielectric films together constitute a staircase portion. The IMD portion is disposed on the staircase portion. The hard mask film is disposed to cover the IMD portion and the uppermost one of the dielectric films, and is made of a material different from those of the IMD portion and the dielectric films. The feature is disposed between the stack units, and includes a plurality of repeating units and a plurality of separators which are disposed to alternate with the repeating units.

In accordance with some embodiments of the present disclosure, each of the repeating units includes two memory portions, two channel portions disposed respectively on the memory portions, a first conductive pillar, a second conductive pillar, and an isolation portion. Each of the two memory portions is in contact with the conductive films of a respective one of the stack units. Each of the first conductive pillar and the second conductive pillar is in contact with the two channel portions. The isolation portion is disposed between the channel portions to separate the first conductive pillar from the second conductive pillar.

In accordance with some embodiments of the present disclosure, each of the channel portions has a first lateral region, a second lateral region and a central region between the first and second lateral regions, and each of the repeating units further includes two high-k dielectric portions. Each of the two high-k dielectric portions is disposed on the central region of a respective one of the channel portions to permit the isolation portion to be disposed between the central regions of the channel portions. Each of the high-k dielectric portions has a first side region and a second side region which are disposed at two opposite sides of the isolation portion.

In accordance with some embodiments of the present disclosure, first conductive pillar includes a first main portion interconnecting the first lateral regions of the channel portions, and a first extended portion interconnecting the first side regions of the high-k dielectric portions. The second conductive pillar includes a second main portion interconnecting the second lateral regions of the channel portions, and a second extended portion interconnecting the second side regions of the high-k dielectric portions.

In accordance with some embodiments of the present disclosure, the semiconductor device includes a plurality of thin film transistors. Each of the conductive films serves as a word line, and the first and second conductive pillars serve as a bit line and a source line, respectively. The word line has a plurality of word line portions, each of which serves as a gate electrode of a corresponding one of the thin film transistors. The source line has a plurality of source line portions, each of which serves as a first source/drain electrode of a corresponding one of the thin film transistors. The bit line has a plurality of bit line portions, each of which serves as a second source/drain electrode of a corresponding one of the thin film transistors.

In accordance with some embodiments of the present disclosure, each of the conductive films has two conductive regions which are bonded to each other through a glue portion.

In accordance with some embodiments of the present disclosure, a distal one of the dielectric films has a dimension smaller than that of a proximate one of the dielectric films relative to the underlying substrate, and a distal one of the conductive films has a dimension smaller than that of a proximate one of the conductive films relative to the underlying substrate.

In accordance with some embodiments of the present disclosure, in each of the stack units, an upper one of the conductive films and a next lower one of the dielectric films have the same length.

In accordance with some embodiments of the present disclosure, a method for manufacturing a semiconductor device includes: forming a stack assembly over an underlying substrate, the stack assembly including a plurality of dielectric layers and a plurality of sacrificial layers which are disposed to alternate with the dielectric layers, the dielectric layers and the sacrificial layers being configured to permit the stack assembly to have a main structure and a staircase structure; forming an inter-metal dielectric (IMD) layer over the staircase structure; forming a hard mask layer to cover the IMD layer and the main structure, the hard mask layer being made of a material different from those of the IMD layer, the dielectric layers, and the sacrificial layers; first patterning the hard mask layer, the IMD layer, and the stack assembly to form first trenches such that each of the sacrificial layers is divided into sacrificial segments by the first trenches; first replacing end portions of each of the sacrificial segments with first conductive regions through the first trenches; second patterning the hard mask layer, the IMD layer, and the stack assembly to form second trenches such that a remaining portion of each of the sacrificial segments is divided into sacrificial regions by a corresponding one of the second trenches; and second replacing the sacrificial regions with second conductive regions through the second trenches.

In accordance with some embodiments of the present disclosure, the first replacing is performed by removing the end portions of each of the sacrificial segments through the first trenches so as to form first cavities in the first trenches, forming a first conductive layer in the first cavities and on inner surfaces of the first trenches so as to form the first conductive regions in the first cavities, thereby replacing the end portions of each of the sacrificial segments with the first conductive regions, and filling a first filling material in the first trenches over the first conductive layer.

In accordance with some embodiments of the present disclosure, the second replacing is performed by removing the sacrificial regions through the second trenches so as to form second cavities in the second trenches, forming a second conductive layer in the second cavities and on inner surfaces of the second trenches so as to form the second conductive regions in the second cavities, thereby replacing the sacrificial regions with the second conductive regions, and filling a second filling material in the second trenches over the second conductive layer.

In accordance with some embodiments of the present disclosure, the method further includes: removing the first and second filling materials; etching back the first conductive layer to leave the first conductive regions in the first cavities; and etching back the second conductive layer to leave the second conductive regions in the second cavities.

In accordance with some embodiments of the present disclosure, the method further includes removing the patterned hard mask layer after removal of the first and second filling materials.

In accordance with some embodiments of the present disclosure, after the first patterning and the second patterning, the dielectric layers are divided by the first and second trenches into a plurality of dielectric portions each including a plurality of dielectric films, the hard mask layer is divided by the first and second trenches into a plurality of hard mask films which are respectively disposed on the dielectric portions, and the IMD layer is divided by the first and second trenches into a plurality of IMD portions. After the etching back of the first and second conductive layers, a plurality of conductive portions are formed. Each of the conductive portions includes a plurality of conductive films disposed to alternate with the dielectric films of a respective one of the dielectric portions, thereby obtaining a plurality of stack units each including a respective one of the hard mask films, a respective one of the IMD portions, a respective one of the conductive portions, and a respective one of the dielectric portions. After the etching back of the first and second conductive layers, the first and second trenches are located to alternate with the stack units. Each of the conductive films includes one of the first conductive regions and a respective one of the second conductive regions.

In accordance with some embodiments of the present disclosure, the method further includes: forming a memory layer having two memory segments in each of the first and second trenches, the two memory segments being disposed respectively on two adjacent ones of the stack units which are separated by a corresponding one of the first and second trenches; forming a channel layer over the memory layer, the channel layer having two channel segments disposed respectively on the memory segments in each of the first and second trenches; forming a high-k dielectric layer over the channel layer, the high-k dielectric layer having two high-k dielectric segments disposed respectively on the channel segments in each of the first and second trenches; forming a plurality of isolation portions in each of the first and second trenches, each of the isolation portions being disposed between the high-k dielectric segments in a corresponding one of the first and second trenches, two adjacent ones of the isolation portions in the corresponding one of the first and second trenches being spaced apart from each other; patterning each of the high-k dielectric segments to form a plurality of high-k dielectric portions which are spaced from one another, each of the high-k dielectric portions having a first side region and a second side region at two opposite sides of a respective one of the isolation portions; patterning each of the channel segments to form a plurality of channel portions which are spaced apart from one another, and to expose a plurality of exposed regions on a respective one of the memory segments, each of the channel portions having a first lateral region and a second lateral region at two opposite sides of a respective one of the high-k dielectric portions; forming a plurality of separators in each of the first and second trenches, each of the separators in a corresponding one of the first and second trenches being disposed to connect one of the exposed regions on one of the memory segments with a corresponding one of the exposed regions on the other one of the memory segments; and forming a first conductive pillar and a second conductive pillar at two opposite sides of each of the isolation portions.

In accordance with some embodiments of the present disclosure, a method for manufacturing a semiconductor device includes: forming a stack assembly over an underlying substrate, the stack assembly including a plurality of dielectric layers and a plurality of sacrificial layers which are disposed to alternate with the dielectric layers, the dielectric layers and the sacrificial layers being configured to permit the stack assembly to have a main structure and a staircase structure; forming an inter-metal dielectric (IMD) layer over the staircase structure such that an upper surface of the IMD layer and an upper surface of the main structure together form a combined upper surface; first patterning the IMD layer and the stack assembly to form a plurality of first trenches such that each of the sacrificial layers is divided into sacrificial segments by the first trenches; removing end portions of each of the sacrificial segments through the first trenches so as to form first cavities in the first trenches; forming a first conductive layer in the first cavities and on inner surfaces of the first trenches; filling a first filling material in the first trenches over the first conductive layer; second patterning the IMD layer and the stack assembly to form a plurality of second trenches such that a remaining portion of each of the sacrificial segments is divided into two sacrificial regions by a corresponding one of the second trenches, after the first patterning and the second patterning, the combined upper surface being formed into a plurality of upper surface regions separated by the first and second trenches; removing the sacrificial regions through the second trenches to form second cavities in the second trenches; forming a second conductive layer in the second cavities and on inner surfaces of the second trenches; filling a second filling material in the second trenches over the second conductive layer; and forming a plurality of hard mask films respectively covering the upper surface regions, the hard mask films being made of a material different from those of the IMD layer and the dielectric layers.

In accordance with some embodiments of the present disclosure, after the first patterning and the second patterning, the dielectric layers are divided by the first and second trenches into a plurality of dielectric portions each including a plurality of dielectric films, and the IMD layer is divided by the first and second trenches into a plurality of IMD portions.

In accordance with some embodiments of the present disclosure, the method further includes: removing the first and second filling materials after forming the hard mask films; and etching back the first and second conductive layers to form a plurality of conductive portions each including a plurality of conductive films disposed to alternate with the dielectric films of a respective one of the dielectric portions, thereby obtaining a plurality of stack units each including a respective one of the hard mask films, a respective one of the IMD portions, a respective one of the conductive portions, and a respective one of the dielectric portions. The first and second trenches are disposed to alternate with the stack units.

In accordance with some embodiments of the present disclosure, the method further includes forming a memory layer over the stack units to cover the hard mask films and inner surfaces of the first and second trenches; forming a channel layer on the memory layer; forming a high-k dielectric layer over the channel layer; and forming a filler layer over the high-k dielectric layer so as to fill the first and second trenches.

In accordance with some embodiments of the present disclosure, the method further includes partially removing the memory layer, the channel layer, the high-k dielectric layer, and the filler layer to expose the hard mask films; and removing the hard mask films to expose the upper surface regions.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a stack assembly over an underlying substrate, the stack assembly including dielectric layers and sacrificial layers which are disposed to alternate with the dielectric layers, the dielectric layers and the sacrificial layers being configured to permit the stack assembly to have a main structure and a staircase structure;
    forming an inter-metal dielectric (IMD) layer over the staircase structure;
    forming a hard mask layer to cover the IMD layer and the main structure, the hard mask layer being made of a material different from a material of the IMD layer, a material of the dielectric layers, and a material of the sacrificial layers;
    first patterning the hard mask layer, the IMD layer, and the stack assembly to form first trenches such that each of the sacrificial layers is divided into sacrificial segments by the first trenches;
    first replacing end portions of the sacrificial segments respectively with first conductive regions through the first trenches;
    second patterning the hard mask layer, the IMD layer, and the stack assembly to form second trenches such that remaining portions of the sacrificial segments are formed into sacrificial regions, two adjacent ones of the sacrificial regions being separated from each other by a corresponding one of the second trenches; and
    second replacing the sacrificial regions respectively with second conductive regions through the second trenches,
    wherein the first replacing is performed by
        removing the end portions of the sacrificial segments through the first trenches so as to form first cavities, and
        forming a first conductive layer in the first cavities and on inner surfaces of the first trenches so as to form the first conductive regions respectively in the first cavities, and wherein the second replacing is performed by
        removing the sacrificial regions through the second trenches so as to form second cavities, and
        forming a second conductive layer in the second cavities and on inner surfaces of the second trenches so as to form the second conductive regions respectively in the second cavities.

2. The method of claim 1, wherein the first replacing further includes filling a first filling material in the first trenches over the first conductive layer.

3. The method of claim 2, wherein the second replacing further includes
filling a second filling material in the second trenches over the second conductive layer.

4. The method of claim 3, further comprising:
removing the first filling material and the second filling material;
etching back the first conductive layer to leave the first conductive regions respectively in the first cavities; and
etching back the second conductive layer to leave the second conductive regions respectively in the second cavities.

5. The method of claim 4, further comprising removing the hard mask layer after removal of the first filling material and the second filling material.

6. The method of claim 3, wherein
after the first patterning and the second patterning,
the dielectric layers are divided by the first trenches and the second trenches into dielectric portions each including dielectric films,
the hard mask layer is divided by the first trenches and the second trenches into hard mask films which are respectively disposed on the dielectric portions, and
the IMD layer is divided by the first trenches and the second trenches into IMD portions,
after the etching back of the first conductive layer and the second conductive layer, conductive portions are formed, each of the conductive portions including conductive films disposed to alternate with the dielectric films of a respective one of the dielectric portions, thereby obtaining stack units each including a respective one of the hard mask films, a respective one of the IMD portions, a respective one of the conductive portions, and a respective one of the dielectric portions,
after the etching back of the first conductive layer and the second conductive layer, each of the stack units is disposed between an adjacent one of the first trenches and an adjacent one of the second trenches, and
each of the conductive films includes one of the first conductive regions and a respective one of the second conductive regions.

7. The method of claim 6, further comprising:
forming a memory layer in each of the first trenches and the second trenches, the memory layer having two memory segments disposed respectively on two adjacent ones of the stack units;
forming a channel layer over the memory layer, the channel layer having two channel segments disposed respectively on the two memory segments;
forming a high-k dielectric layer over the channel layer, the high-k dielectric layer having two high-k dielectric segments disposed respectively on the two channel segments;
forming isolation portions in each of the first trenches and the second trenches, each of the isolation portions disposed between the two high-k dielectric segments, two adjacent ones of the isolation portions being spaced apart from each other;
patterning each of the two high-k dielectric segments to form high-k dielectric portions which are spaced apart from one another, each of the high-k dielectric portions having a first side region and a second side region respectively located at two opposite sides of a respective one of the isolation portions;
patterning each of the two channel segments to form channel portions which are spaced apart from one another, and to expose portions of the two memory segments, each of the channel portions having a first lateral region and a second lateral region respectively at two opposite sides of a respective one of the high-k dielectric portions;
forming separators in each of the first trenches and the second trenches, each of the separators being disposed to connect the two memory segments; and
forming a first conductive pillar and a second conductive pillar respectively at the two opposite sides of each of the isolation portions.

8. A method for manufacturing a semiconductor device, comprising:
forming a stack assembly over an underlying substrate, the stack assembly including dielectric layers and sacrificial layers which are disposed to alternate with the dielectric layers, the dielectric layers and the sacrificial layers being configured to permit the stack assembly to have a main structure and a staircase structure;
forming an inter-metal dielectric (IMD) layer over the staircase structure such that an upper surface of the IMD layer and an upper surface of the main structure together form a combined upper surface;
first patterning the IMD layer and the stack assembly to form first trenches such that each of the sacrificial layers is divided into sacrificial segments by the first trenches;
removing end portions of the sacrificial segments through the first trenches so as to form first cavities;
forming a first conductive layer in the first cavities and on inner surfaces of the first trenches;
filling a first filling material in the first trenches over the first conductive layer;
second patterning the IMD layer and the stack assembly to form second trenches such that remaining portions of the sacrificial segments are formed into sacrificial regions, two adjacent ones of the sacrificial regions being separated from each other by a corresponding one of the second trenches, after the first patterning and the second patterning, the combined upper surface being formed into upper surface regions separated from each other by the first trenches and the second trenches;
removing the sacrificial regions through the second trenches to form second cavities;
forming a second conductive layer in the second cavities and on inner surfaces of the second trenches;
filling a second filling material in the second trenches over the second conductive layer; and
forming hard mask films respectively covering the upper surface regions, the hard mask films being made of a material different from a material of the IMD layer and a material of the dielectric layers.

9. The method of claim 8, wherein after the first patterning and the second patterning,
the dielectric layers are divided by the first trenches and the second trenches into dielectric portions each including dielectric films, and
the IMD layer is divided by the first trenches and the second trenches into IMD portions.

10. The method of claim 9, further comprising:
removing the first filling material and the second filling material after forming the hard mask films; and
etching back the first conductive layer and the second conductive layer to form conductive portions each including conductive films disposed to alternate with the dielectric films of a respective one of the dielectric portions, thereby obtaining stack units each including a respective one of the hard mask films, a respective one of the IMD portions, a respective one of the conductive portions, and a respective one of the dielectric portions, each of the stack units being disposed between an adjacent one of the first trenches and an adjacent one of the second trenches.

11. The method of claim 10, further comprising:
forming a memory layer over the stack units to cover the hard mask films and inner surfaces of the first trenches and the second trenches;
forming a channel layer on the memory layer;
forming a high-k dielectric layer over the channel layer; and
forming a filler layer over the high-k dielectric layer so as to fill the first trenches and the second trenches.

12. The method of claim 11, further comprising:
partially removing the memory layer, the channel layer, the high-k dielectric layer, and the filler layer to expose the hard mask films; and
removing the hard mask films to expose the upper surface regions.

13. The method of claim 7, wherein
during the patterning of each of the two high-k dielectric segments, two first sacrificial portions are respectively disposed to protect the first side region and the second side region of each of the high-k dielectric portions,
during the patterning of each of the two channel segments, two second sacrificial portions are respectively disposed to protect the first lateral region and the second lateral region of each of the channel portions, and are respectively connected to the two first sacrificial portions,
the first conductive pillar and the second conductive pillar are formed after formation of the separators, and
formation of the first conductive pillar and the second conductive pillar includes
removing the first sacrificial portions and the second sacrificial portions to form two recesses at the two opposite sides of each of the isolation portions, and
forming the first conductive pillar and the second conductive pillar respectively in the two recesses at the two opposite sides of each of the isolation portions.

14. A method for manufacturing a semiconductor device, comprising:
forming two stack units disposed over an underlying substrate, the two stack units being spaced apart from each other, each of the two stack units including
conductive films and dielectric films disposed to alternate with the conductive films, an uppermost one of the dielectric films being disposed over the conductive films and having a dimension smaller than a dimension of each of the conductive films and a dimension of each of remaining ones of the dielectric films, each of the conductive films and the remaining ones of the dielectric films has a first portion disposed beneath the uppermost one of the dielectric films, and a second portion extending beyond the uppermost one of the dielectric films, the second portions of the conductive films and the second portions of the remaining ones of the dielectric films together constituting a staircase portion,
an inter-metal dielectric (IMD) portion disposed on the staircase portion, and
a hard mask film disposed to cover the IMD portion and the uppermost one of the dielectric films, the hard mask film being made of a material different from a material of the IMD portion and a material of the dielectric films; and
forming a feature disposed between the two stack units, the feature including repeating units and separators which are disposed to alternate with the repeating units,
wherein at least one of the repeating units includes
two memory portions each of which is in contact with the conductive films of a respective one of the stack units,
two channel portions disposed respectively on the two memory portions,
a first conductive pillar and a second conductive pillar, each of which is in contact with the two channel portions, and
an isolation portion disposed between the two channel portions to separate the first conductive pillar from the second conductive pillar.

15. The method as claimed in claim 14, wherein
each of the two channel portions has a first lateral region, a second lateral region and a central region disposed between the first lateral region and the second lateral region, and
the at least one of the repeating units further includes two high-k dielectric portions each of which is disposed on the central region of a respective one of the two channel portions so as to separate the isolation portion from the central region of the respective one of the two channel portions, each of the two high-k dielectric portions having a first side region and a second side region which are respectively disposed at two opposite sides of the isolation portion.

16. The method as claimed in claim 15, wherein
the first conductive pillar includes a first main portion interconnecting the first lateral region of each of the two channel portions, and a first extended portion interconnecting the first side region of each of the two high-k dielectric portions, and
the second conductive pillar includes a second main portion interconnecting the second lateral region of each of the two channel portions, and a second extended portion interconnecting the second side region of each of the two high-k dielectric portions.

17. The method as claimed in claim 14, wherein each of the conductive films has two conductive regions which are bonded to each other through a glue portion.

18. The method as claimed in claim 14, wherein a distal one of the dielectric films has a dimension smaller than that of a proximate one of the dielectric films relative to the underlying substrate, and a distal one of the conductive films has a dimension smaller than that of a proximate one of the conductive films relative to the underlying substrate.

19. The method as claimed in claim 14, wherein, in each of the stack units, each of the conductive films and a corresponding lower one of the dielectric films have the same length.

20. The method as claimed in claim 1, wherein
the first replacing further includes depositing a first glue layer in the first cavities and on the inner surfaces of the first trenches, such that the first conductive layer is formed on the first glue layer,
the second replacing further includes depositing a second glue layer in the second cavities and on the inner surfaces of the second trenches, such that the second conductive layer is formed on the second glue layer, the second glue layer interfacing the first glue layer, and each of the first glue layer and the second glue layer includes titanium nitride, tantalum nitride, titanium silicon nitride, tantalum silicon nitride, tungsten silicon nitride, titanium carbide, tantalum carbide, titanium aluminum carbide, tantalum aluminum carbide, titanium aluminum nitride, tantalum aluminum nitride, or combinations thereof.

* * * * *